(12) United States Patent
Bae et al.

(10) Patent No.: US 9,991,446 B2
(45) Date of Patent: Jun. 5, 2018

(54) ORGANIC LIGHT EMITTING DEVICE AND DISPLAY DEVICE HAVING THE SAME

(71) Applicant: SAMSUNG DISPLAY CO., LTD., Yongin, Gyeonggi-Do (KR)

(72) Inventors: Sung-Soo Bae, Seoul (KR); Mikyung Kim, Suwon-si (KR); Donghyun Kim, Gwangju-si (KR); Tsuyoshi Naijo, Suwon-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 334 days.

(21) Appl. No.: 14/719,505

(22) Filed: May 22, 2015

(65) Prior Publication Data
US 2016/0163992 A1 Jun. 9, 2016

(30) Foreign Application Priority Data
Dec. 8, 2014 (KR) .................. 10-2014-0174806

(51) Int. Cl.
*H01L 51/50* (2006.01)
*H01L 51/00* (2006.01)

(52) U.S. Cl.
CPC ........ *H01L 51/0058* (2013.01); *H01L 51/006* (2013.01); *H01L 51/0072* (2013.01); *H01L 51/5072* (2013.01)

(58) Field of Classification Search
CPC ............. H01L 51/0058; H01L 51/0072; H01L 51/006; H01L 51/5072; H01L 51/00; H01L 51/50; H01L 51/52
USPC ................. 428/690, 704; 257/40; 252/500
See application file for complete search history.

(56) References Cited

U.S. PATENT DOCUMENTS

| | | | | |
|---|---|---|---|---|
| 7,777,408 B2 * | 8/2010 | Lee | .................. | H01L 51/5012 313/504 |
| 8,551,624 B2 * | 10/2013 | Park | .................. | C07C 211/54 313/504 |
| 8,785,913 B2 * | 7/2014 | Hsu | .................. | H01L 51/002 257/40 |
| 9,099,650 B2 * | 8/2015 | Kim | .................. | H01L 51/0013 |
| 9,331,288 B2 * | 5/2016 | Park | .................. | H01L 51/0071 |
| 9,466,803 B1 * | 10/2016 | Park | .................. | H01L 51/0058 |
| 9,530,971 B1 * | 12/2016 | Park | .................. | H01L 51/0058 |
| 9,543,538 B2 * | 1/2017 | Kim | .................. | H01L 51/5096 |
| 2011/0127501 A1 * | 6/2011 | Lecloux | .................. | C09K 11/06 257/40 |
| 2012/0080670 A1 * | 4/2012 | Park | .................. | C07D 209/82 257/40 |
| 2012/0286251 A1 * | 11/2012 | Park | .................. | C07C 211/54 257/40 |
| 2014/0048792 A1 * | 2/2014 | Chun | .................. | H01L 51/0072 257/40 |
| 2014/0103325 A1 * | 4/2014 | Shin | .................. | H01L 51/0072 257/40 |
| 2014/0117332 A1 * | 5/2014 | Lee | .................. | H01L 51/5064 257/40 |
| 2014/0291627 A1 * | 10/2014 | Kim | .................. | H01L 51/56 257/40 |
| 2015/0171342 A1 * | 6/2015 | Jung | .................. | C07D 405/14 257/40 |
| 2015/0243912 A1 * | 8/2015 | Strassner | .................. | H01L 51/0087 252/519.2 |
| 2015/0270498 A1 * | 9/2015 | Lee | .................. | H01L 51/0073 257/40 |
| 2015/0295185 A1 * | 10/2015 | Bae | .................. | H01L 51/0067 257/40 |
| 2015/0349272 A1 * | 12/2015 | Park | .................. | C07D 491/04 257/40 |
| 2015/0380662 A1 * | 12/2015 | Kim | .................. | H01L 51/0072 257/40 |
| 2016/0005979 A1 * | 1/2016 | Kim | .................. | H01L 51/0072 257/40 |
| 2016/0013413 A1 * | 1/2016 | Herron | .................. | C07B 59/001 257/40 |
| 2016/0099424 A1 * | 4/2016 | Kim | .................. | H01L 51/0072 257/40 |
| 2016/0126474 A1 * | 5/2016 | Kim | .................. | H01L 51/0072 257/40 |
| 2016/0190471 A1 * | 6/2016 | Inoue | .................. | H01L 51/0067 257/40 |
| 2016/0240794 A1 * | 8/2016 | Yamada | .................. | H01L 51/0072 |
| 2016/0380203 A1 * | 12/2016 | Jenekhe | .................. | H01L 51/0056 252/500 |
| 2017/0005276 A1 * | 1/2017 | Kim | .................. | H01L 51/0071 |
| 2017/0077419 A1 * | 3/2017 | Kim | .................. | H01L 51/0072 |
| 2017/0117485 A1 * | 4/2017 | Cho | .................. | H01L 51/0072 |
| 2017/0179400 A1 * | 6/2017 | Hwang | .................. | H01L 51/0061 |
| 2017/0213987 A1 * | 7/2017 | Kim | .................. | H01L 51/0072 |

FOREIGN PATENT DOCUMENTS

| | | |
|---|---|---|
| JP | 2003-212850 A | 7/2003 |
| KR | 2012-0138671 A | 12/2012 |
| KR | 2013-0010056 A | 1/2013 |
| KR | 2013-0062103 A | 6/2013 |
| KR | 2013-0070201 A | 6/2013 |
| KR | 2013-0100635 A | 9/2013 |
| KR | 2014-0001581 A | 1/2014 |

OTHER PUBLICATIONS

CAS reg. No. 1941214-45-4, Jun. 28, 2016.*
CAS reg. No. 58328-31-7, Nov. 16, 1984.*

* cited by examiner

*Primary Examiner* — Douglas J McGinty
(74) *Attorney, Agent, or Firm* — Lee & Morse, P.C.

(57) ABSTRACT

An organic light emitting device including a first electrode, a hole transport region on the first electrode, a light emission layer on the hole transport region, a buffer layer on the light emission layer, an electron transport region on the buffer layer, and a second electrode on the electron transport region. The buffer layer includes at least one selected from the group consisting of a carbazole derivative, a phenanthroline derivative, a triazole derivative, and a quinolinolato-based metal complex.

16 Claims, 5 Drawing Sheets

ORGANIC LIGHT EMITTING DEVICE AND DISPLAY DEVICE HAVING THE SAME

CROSS-REFERENCE TO RELATED APPLICATION

Korean Patent Application No. 10-2014-0174806, filed on Dec. 8, 2014, in the Korean Intellectual Property Office, and entitled: "Organic Light Emitting Device and Display Device Having The Same," is incorporated by reference herein in its entirety.

BACKGROUND

1. Field

Embodiments relate to an organic light emitting device and a display device having the same.

2. Description of the Related Art

Flat display devices may be mainly classified into a luminescent type and a photoreceptive type. Examples of the luminescent type include a flat cathode ray tube, a plasma display panel, and an organic light emitting display (OLED). The organic light emitting display has a wide viewing angle, a high contrast, and a fast response time as a spontaneous luminescent-type display.

Accordingly, the organic light emitting display is applicable to display devices for mobile equipment such as a digital camera, a video camera, a camcorder, a personal digital assistant, a smart phone, an ultra-slim laptop, a tablet personal computer, or a flexible display device, or heavy electronic or electrical devices such as an ultrathin-type television.

The organic light emitting display realizes colors based on the principle that holes and electrons, which are injected to first and second electrodes, are recombined in a light emission layer to emit light, and the light is emitted when excitons, which are formed by combination of the injected holes and electrons, fall from an exited state to a ground state.

SUMMARY

Embodiments are directed to an organic light emitting device including a first electrode, a hole transport region on the first electrode, a light emission layer on the hole transport region, a buffer layer on the light emission layer, an electron transport region on the buffer layer, and a second electrode on the electron transport region. The buffer layer includes at least one selected from the group consisting of a carbazole derivative, a phenanthroline derivative, a triazole derivative, and a quinolinolato-based metal complex.

The buffer layer may include at least one selected from the group of tris(8-hydroxyquinolino)aluminum (Alq3), 4,4'-bis(N-carbazolyl)-1,1'-biphenyl (CBP), N,N'-dicarbazolyl-3,5-benzene (mCP), poly(n-vinylcarbazole) (PVK), 4,4',4"-tris(carbazol-9-yl)-triphenylamine (TCTA), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 4,4'-bis(9-carbazolyl)-2,2'-dimethyl-biphenyl (CDBP), 4,4',4"-tris(N-carbazolyl)triphenylamine (TCTA), 2,9-dimethyl-4,7-diphenyl-1,10-phenanthroline (BCP), 4,7-diphenyl-1,10-phenanthroline (Bphen), and 3-phenyl-4-(1'-naphthyl)-5-phenylcarbazole.

The electron transport region may include a compound represented by Chemical Formula 1 below:

[Chemical Formula 1]

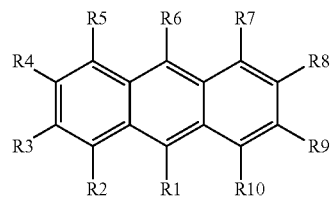

where, R1 is a naphthyl group or a biphenyl group; at least one of R2 to R10 is expressed by Chemical Formula 2 below; and remainder are hydrogen, deuterium, a halogen group, a nitrile group, a nitro group, a hydroxyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, or a substituted or unsubstituted heterocyclic group having at least one of N, O, or S atom,

[Chemical Formula 2]

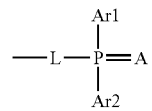

where, L is a direct bond, a substituted or unsubstituted arylene group, or a substituted or unsubstituted heteroarylene group having at least one of N, O, or S atom; Ar1 and Ar2 are independently a substituted or unsubstituted aryl group or a substituted or unsubstituted heterocyclic group having at least one of N, O, or S atom; and A is O, S, or Se.

The electron transport region may include at least one of the following compounds:

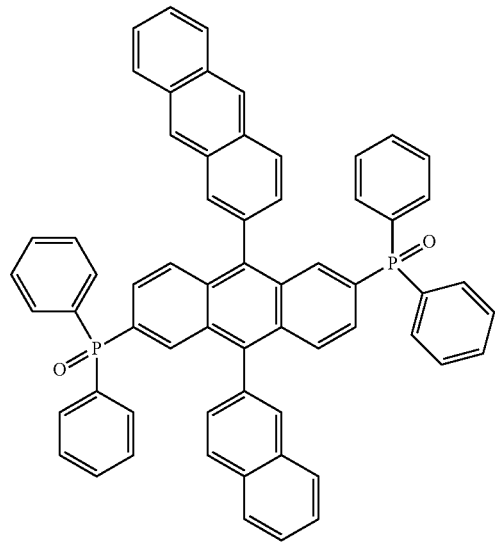

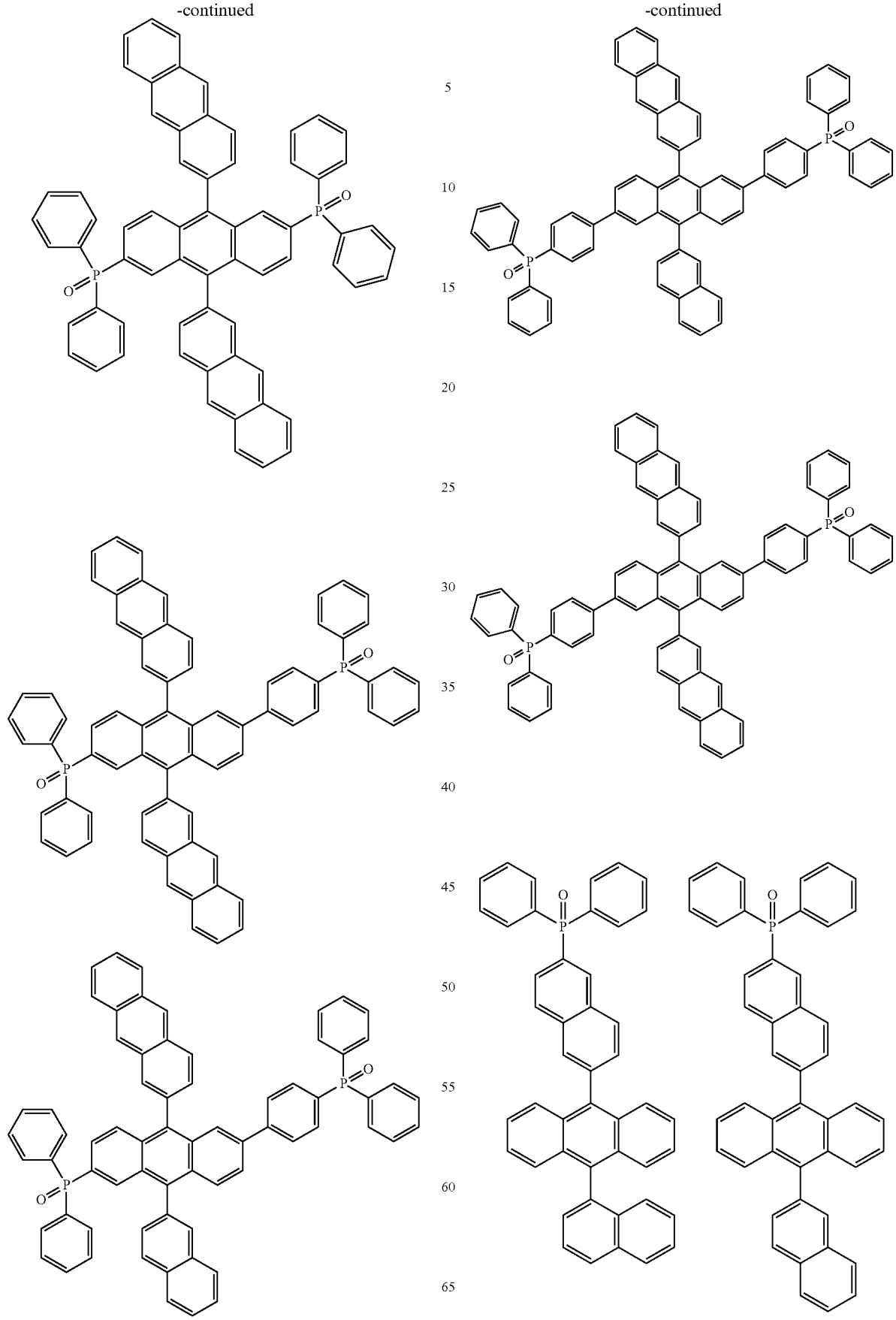

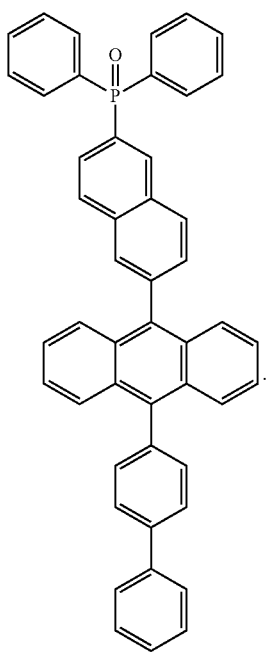
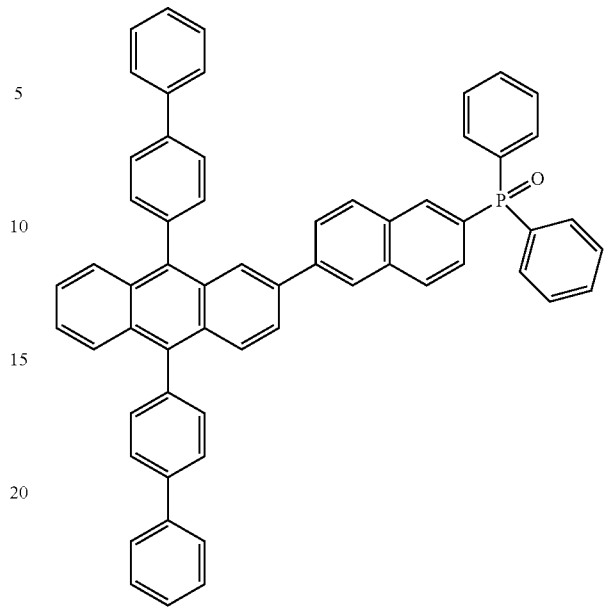
The electron transport region may include at least one of the following compounds:
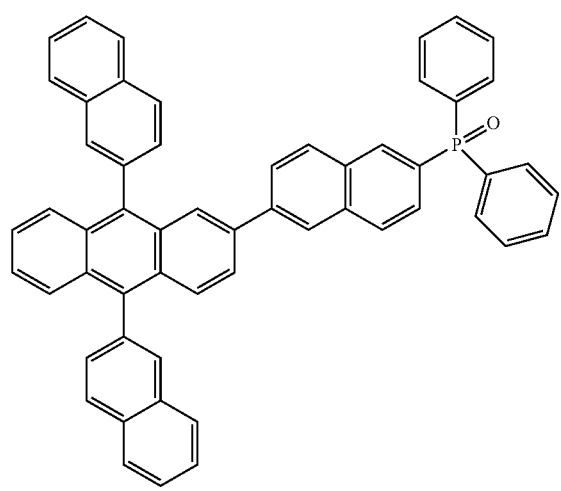
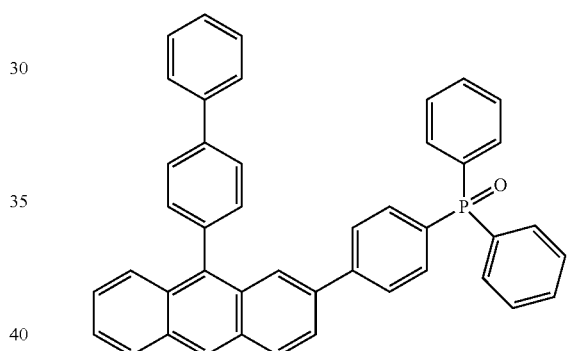
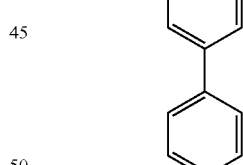
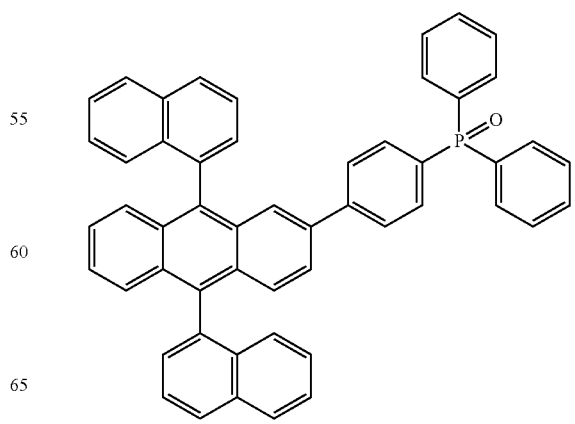

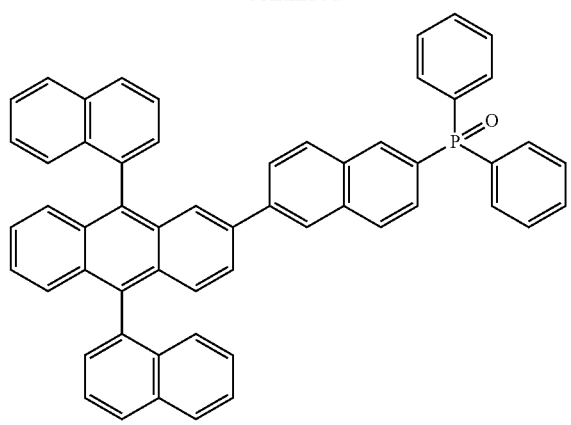
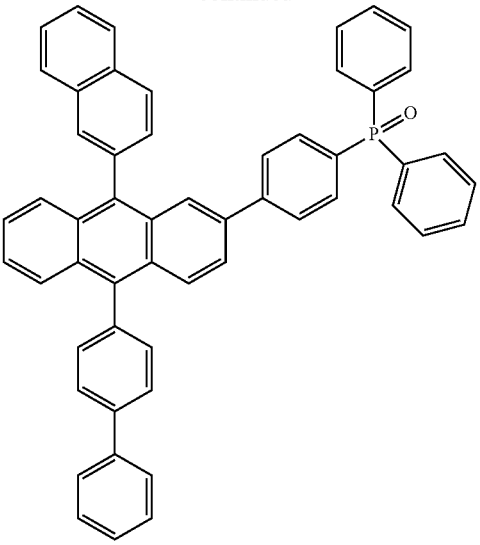
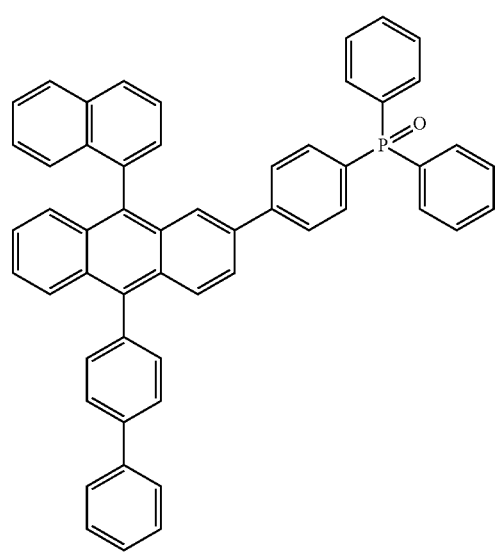
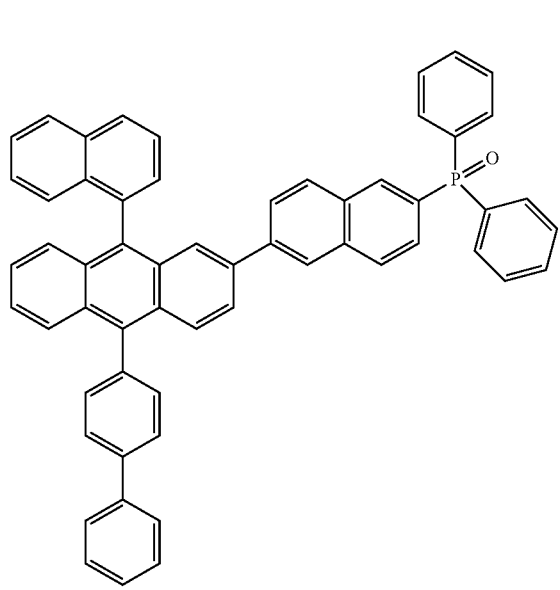
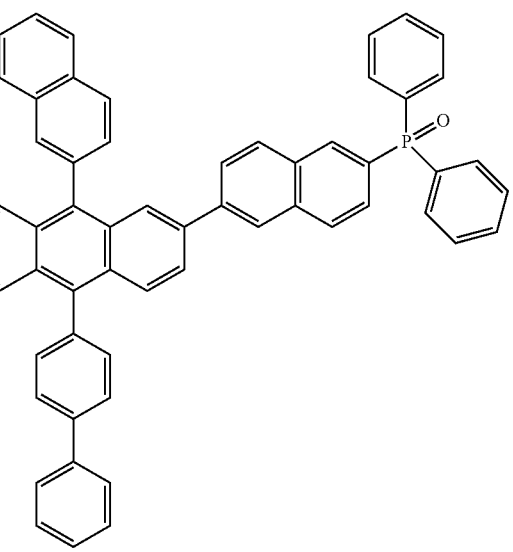

The electron transport region may include at least one of the following compounds:
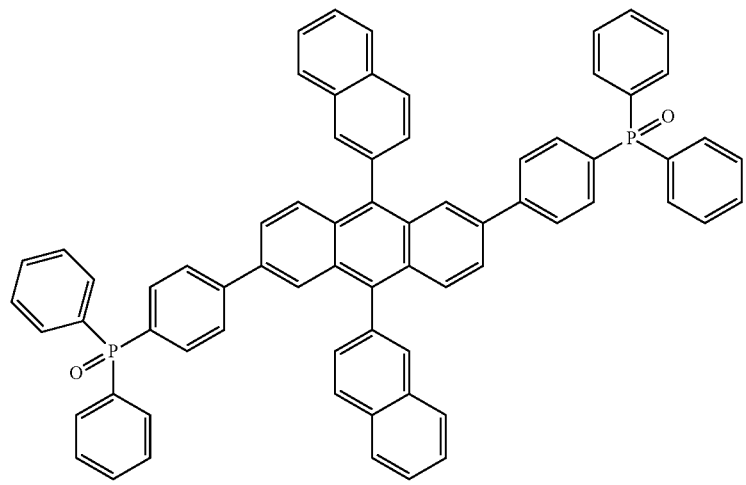
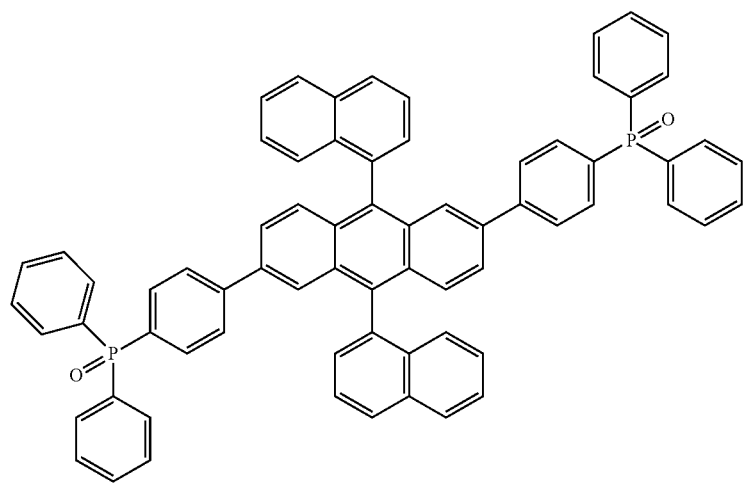
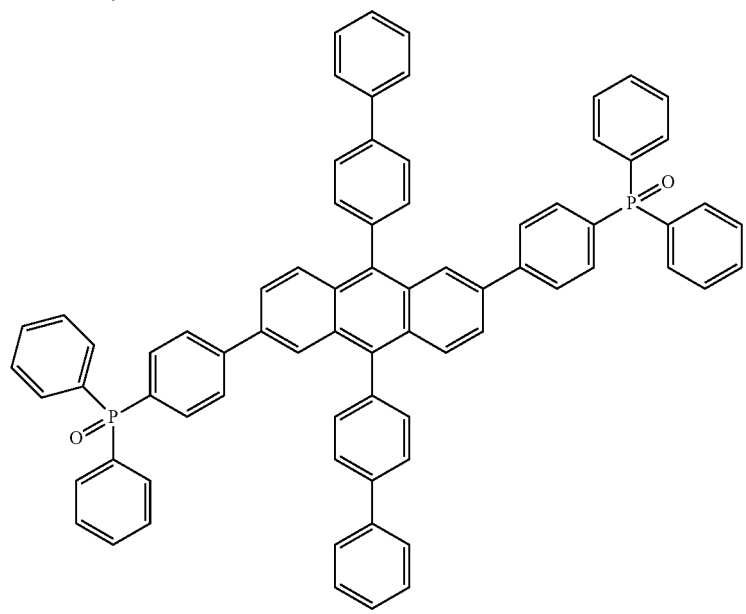

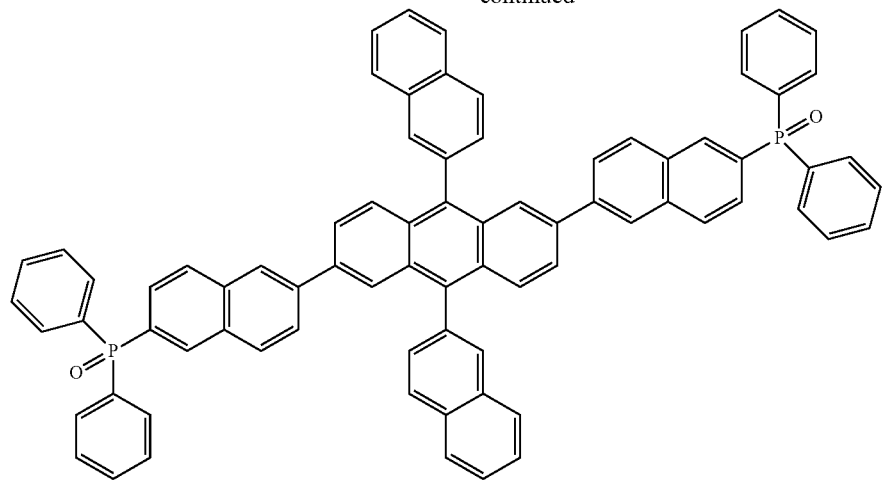
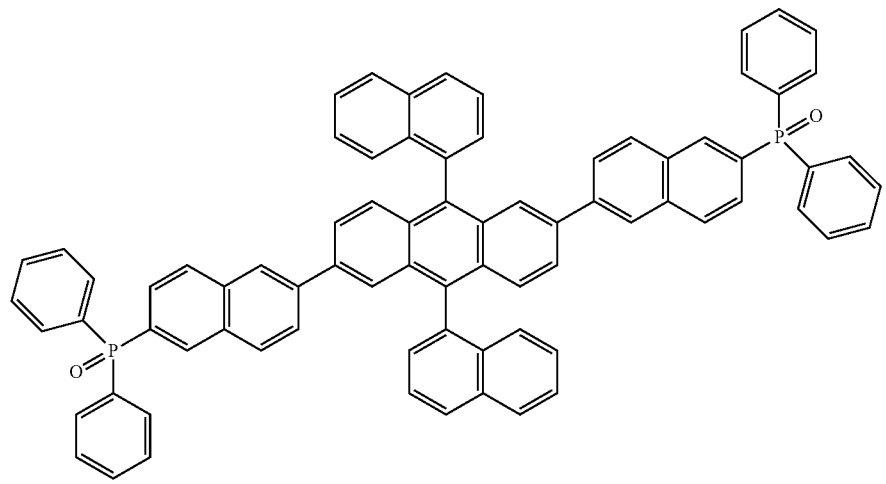
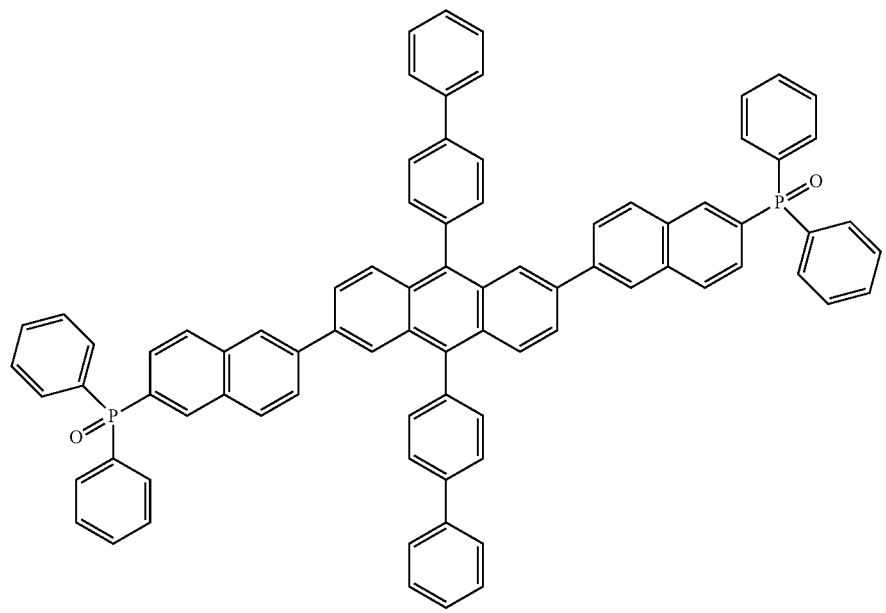

-continued
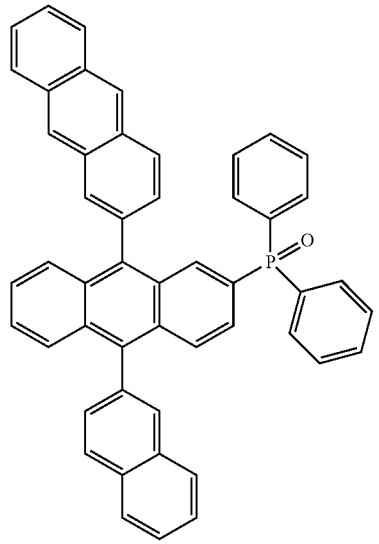
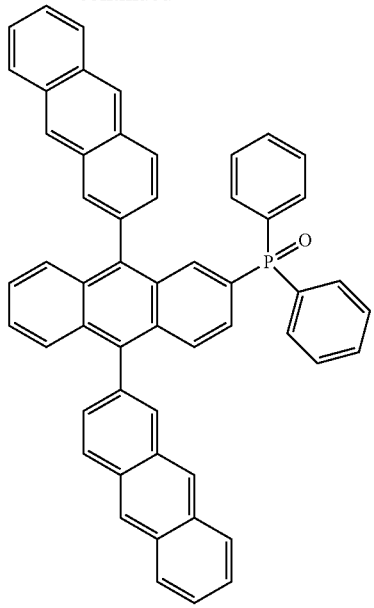
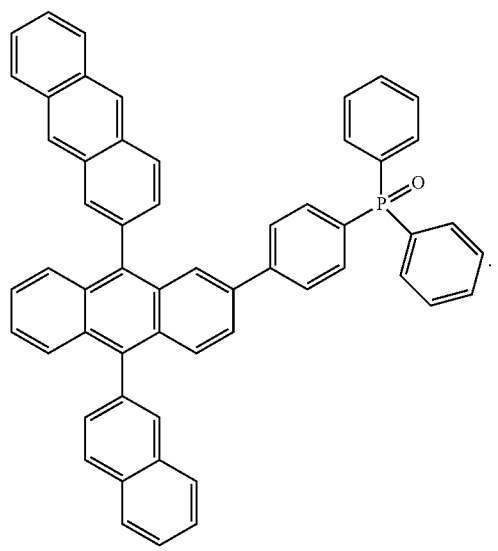

The electron transport region may include at least one of the following compounds:
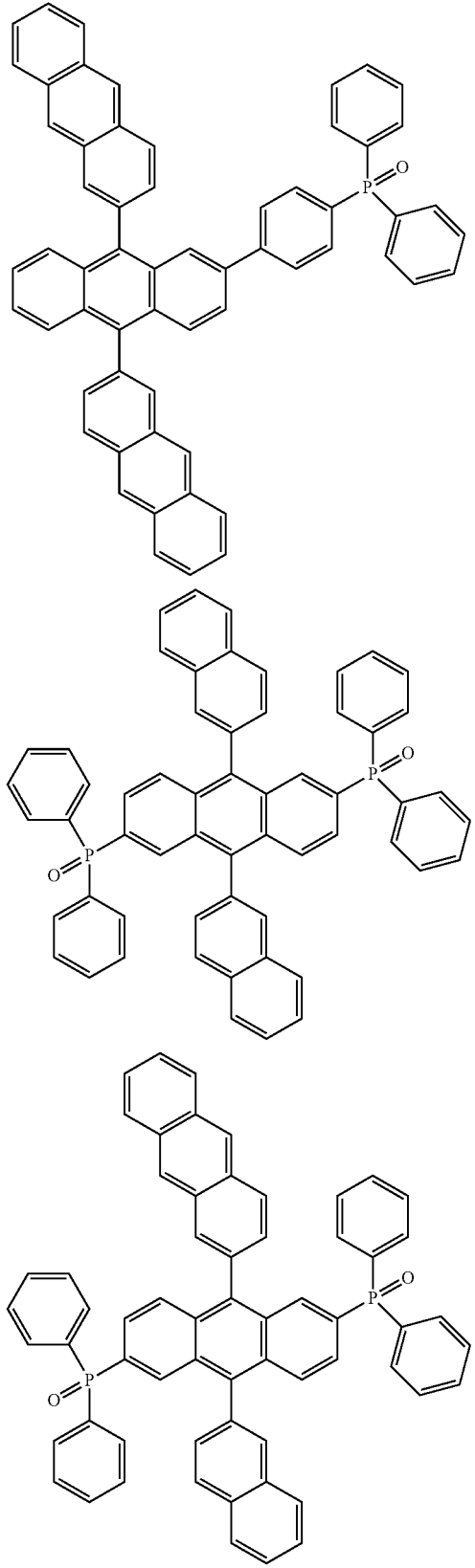
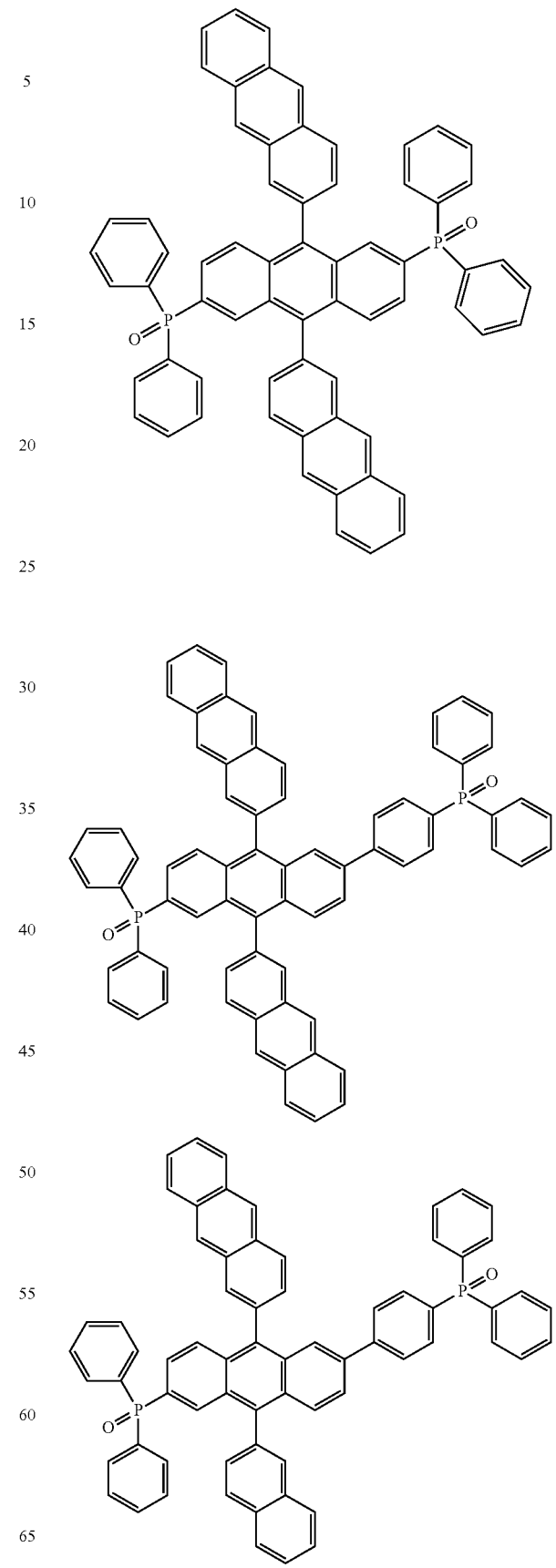

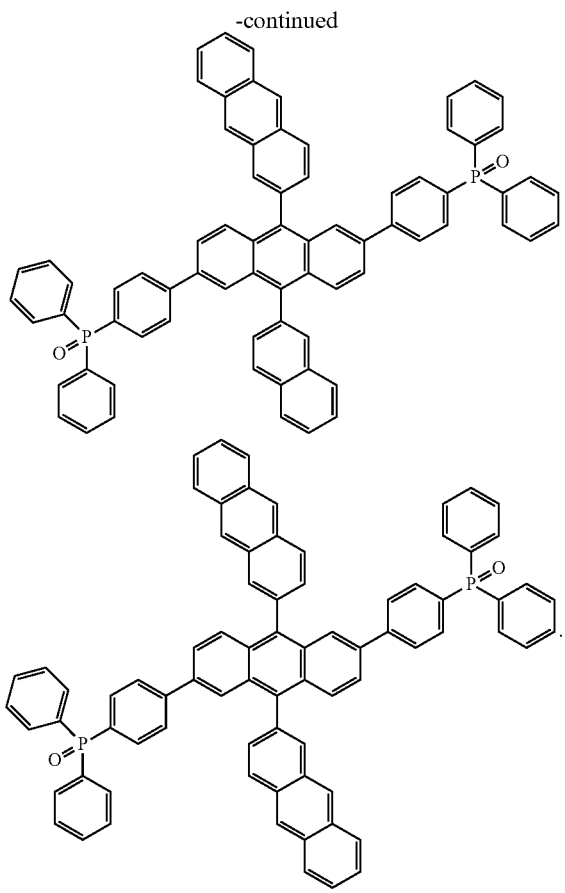

The electron transport region may include an electron transport layer provided on the buffer layer and an electron injection layer provided on the electron transport layer. The electron transport layer may include a compound represented by Chemical Formula 1 above.

The hole transport region may include a hole injection layer provided on the first electrode and a hole transport layer provided on the hole injection layer.

Embodiments are also directed to a display device that includes a plurality of pixels. At least one of the pixels includes a first electrode, a hole transport region on the first electrode, a light emission layer on the hole transport region, a buffer layer on the light emission layer, an electron transport region on the buffer layer, and a second electrode on the electron transport region. The buffer layer includes at least one selected from the group consisting of a carbazole derivative, a phenanthroline derivative, a triazole derivative, and a quinolinolato-based metal complex.

The buffer layer may include at least one selected from the group of tris(8-hydroxyquinolino)aluminum (Alq3), 4,4'-bis (N-carbazolyl)-1,1'-biphenyl (CBP), N,N'-dicarbazolyl-3,5-benzene (mCP), poly(n-vinylcarbazole) (PVK), 4,4',4"-tris (carbazol-9-yl)-triphenylamine (TCTA), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 4,4'-bis(9-carbazolyl)-2,2'-dimethyl-biphenyl (CDBP), 4,4',4"-tris(N-carbazolyl)triphenylamine (TCTA), 2,9-dimethyl-4,7-diphenyl-1,10-phenanthroline (BCP), 4,7-diphenyl-1,10-phenanthroline (Bphen), and 3-phenyl-4-(1'-naphthyl)-5-phenylcarbazole.

The electron transport region may include a compound represented by Chemical Formula 1 below.

[Chemical Formula 1]

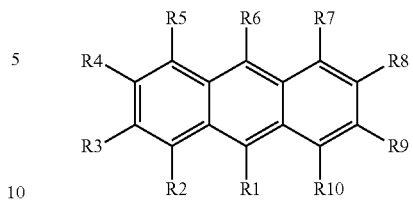

where, R1 is a naphthyl group or a biphenyl group; at least one of R2 to R10 is expressed by Chemical Formula 2 below; and remainder are hydrogen, deuterium, a halogen group, a nitrile group, a nitro group, a hydroxyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, or a substituted or unsubstituted heterocyclic group having at least one of N, O, or S atom,

[Chemical Formula 2]

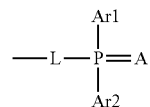

where, L is a direct bond, a substituted or unsubstituted arylene group, or a substituted or unsubstituted heteroarylene group having at least one of N, O, or S atom; Ar1 and Ar2 are independently a substituted or unsubstituted aryl group or a substituted or unsubstituted heterocyclic group having at least one of N, O, or S atom; and A is O, S, or Se.

The electron transport region may include at least one of following compounds:

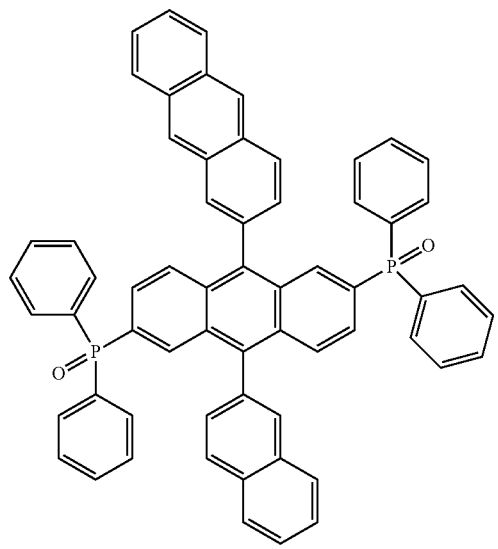

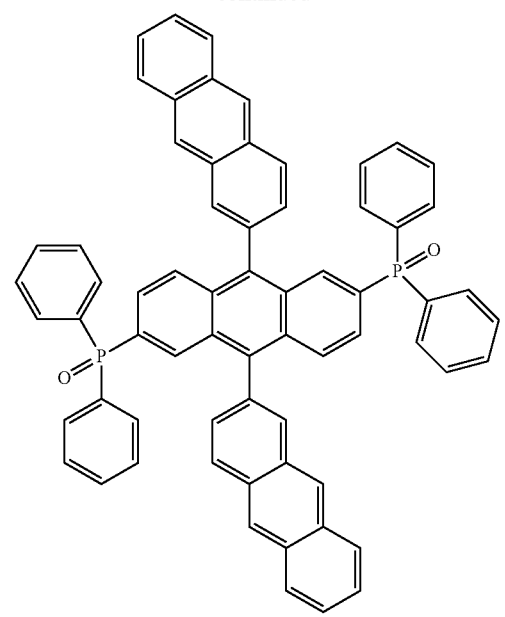
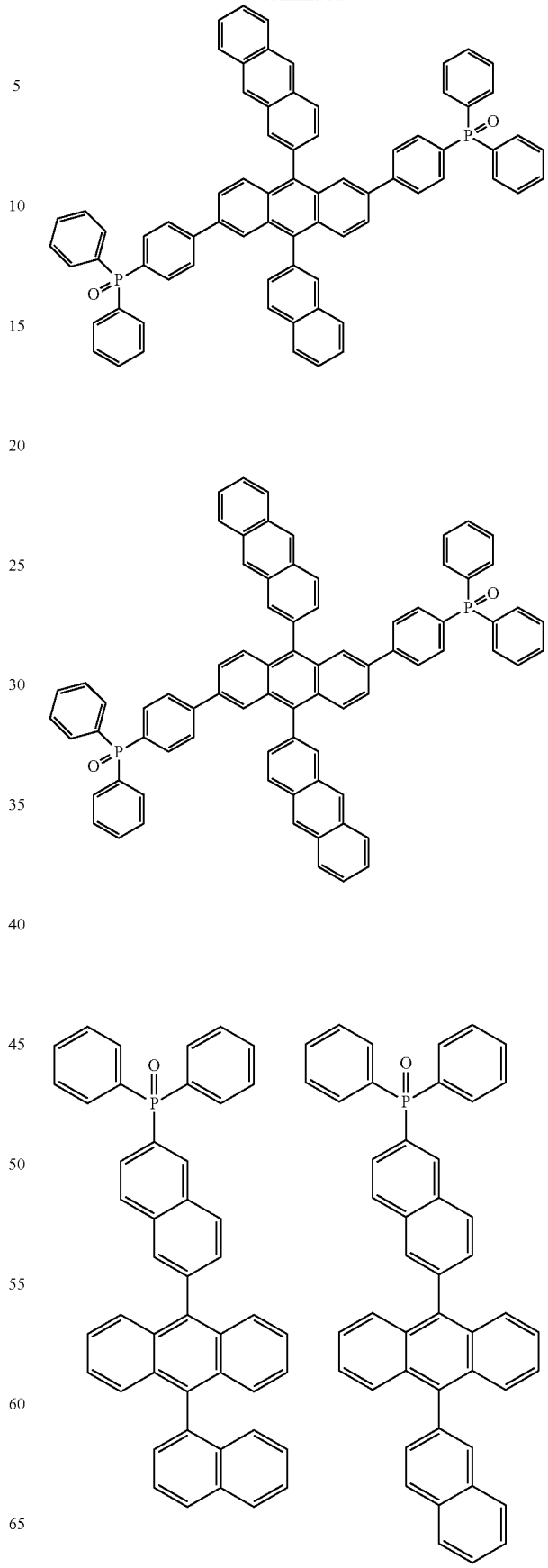

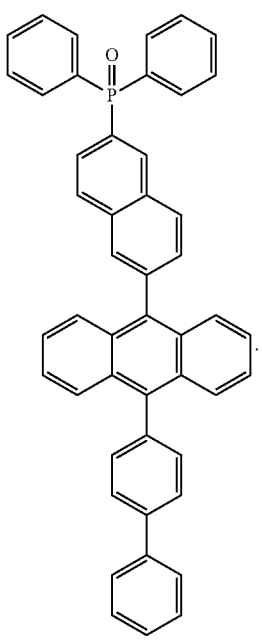
The electron transport region may include at least one of the following compounds:
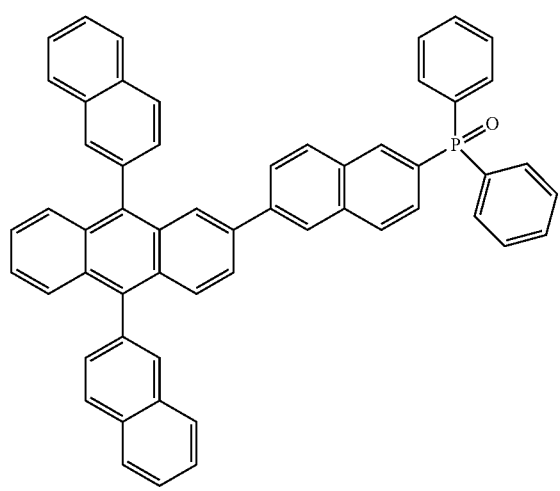
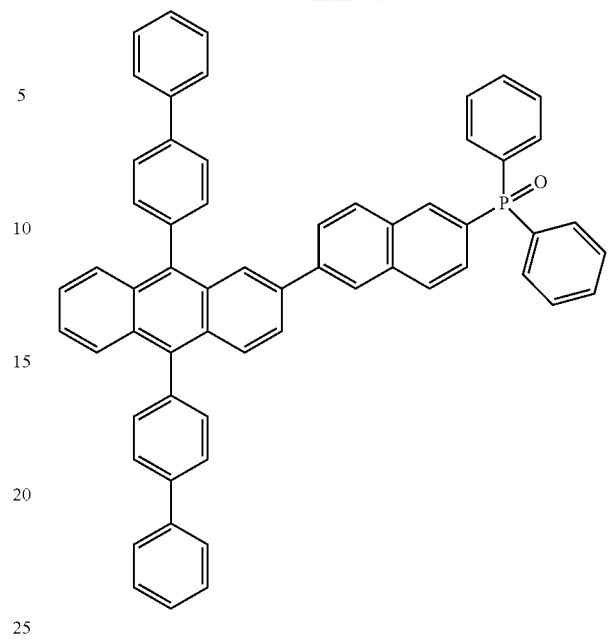
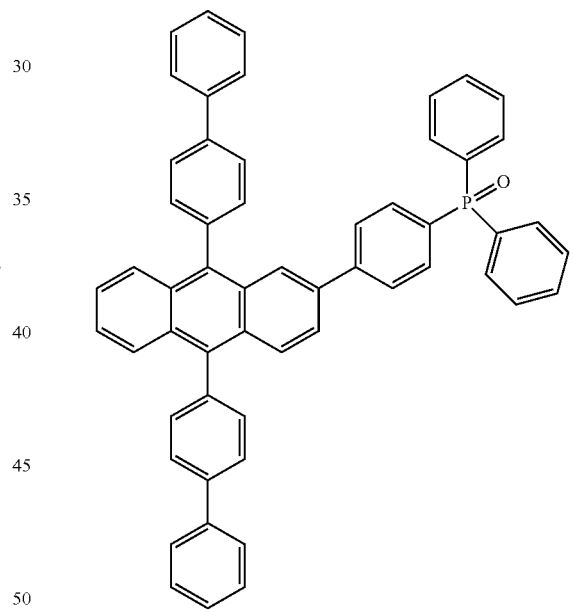
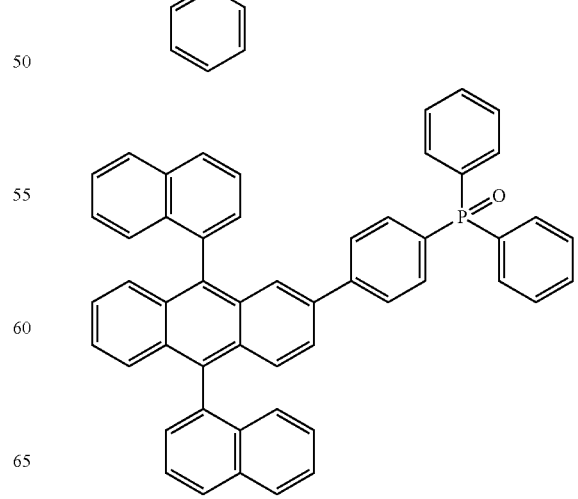

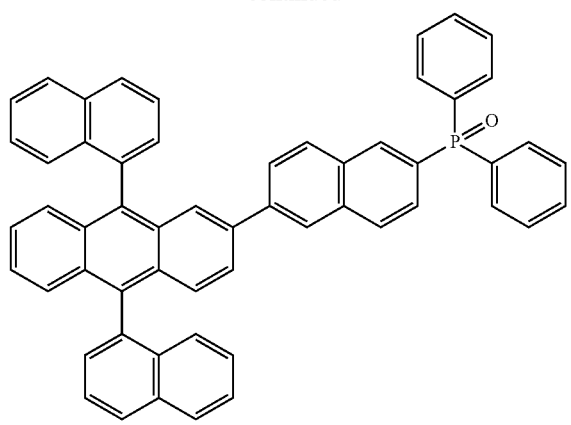
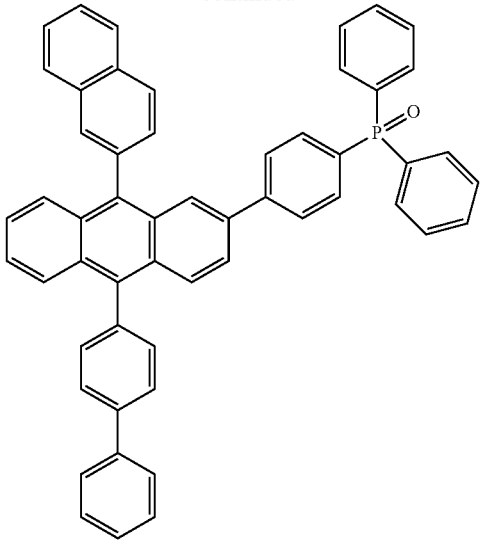
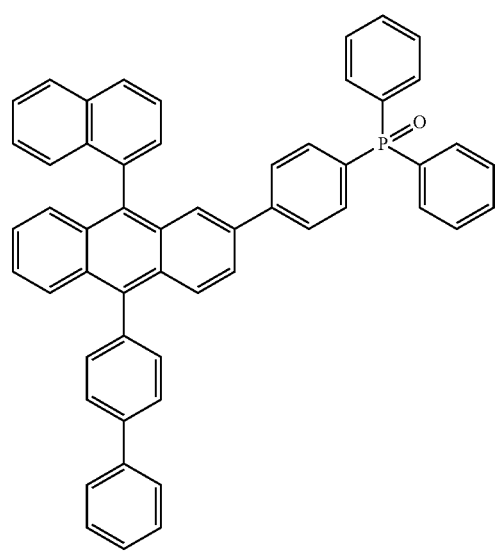
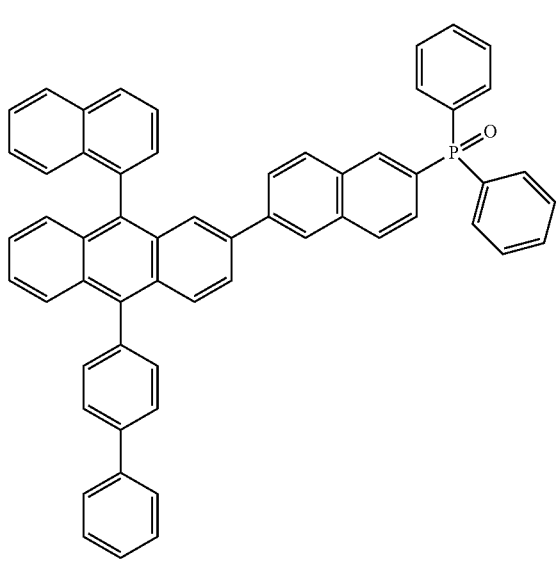
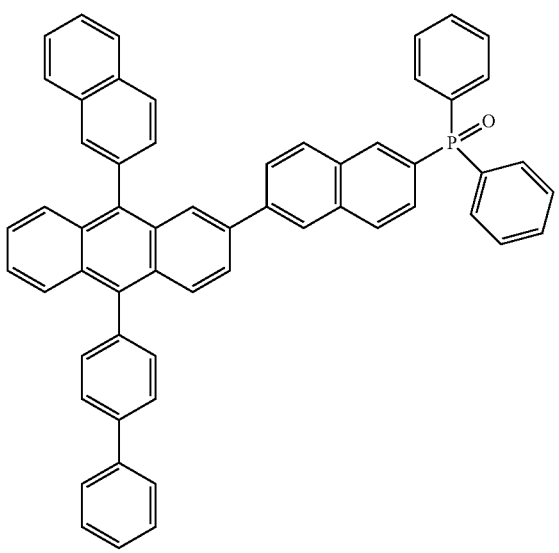

The electron transport region may include at least one of the following compounds:
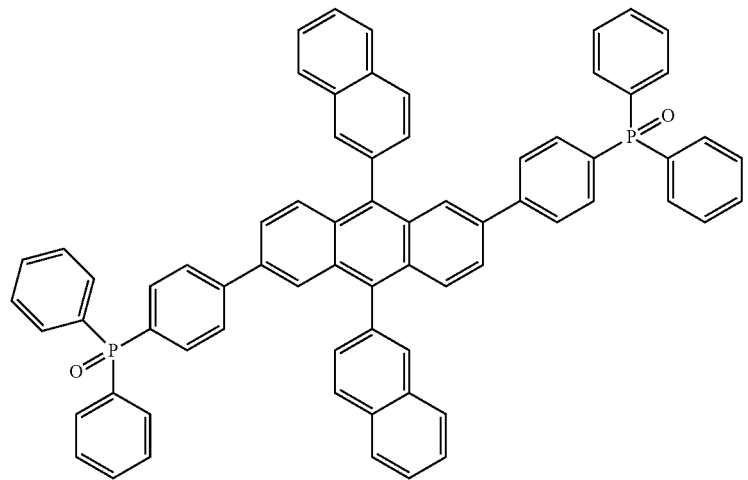
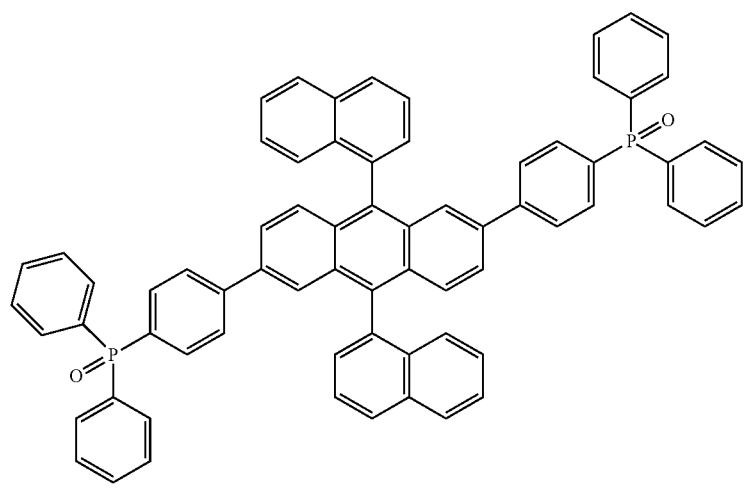
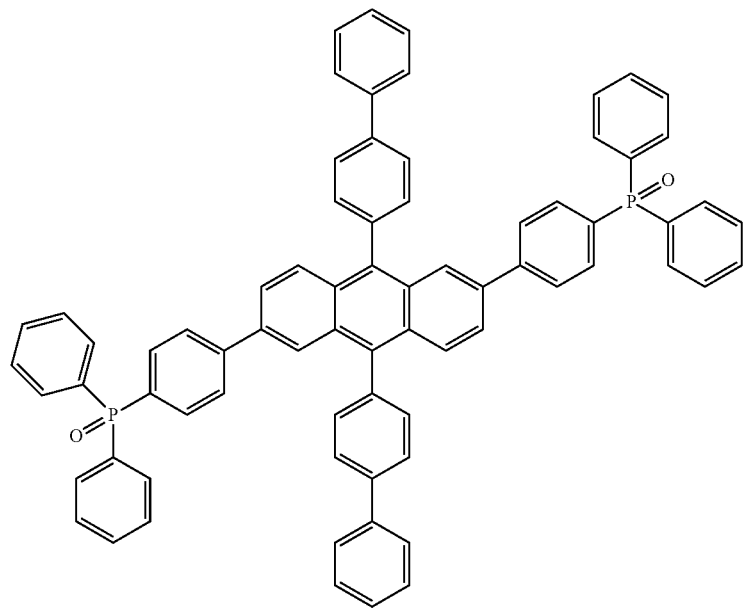

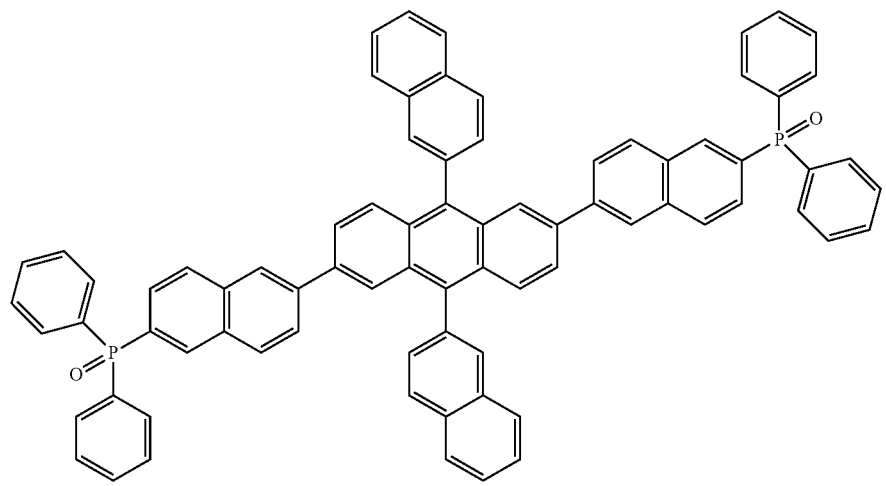
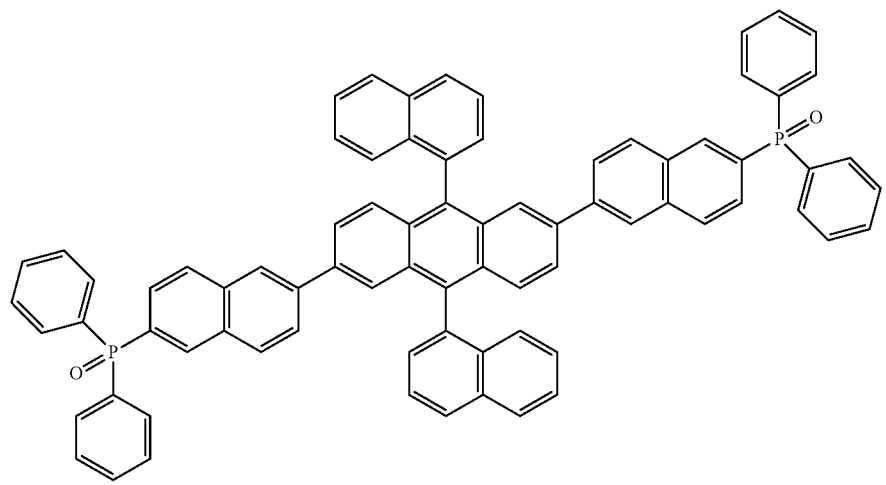
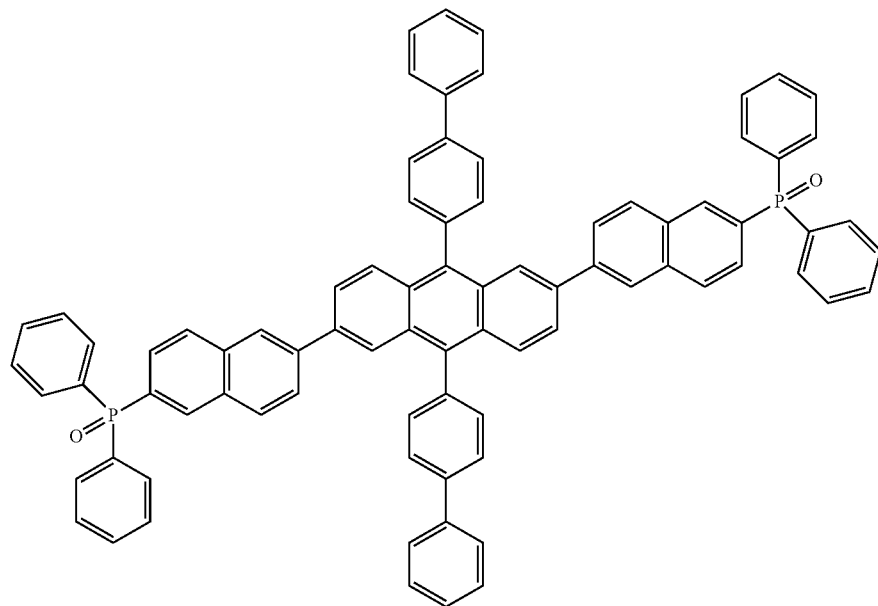

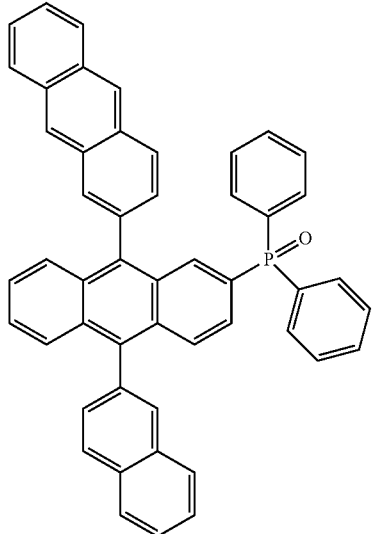
-continued
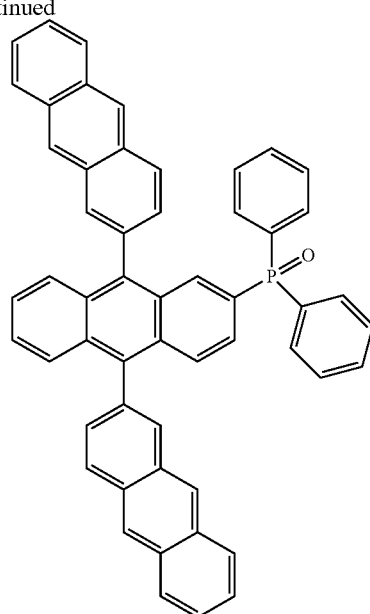
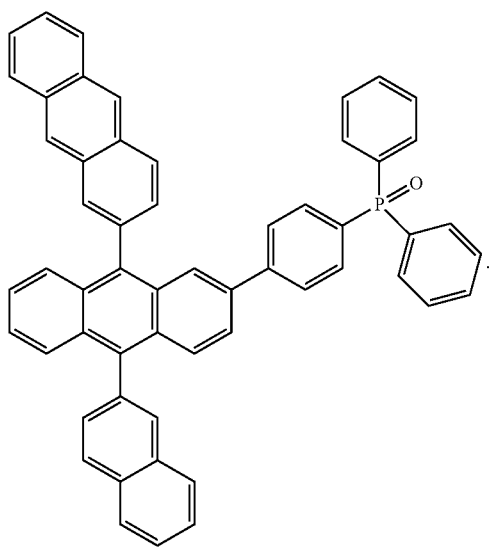

The electron transport region may include at least one of the following compounds:
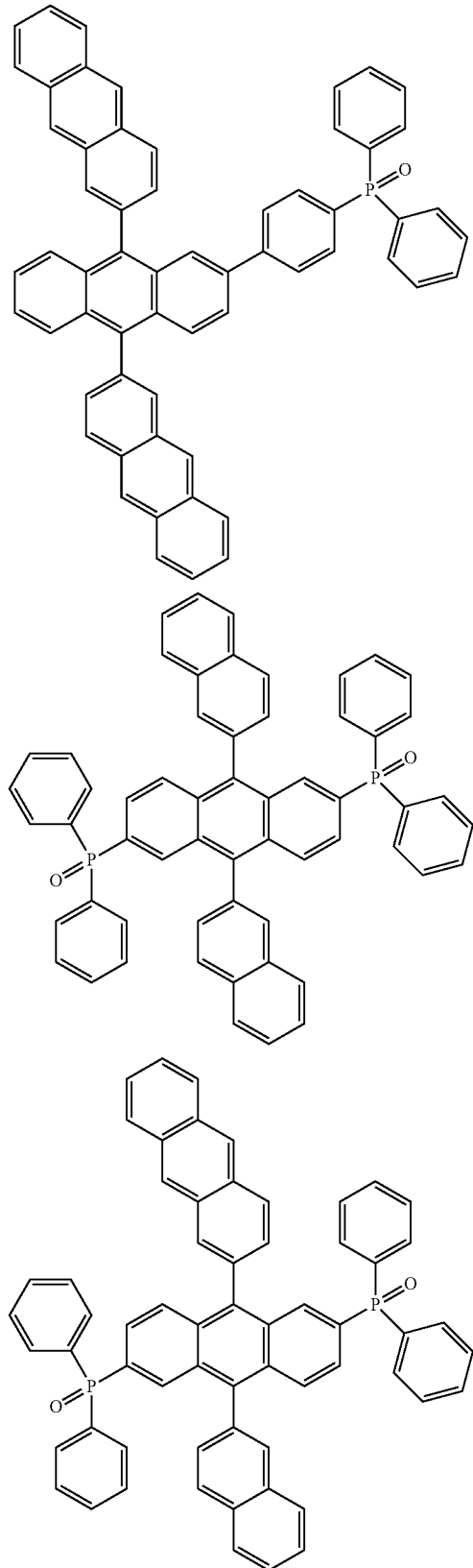
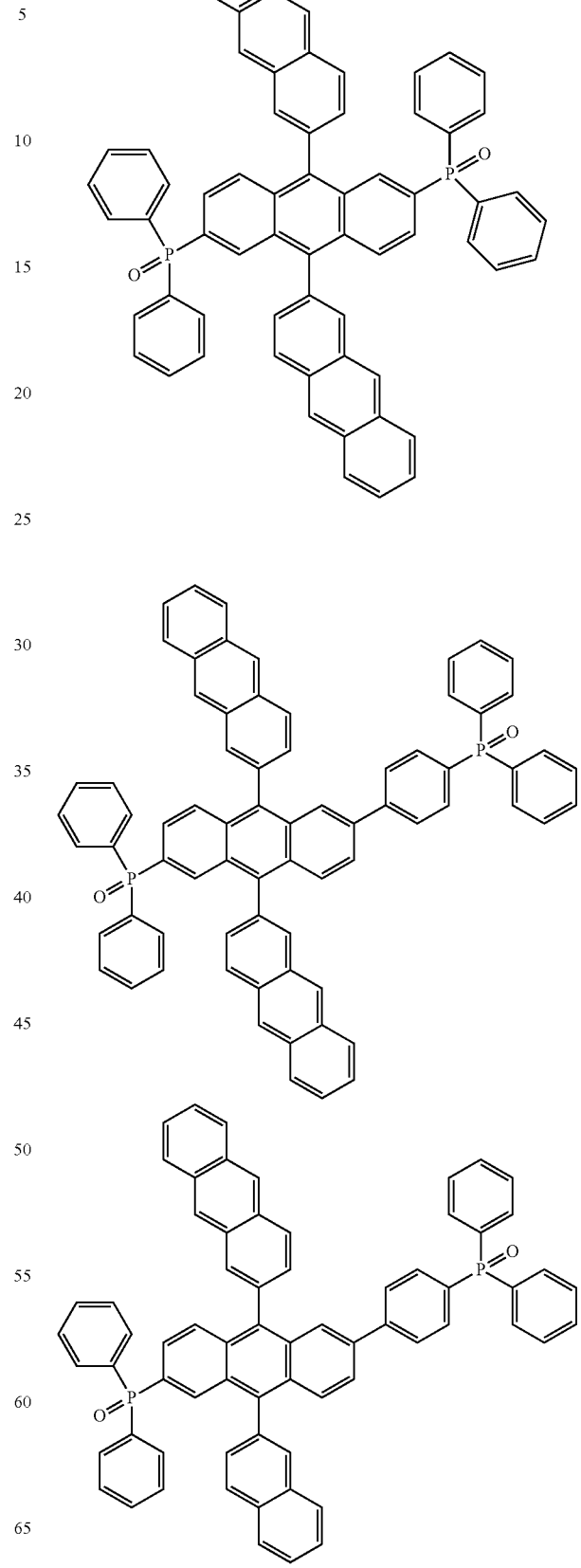

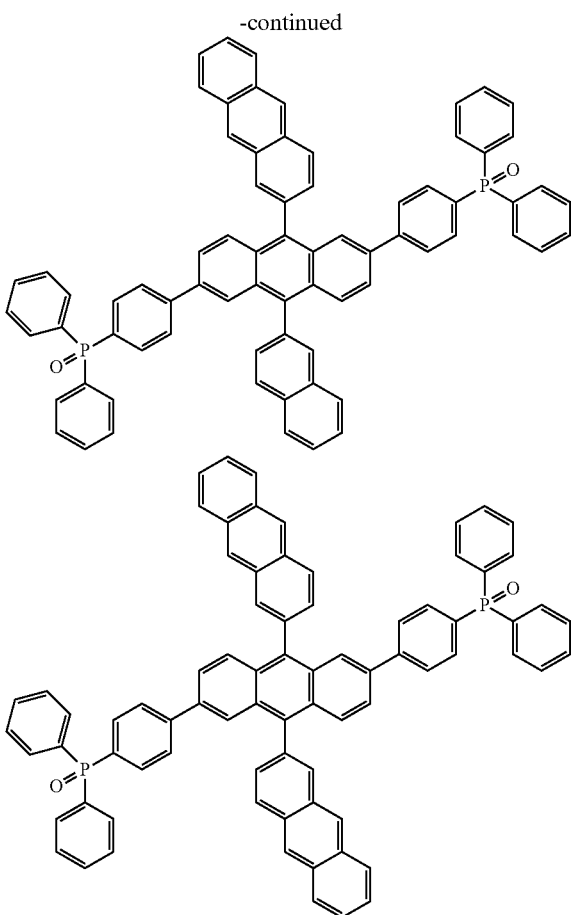

-continued

The electron transport region may include an electron transport layer on the buffer layer and an electron injection layer on the electron transport layer. The electron transport layer may include a compound represented by Chemical Formula 1 above.

The hole transport region may include a hole injection layer on the first electrode and a hole transport layer on the hole injection layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
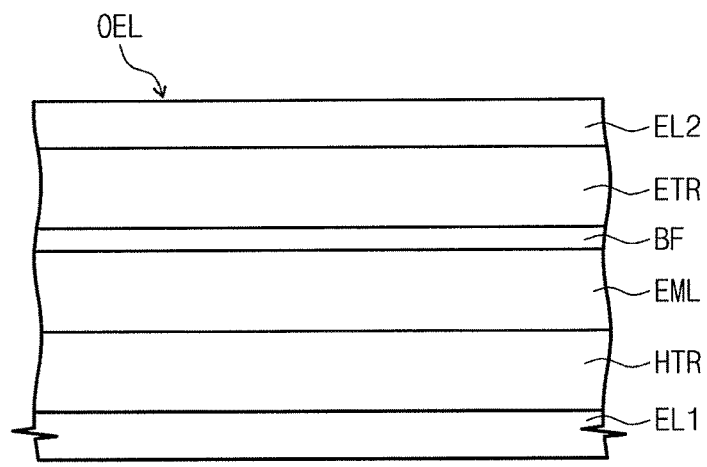
FIG. 1 illustrates a sectional view schematically depicting an organic light emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

Hereinafter, an organic light emitting device according to an embodiment will be described.

FIG. 1 illustrates a sectional view schematically depicting an organic light emitting device according to an embodiment.

Figure 2:
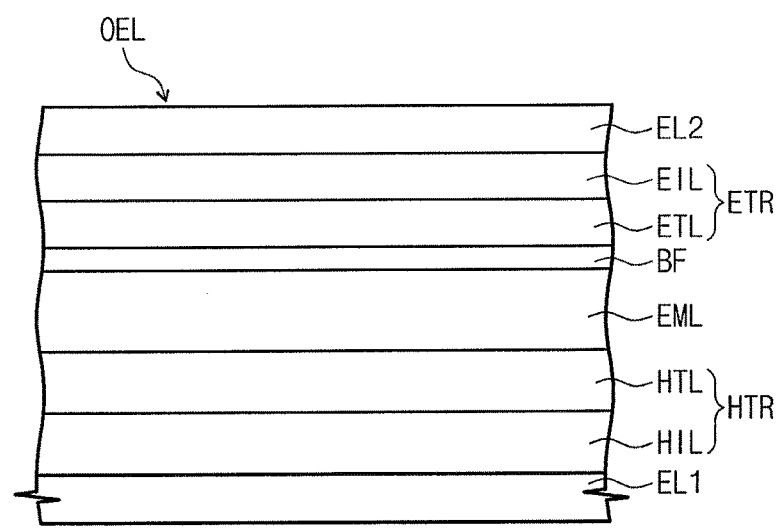
FIG. 2 illustrates a sectional view schematically depicting an organic light emitting device according to an embodiment.

FIG. 2 illustrates a sectional view schematically depicting an organic light emitting device according to an embodiment.

Referring to FIGS. 1 and 2, the organic light emitting device OEL according to an embodiment may include a first electrode EL1, a hole transport region HTR, a light emission layer EML, a buffer layer BF, an electron transport region ETR, and a second electrode EL2.

The first electrode EL1 may be conductive. The first electrode EL1 may be a pixel electrode or an anode. The first electrode EL1 may be a transmissive electrode, a transflective electrode, or a reflective electrode. When the first electrode EL1 is a transmissive electrode, the first electrode EL1 may be made of transparent metal oxide such as indium tin oxide (ITO), indium zinc oxide (IZO), zinc oxide (ZnO), or indium tin zinc oxide (ITZO). When the first electrode EL1 is a transflective electrode or a reflective electrode, the first electrode EL1 may include Ag, Mg, Al, Pt, Pd, Au, Ni, Nd, Ir, Cr, or a mixture thereof.

An organic layer may be disposed on the first electrode EL1. The organic layer may include the light emission layer EML. The organic layer may further include the hole transport region HTR and the electron transport region ETR.

The hole transport region HTR may be provided on the first electrode EL1. The hole transport region HTR may include at least one of a hole injection layer HIL, a hole transport layer HTL, a hole buffer layer, and an electron blocking layer.

The hole transport region HTR may have a single layer made of a single material, a single layer made of a plurality of different materials, or a multi-layered structure having a plurality layers made of a plurality of different materials.

For example, the hole transport region HTR may have a single-layered structure made of a plurality of different materials, or a multi-layered structure that is sequentially stacked from the first electrode EL1, such as hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer.

The hole transport region HTR may be provided using a suitable method such as a vacuum deposition method, a spin coating method, a cast method, a Langmuir-Blodgett (LB) method, an inkjet printing method, a laser printing method, or a laser induced thermal imaging (LITI) method.

When the hole transport region HTR includes the hole injection layer HIL, the hole transport region HTR may include a phthalocyanine compound such as copper phthalocyanine, N,N'-diphenyl-N,N'-bis-[4-(phenyl-m-tolylamino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/Camphor sulfonicacid (PANI/CSA), or (polyaniline)/poly(4-styrenesulfonate) (PANI/PSS).

When the hole transport region HTR includes the hole transport layer HTL, the hole transport region HTR may include a carbazole derivative such as N-phenylcarbazole or polyvinylcarbazole, a fluorene derivative, a triphenylamine derivative such as N,N'-bis(3-methylphenyl)-N,N'-diphenyl-[1,1-biphenyl]-4,4'-diamine (TPD) or 4,4',4"-tris(N-carbazolyl)triphenylamine (TCTA), N,N'-di(1-naphthyl)-N,N'-diphenylbenzidine (NPB), or 4,4'-cyclohexylidene bis[N,N-bis(4-methylphenyl)benzenamine] (TAPC).

The hole transport region HTR may have a thickness of about 100 Å to about 10,000 Å, or, for example, about 100 Å to about 1,000 Å. When the hole transport region HTR includes both the hole injection layer HIL and the hole transport layer HTL, the hole injection layer HIL may have a thickness of about 100 Å to about 10,000 Å, or, for example about 100 Å to about 1,000 Å, and the hole transport layer HTL may have a thickness of about 50 Å to about 2,000 Å, or, for example, about 100 Å to about 1,500 Å. When the thicknesses of the hole transport region HTR, the hole injection layer HIL, and the hole transport layer HTL fall within the above ranges, respectively, satisfactory hole transport characteristics may be obtained without a substantial increase in driving voltage.

The hole transport region HTR may further include a charge generation material to improve conductivity, in addition to the aforementioned materials. The charge generation material may be homogeneously or non-homogeneously dispersed in the hole transport region HTR. The charge generation material may be, for example, a p-dopant. The p-dopant may be, for example, one of a quinone derivative, a metal oxide, or a cyano group-containing compound. For example, the p-dopant may include a quinone derivative such as tetracyanoquinodimethane (TCNQ) or 2,3,5,6-tetrafluoro-tetracyanoquinodimethane (F4-TCNQ), and a metal oxide such as tungsten oxide or molybdenum oxide.

As mentioned above, the hole transport region HTR may include at least one of the hole buffer layer or the electron blocking layer, in addition to the hole injection layer HIL and the hole transport layer HTL. The hole buffer layer may compensate a resonance distance according to the wavelength of light emitted from the light emission layer EML and thus may serve to increase luminous efficiency. Materials included in the hole transport region HTR may be used as materials included in the hole buffer layer. The electron blocking layer may help to prevent electrons from being injected from the electron transport region ETR to the hole transport region HTR.

The light emission layer EML may be provided on the hole transport region HTR. The light emission layer EML may have a single layer made of a single material, a single layer made of a plurality of different materials, or a multi-layered structure having a plurality layers made of a plurality of different materials.

The light emission layer EML may be formed by a suitable method such as a vacuum deposition method, a spin coating method, a cast method, a Langmuir-Blodgett (LB) method, an inkjet printing method, a laser printing method, or a laser induced thermal imaging (LITI) method.

The light emission layer EML may be made of suitable light emitting materials, such as materials emitting red light, green light, or blue light. The light emission layer EML may include a fluorescent material or a phosphor. The light emission layer EML may include a host and a dopant.

The host may include a suitable host material such as tris(8-hydroxyquinolino)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4', 4"-tris(carbazol-9-yl)-triphenylamine (TCTA), 1,3,5-tris(N-phenylbenzimidazol-2-yl)benzene (TPBi), 3-tert-butyl-9, 10-di(naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN).

When the light emission layer EML emits red light, the light emission layer EML may include, for example, a fluorescent material containing (tris(dibenzoylmethanato) phenanthroline europium) (PBD:Eu(DBM)$_3$(Phen)) or perylene. When the light emission layer EML emits red light, the dopant included in the light emission layer EML may be, for example, selected from the group of a metal complex and an organometallic complex, such as bis(1-phenylisoquinoline) acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP).

When the light emission layer EML emits green light, the light emission layer EML may include, for example, a fluorescent material containing tris(8-hydroxyquinolino)aluminum (Alq3). When the light emission layer EML emits green light, the dopant included in the light emission layer EML, for example, may be selected from the group consisting of a metal complex and an organometallic complex such as fac-tris(2-phenylpyridine)iridium (Ir(ppy)3).

When the light emission layer EML emits blue light, the light emission layer EML may include, for example, a fluorescent material containing any one selected from the group of spiro-DPVBi, spiro-6P, distyryl-benzene (DSB), distyryl-arylene (DSA), a polyfluorene (PFO) based polymer, and a poly(p-phenylene vinylene) (PPV) based polymer. When the light emission layer EML emits blue light, the dopant included in the light emission layer EML may be, for example, selected from the group consisting of a metal complex and an organometallic complex such as (4,6-F$_2$ppy)$_2$Irpic.

The buffer layer BF may be provided on the light emission layer EML. The buffer layer BF may help to prevent holes from being injected from the light emission layer EML to the electron transport region ETR, and may promote the injection of electrons from the electron transport region ETR to the light emission layer EML. The buffer layer BF may reduce an energy difference between the light emission layer EML and the electron transport region ETR. The buffer layer BF may include at least one selected from the group of a carbazole derivative, a phenanthroline derivative, a triazole derivative, and a quinolinolato-based metal complex.

The buffer layer BF may include, for example, at least one selected from the group of tris(8-hydroxyquinolino)aluminum (Alq3), 4,4'-bis(N-carbazolyl)-1,1'-biphenyl (CBP), N,N'-dicarbazolyl-3,5-benzene (mCP), poly(n-vinylcarbazole) (PVK), 4,4',4''-tris(carbazol-9-yl)-triphenylamine (TCTA), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 4,4'-bis(9-carbazolyl)-2,2'-dimethyl-biphenyl (CDBP), 4,4',4''-tris(N-carbazolyl)triphenylamine (TCTA), 2,9-dimethyl-4,7-diphenyl-1,10-phenanthroline (BCP), 4,7-diphenyl-1,10-phenanthroline (Bphen), and 3-phenyl-4-(1'-naphthyl)-5-phenylcarbazole.

The electron transport region ETR may be provided on the buffer layer BF. The electron transport region ETR may include, for example, at least one of a hole blocking layer, an electron transport layer ETL, or an electron injection layer EIL.

For example, the electron transport region ETR may have a multi-layered structure that is sequentially stacked from the light emission layer EML, such as electron transport layer ETL/electron injection layer EIL or hole blocking layer/electron transport layer ETL/electron injection layer EIL, or may have a single-layered structure in which at least two of the above layers are mixed.

The electron transport region ETR may be formed by a suitable method such as a vacuum deposition method, a spin coating method, a cast method, a Langmuir-Blodgett (LB) method, an inkjet printing method, a laser printing method, or a laser induced thermal imaging (LITI) method.

The electron transport region ETR may include the electron transport layer ETL and the electron injection layer EIL. The electron injection layer EIL may be provided on the electron transport layer ETL.

The electron transport layer ETL may have a thickness of about 100 Å to about 1,000 Å, or, for example, about 150 Å to about 500 Å. When the thickness of the electron transport layer ETL falls within the above range, satisfactory electron transport characteristics may be obtained without a substantial increase in driving voltage.

The electron injection layer EIL may have a thickness of about 1 Å to about 100 Å, or, for example, about 3 Å to about 90 Å. When the thickness of the electron injection layer EIL falls within the above range, satisfactory electron injection characteristics may be obtained without a substantial increase in driving voltage.

As mentioned above, the electron transport region ETR may include the hole blocking layer. For example, the hole blocking layer may include at least one of 2,9-dimethyl-4,7-diphenyl-1,10-phenanthroline (BCP) or 4,7-diphenyl-1,10-phenanthroline (Bphen). The hole blocking layer may have a thickness of about 20 Å to about 1,000 Å, or, for example, about 30 Å to about 300 Å. When the thickness of the hole blocking layer falls within the above range, satisfactory hole blocking characteristics may be obtained without a substantial increase in driving voltage.

The electron transport region ETR may include a compound represented by Chemical Formula 1 below. More specifically, the electron transport layer ETL may include the compound represented by Chemical Formula 1 below.

[Chemical Formula 1]

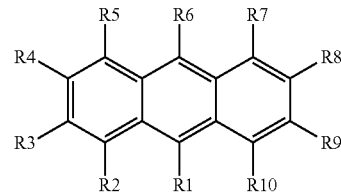

In Chemical Formula 1, R1 is a naphthyl group or a biphenyl group; at least one of R2 to R10 is represented by Chemical Formula 2 below; and the remainder of R2 to R10 are hydrogen, deuterium, a halogen group, a nitrile group, a nitro group, a hydroxyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, or a substituted or unsubstituted heterocyclic group having at least one of N, O, or S atom,

[Chemical Formula 2]

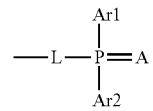

In Chemical Formula 2, L is a direct bond, a substituted or unsubstituted arylene group, or a substituted or unsubstituted heteroarylene group having at least one of N, O, or S atom; Ar1 and Ar2 are independently a substituted or unsubstituted aryl group or a substituted or unsubstituted heterocyclic group having at least one of N, O, or S atom; and A is O, S, or Se.

The electron transport region ETR may include at least one of the compounds represented below.

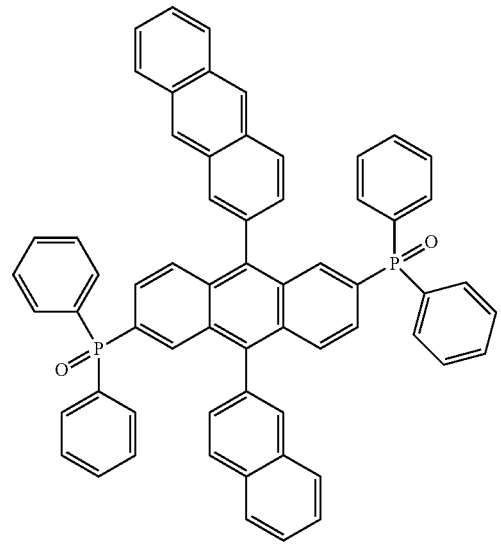

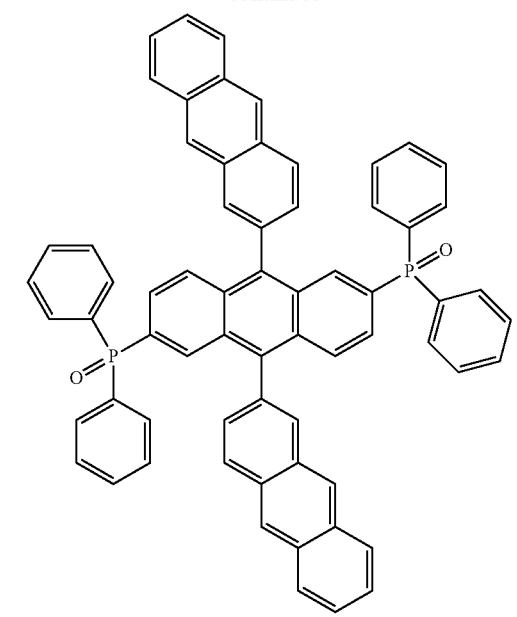
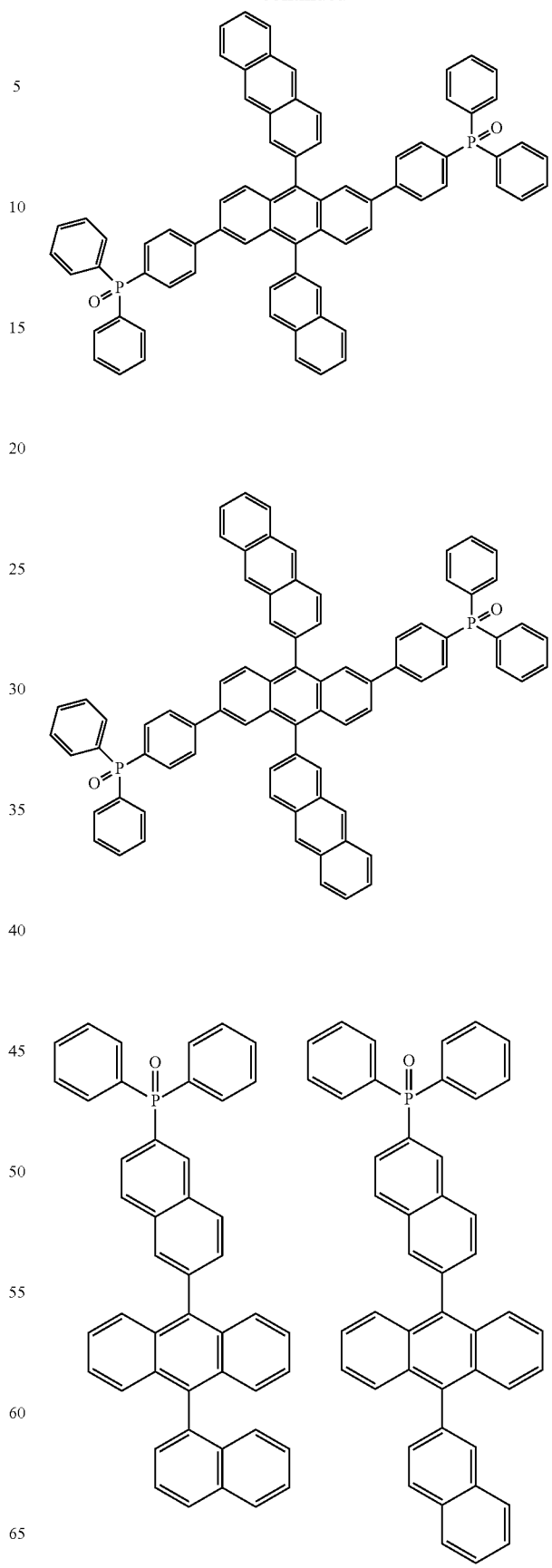

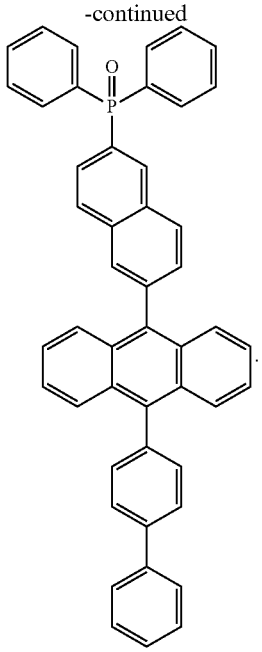
The electron transport region ETR may include at least one of the compounds represented below.
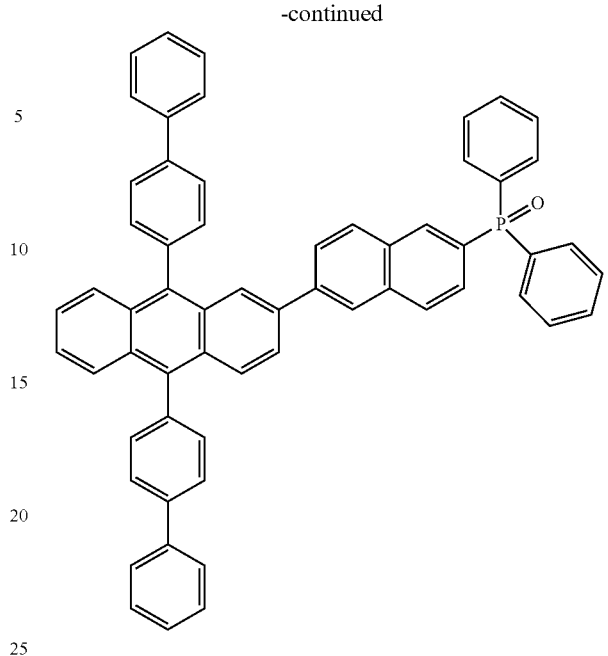
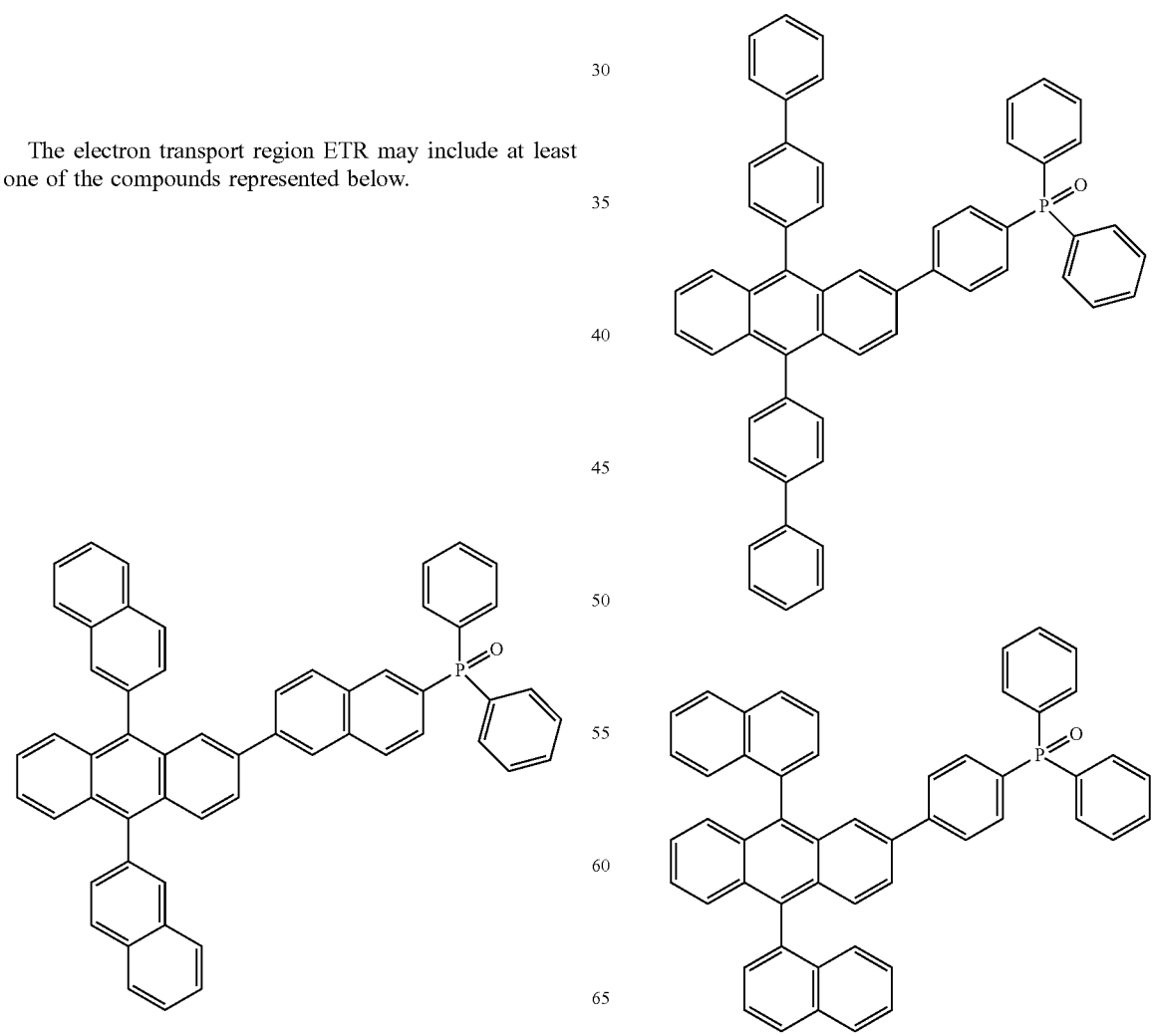

43
-continued
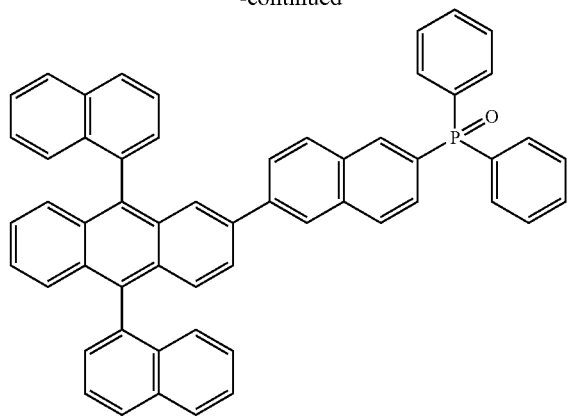
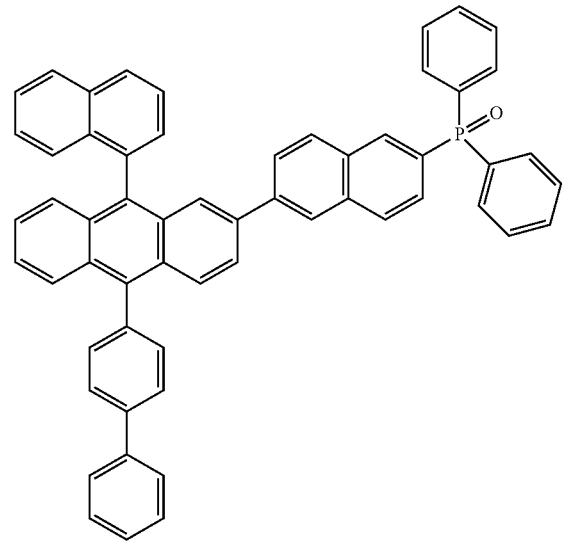
44
-continued
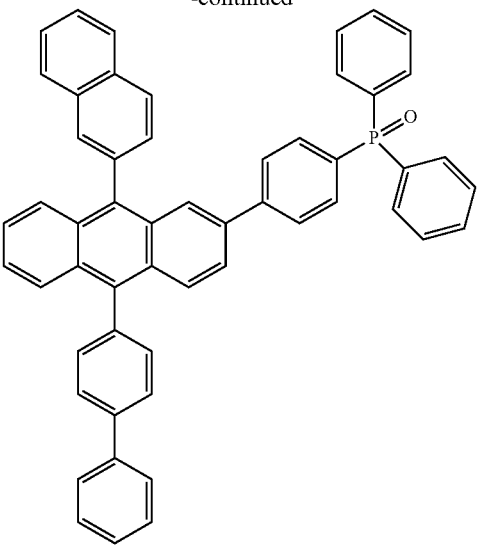
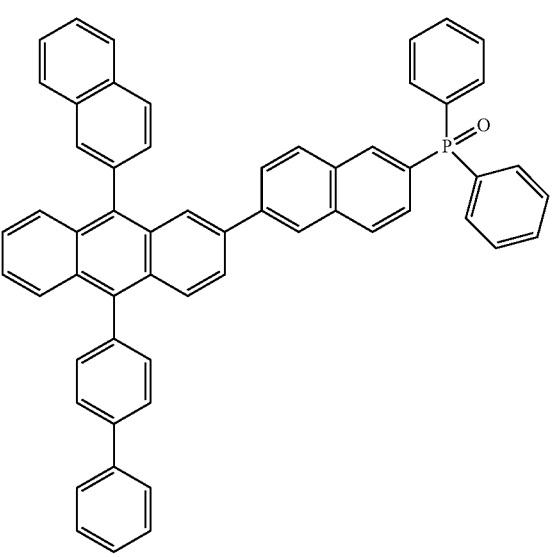

The electron transport region ETR may include at least one of the compounds represented below.
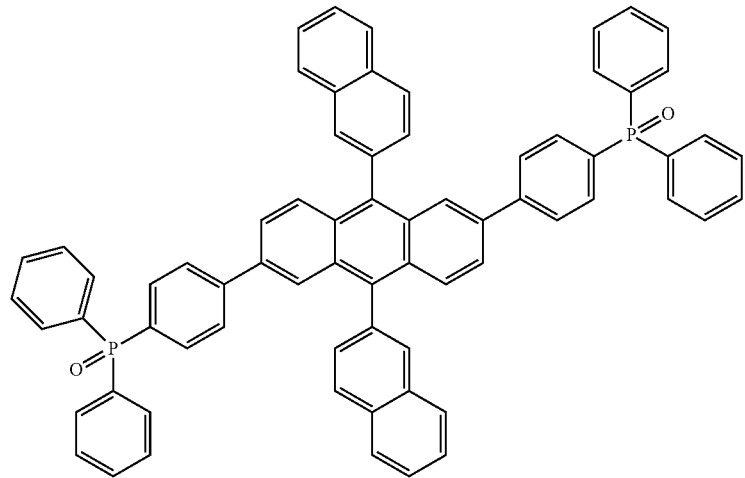
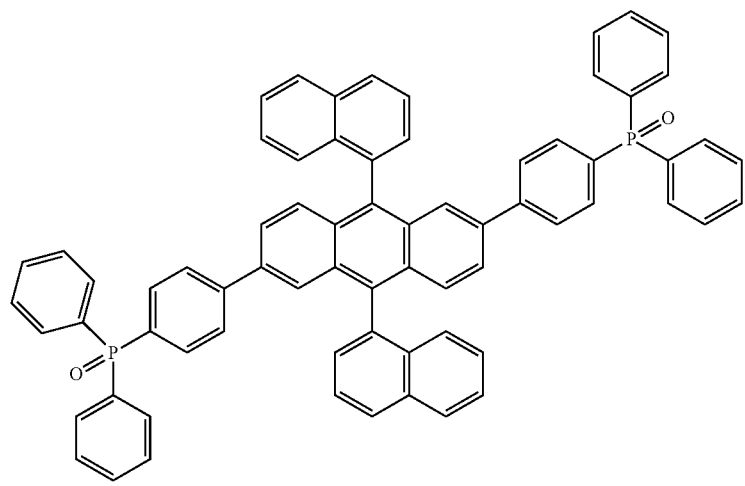
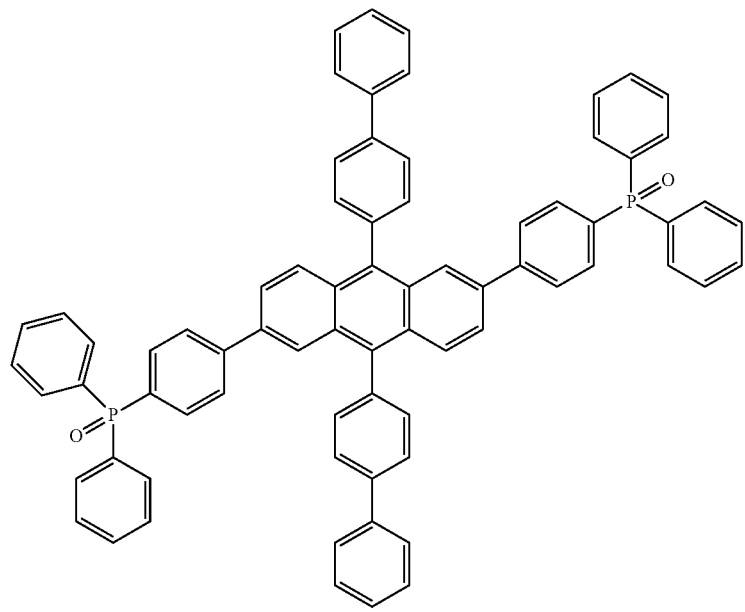

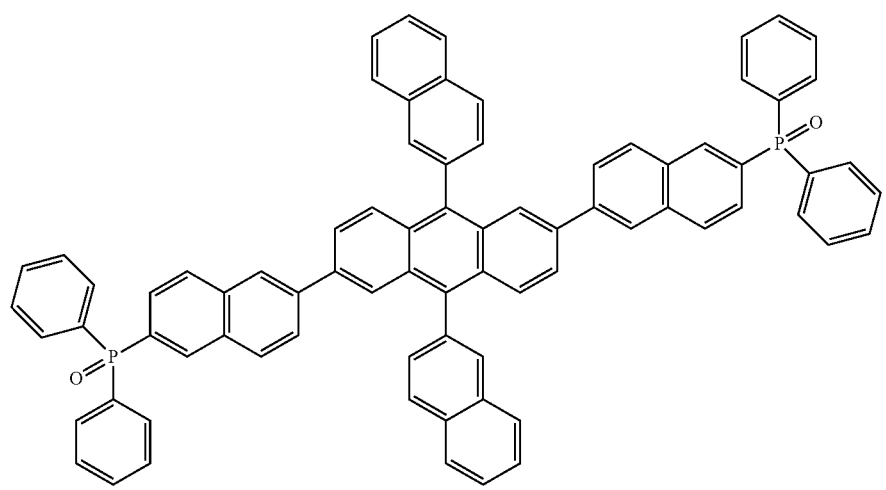
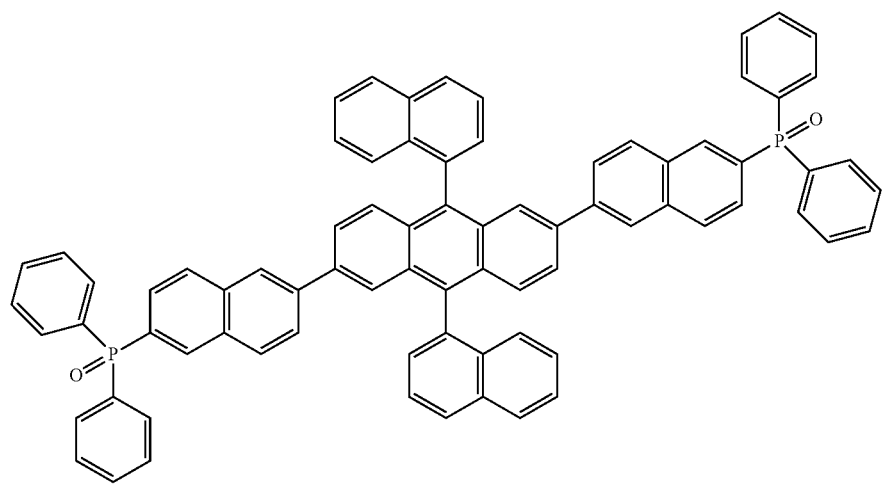
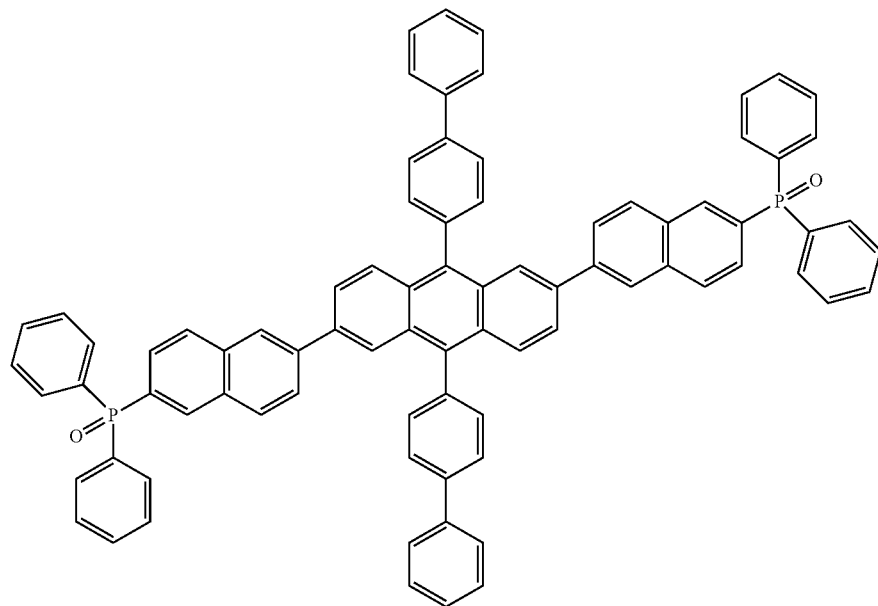

-continued
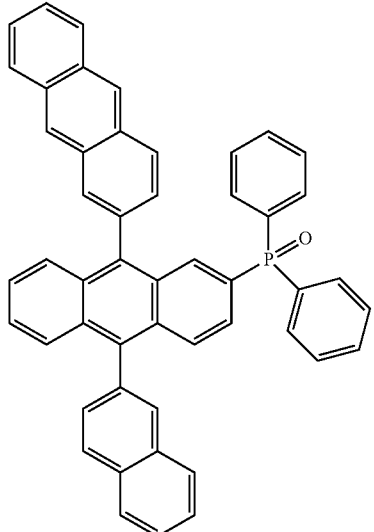
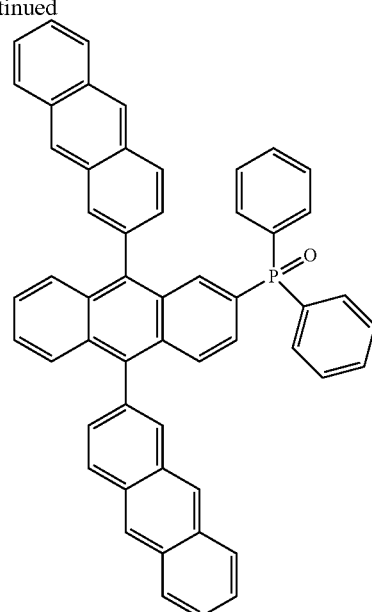
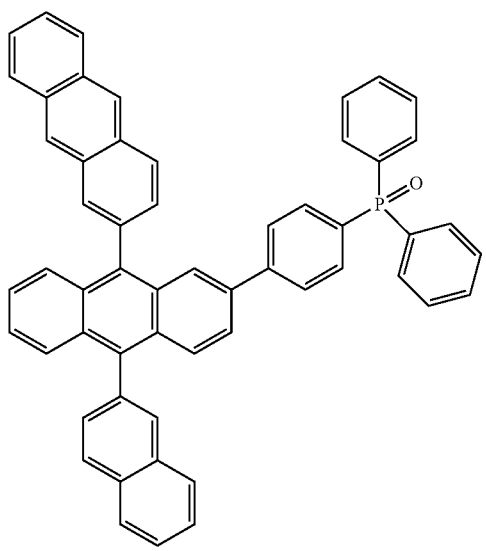

The electron transport region ETR may include at least one of the compounds represented below.
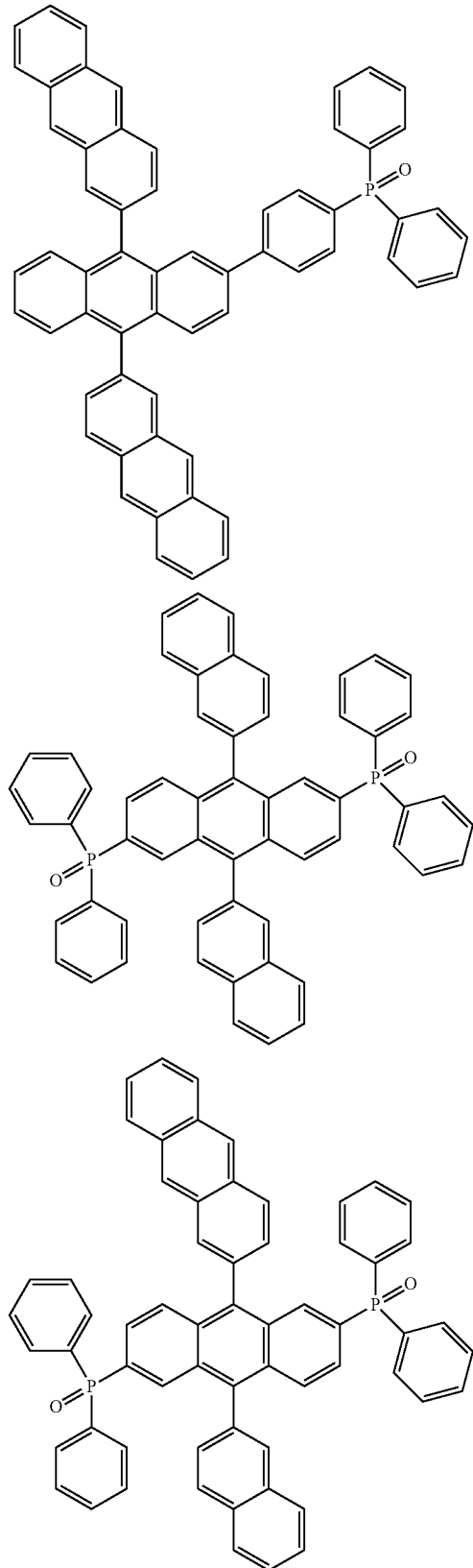
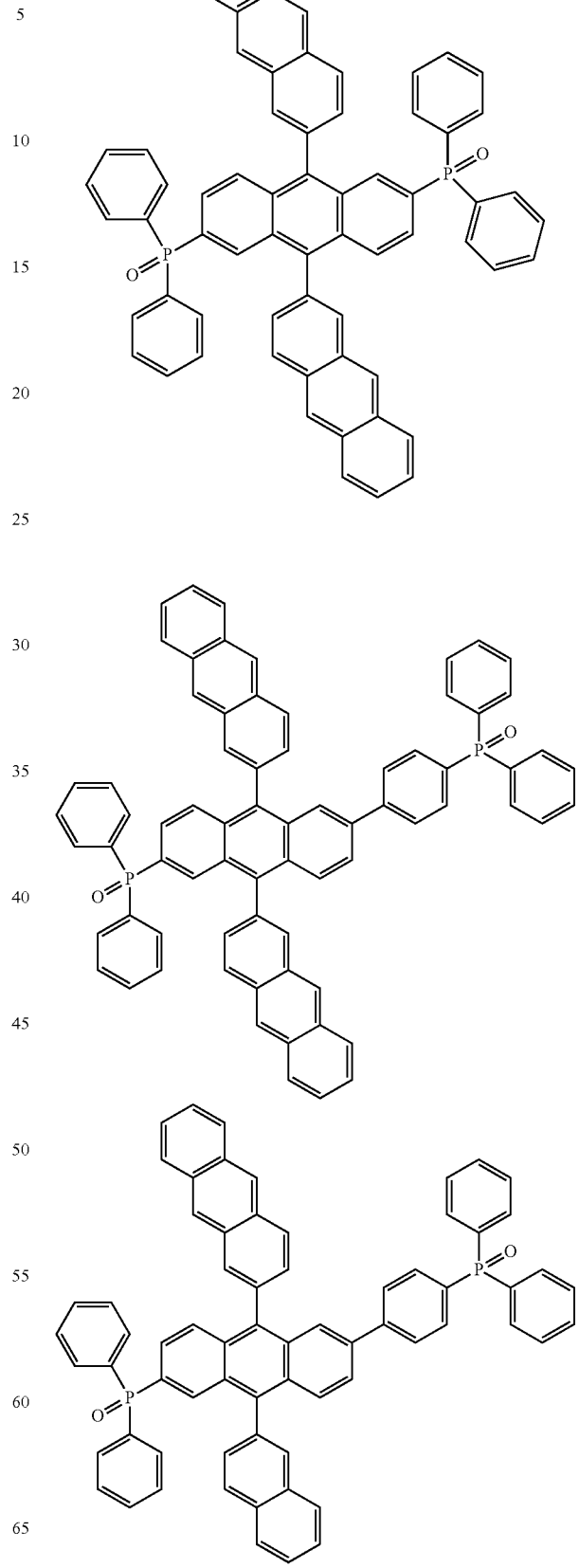

-continued

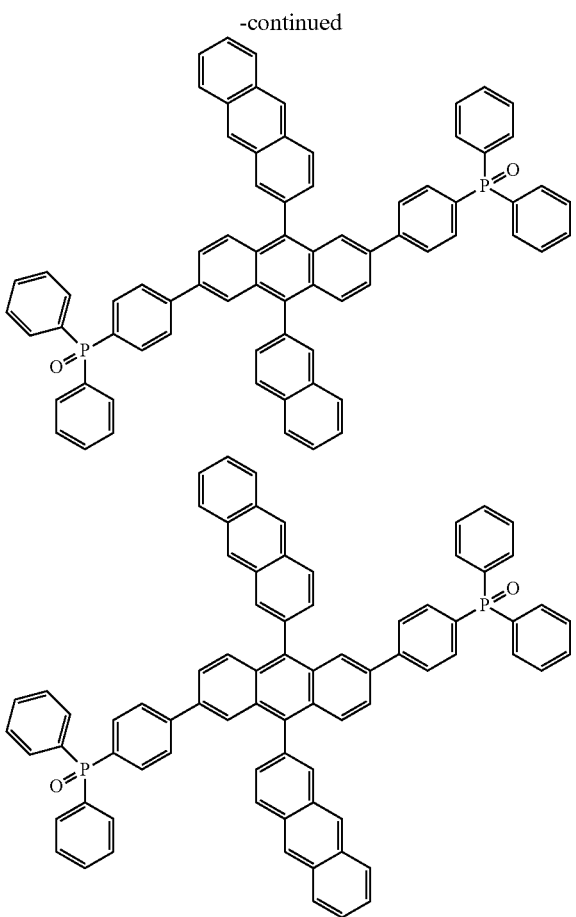

When the electron transport region ETR includes the electron injection layer EIL, the electron transport region ETR may include LiF, LiQ (lithium quinolate), $Li_2O$, BaO, NaCl, CsF, lanthanoide such as Yb, or a metal halide such as RbCl or RbI, as examples. The electron injection layer EIL may be also made of a mixture of an electron-transporting material and an insulating organo metal salt. The organo metal salt may have an energy band gap of about 4 eV or more. The organo metal salt may include, for example, a metal acetate, a metal benzoate, a metal acetoacetate, a metal acetylacetonate, or metal a stearate. The electron injection layer EIL may have a thickness of about 1 Å to about 100 Å, or, for example, about 3 Å to about 90 Å. When the thickness of the electron injection layer EIL falls within the above range, satisfactory electron injection characteristics may be obtained without a substantial increase in driving voltage.

The second electrode EL2 may be provided on the electron transport region ETR. The second electrode EL2 may be a common electrode or a cathode. The second electrode EL2 may be a transmissive electrode, a transflective electrode, or a reflective electrode.

When the second electrode EL2 is a transmissive electrode the second electrode EL2 may include Li, Ca, LiF/Ca, LiF/Al, Al, Mg, BaF, Ba, Ag, or compounds or mixtures thereof (e.g., a mixture of Ag and Mg).

The second electrode EL2 may include an auxiliary electrode. The auxiliary electrode may include a film, and a transparent metal oxide on the film. The film may be formed in such a way that the above-described material is deposited to face the light emission layer EML. The transparent metal oxide may be, for example, ITO, IZO, ZnO, ITZO, Mo, or Ti.

When the second electrode EL2 is a transflective electrode or a reflective electrode, the second electrode EL2 may include Ag, Mg, Al, Pt, Pd, Au, Ni, Nd, Ir, Cr, Li, Ca, LiF/Ca, LiF/Al, Mo, Ti, or compounds or mixtures thereof (e.g., a mixture of Ag and Mg). In some implementations, the second electrode EL2 may have a multi-layered structure including a reflective or transflective film made of the above materials and a transparent conductive film made of ITO, IZO, ZnO, or ITZO, or the like.

When the organic light emitting device OEL is a top-emission type, the first electrode EL1 may be a reflective electrode, and the second electrode EL2 may be a transmissive or transflective electrode. When the organic light emitting device OEL is a bottom-emission type, the first electrode EL1 may be a transmissive or transflective electrode, and the second electrode EL2 may be a reflective electrode.

In the organic light emitting device OEL according to an embodiment, as a voltage is applied to each of the first and second electrodes EL1 and EL2, holes injected from the first electrode EL1 are transported to the light emission layer EML via the hole transport region HTR, and electrons injected from the second electrode EL2 are transported to the light emission layer EML via the electron transport region ETR. Electrons and holes are recombined in the light emission layer EML to generate excitons, and light is emitted when the excitons fall from an excited state to a ground state.

Generally, in organic light emitting devices, migration rates of electrons may be less than those of holes, and band gaps may be generated between the energy band of a hole transport region and the energy band of a light emission layer and between the energy band of the light emission layer and the energy band of an electron transport region. The proportion of recombination of electrons and holes in the light emission layer may be reduced, it may be difficult for holes and electrons to be injected to the light emission layer. Thus luminous efficiency may be degraded.

An organic light emitting device according to an embodiment may include a buffer layer and an electron transport region including the compound represented by Chemical Formula 1 above. Accordingly, the band gap between the energy band of the hole transport region and the energy band of the light emission layer may be reduced. Hole injection to the light emission layer may be facilitated. The band gap between the energy band of the light emission layer and the energy band of the electron transport region may be reduced. Electron injection to the light emission layer may be facilitated. The organic light emitting device according to an embodiment may have high efficiency and long lifetime.

Hereinafter, a display device according to an embodiment will be described. Differences between the display device and the above-described organic light emitting device OEL according to an embodiment will be mainly described. In other aspects, the display device conforms to the above-described organic light emitting device OEL.

Figure 3:
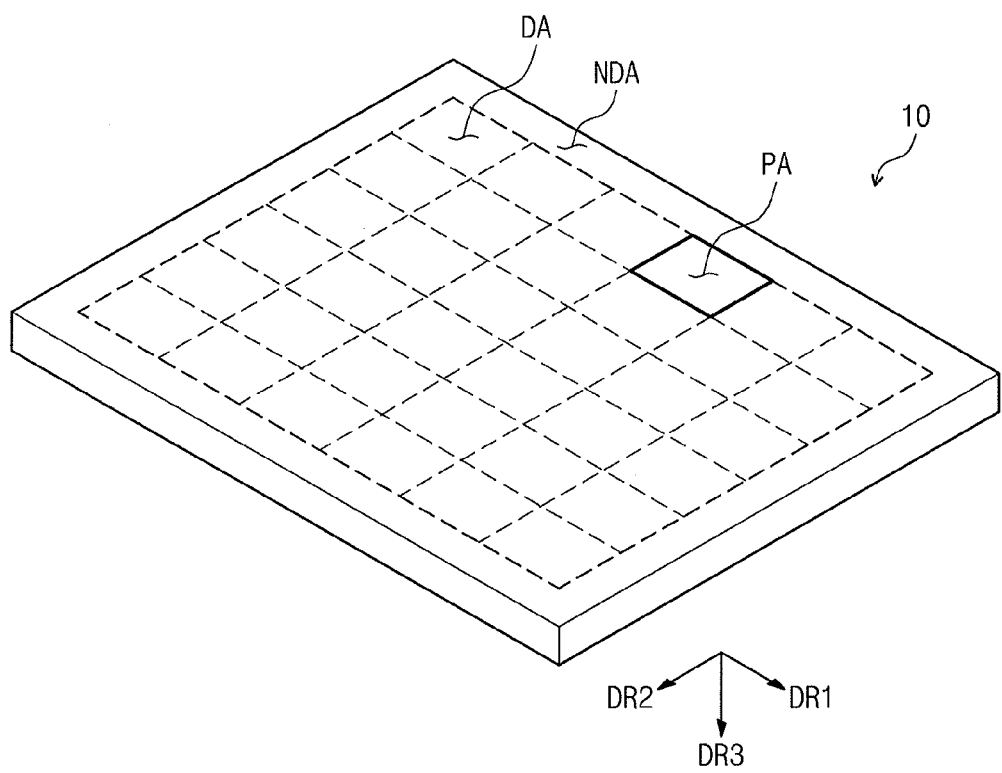
FIG. 3 illustrates a perspective view schematically depicting a display device according to an embodiment.

FIG. 3 illustrates a perspective view schematically depicting a display device 10 according to an embodiment.

Referring to FIG. 3, the display device 10 according to an embodiment includes a display area DA and a non-display area NDA.

The display area DA displays an image. As an example, the display area DA may have a substantially rectangular shape when viewed in a thickness direction (e.g., DR3) of the display device 10.

The display area DA may include a plurality of pixel areas (PAs). The pixel areas PAs may be disposed in the form of a matrix. The pixel areas PAs may be defined by a pixel defining layer (PDL in FIG. 6). The pixel areas PAs may include each of the plurality of pixels (PX in FIG. 4).

The non-display area NDA may not display an image. The non-display area NDA may, for example, surround the display area DA when viewed in the thickness direction (DR3) of the display device 10. The non-display area NDA may be adjacent to the display area DA along a first direction (e.g., DR1) and a second direction (e.g., DR2) that intersects with the first direction (e.g., DR1).

Figure 4:
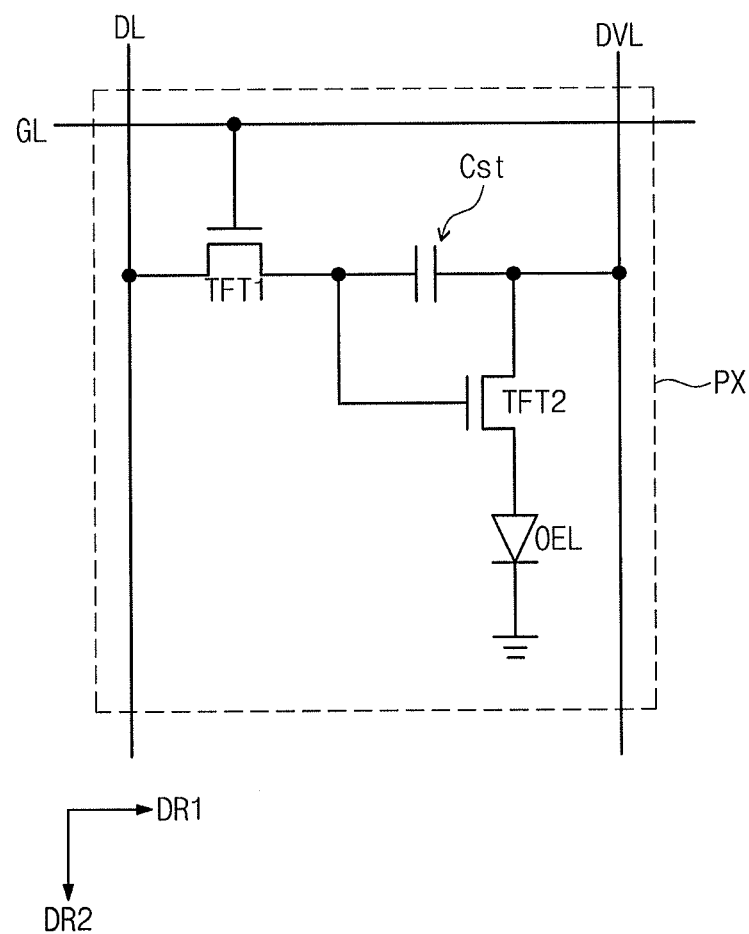
FIG. 4 illustrates a circuit diagram of one of pixels included in a display device according to an embodiment.

FIG. 4 illustrates a circuit diagram of one of pixels included in a display device 10 according to an embodiment.

Figure 5:
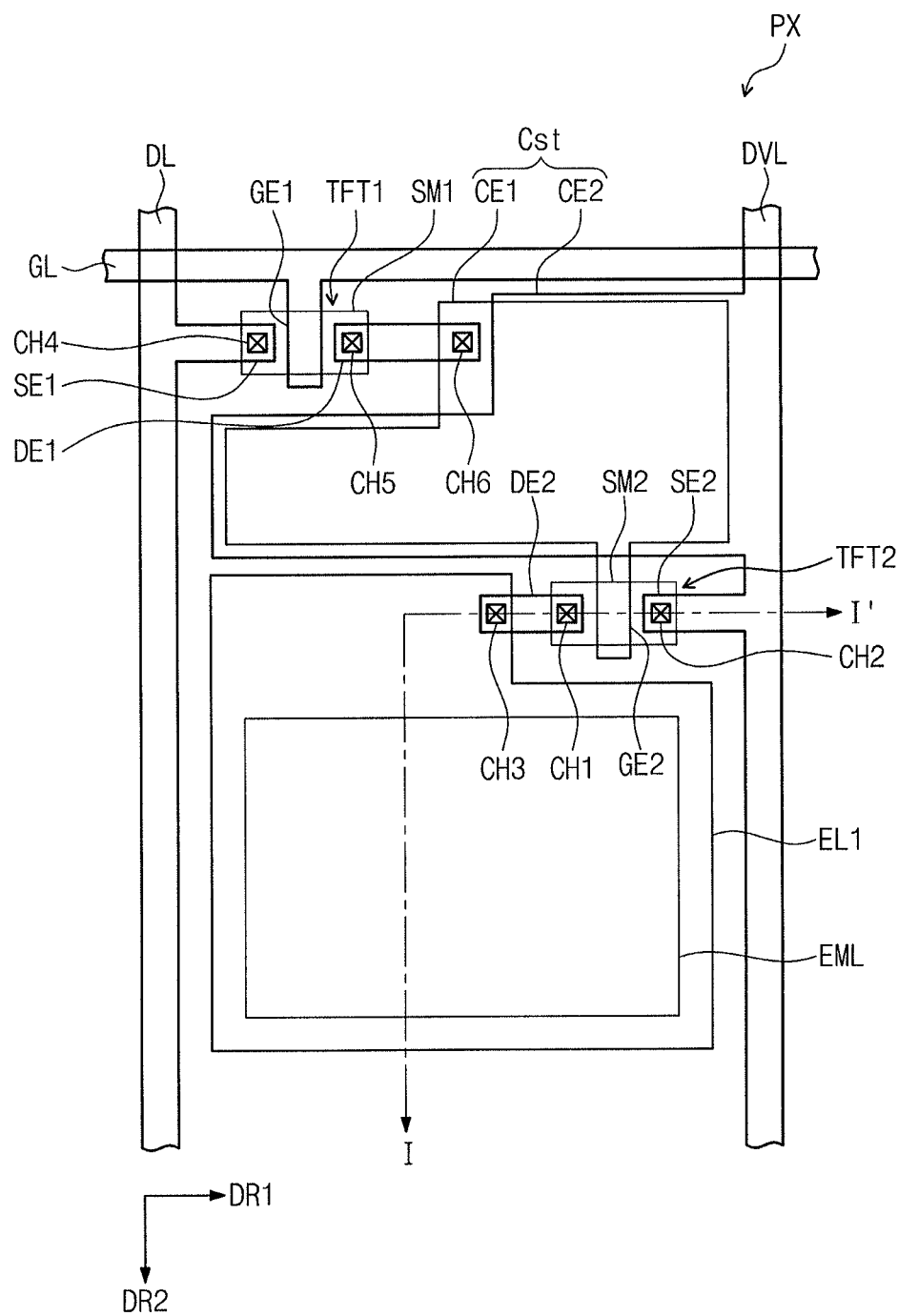
FIG. 5 illustrates a plan view depicting one of pixels included in a display device according to an embodiment.

FIG. 5 illustrates a plan view depicting one of pixels included in a display device 10 according to an embodiment.

Figure 6:
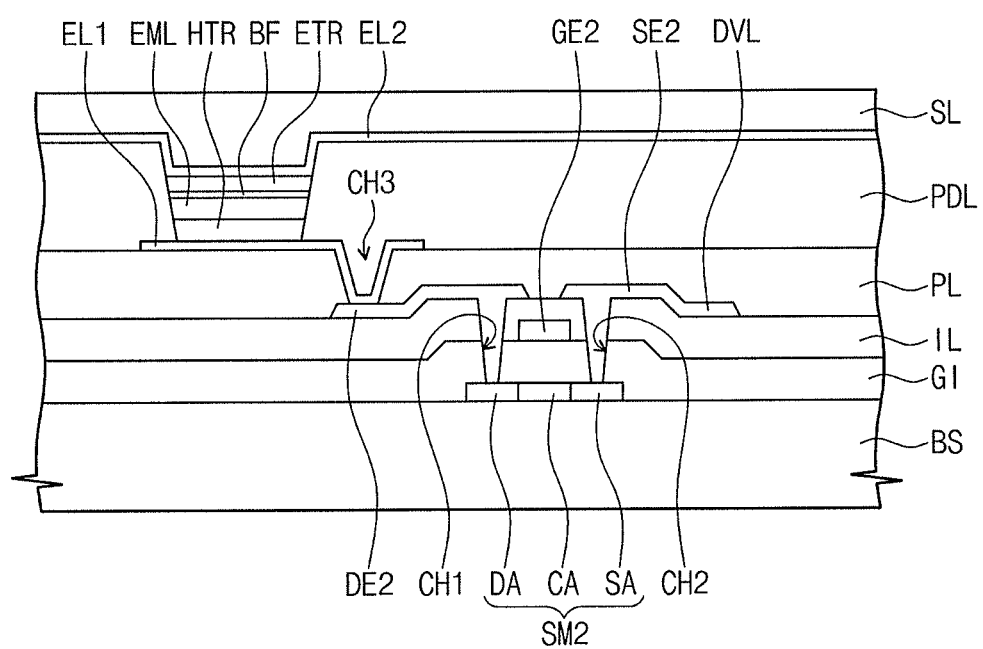
FIG. 6 illustrates a schematic sectional view taken along line I-I' in FIG. 5.

FIG. 6 illustrates a schematic sectional view taken along line I-I' in FIG. 5.

Referring to FIGS. 4 to 6, each of the pixels PXs may include a wiring unit, which includes a gate line GL, a data line DL, and a driving voltage line DVL, thin film transistors TFT1 and TFT2, which are connected to the wiring unit, an organic light emitting device OEL and a capacitor Cst, which are connected to the thin film transistors TFT1 and TFT2.

Each of the pixels PXs may emit light having a specific color, such as one of red light, green light, or blue light. In some implementations, the kind of colored light may further include, for example, cyan light, magenta light, or yellow light.

The gate line GL may extend in a first direction DR1. The data line DL may extend in a second direction DR2 that intersects with the gate line GL. The driving voltage line DVL may extend in substantially the same direction as the data line DL, for example, in the second direction DR2. The gate line GL may transfer a scanning signal to the thin film transistors TFT1 and TFT2, the data line DL may transfer a data signal to the thin film transistors TFT1 and TFT2, and the driving voltage line DVL may provide a driving voltage to the thin film transistors TFT1 and TFT2.

The thin film transistors TFT1 and TFT2 may include a driving thin film transistor TFT2 that controls the organic light emitting device OEL, and a switching thin film transistor TFT1 that switches the driving thin film transistor TFT2. Each of the pixels PXs may include two thin film transistors TFT1 and TFT2. In some implementations, each of the pixels PXs may include a single thin film transistor and a capacitor, or may include three or more thin film transistors and two or more capacitors.

The switching thin film transistor TFT1 may include a first gate electrode GE1, a first source electrode SE1, and a first drain electrode DE1. The first gate electrode GE1 may be connected to the gate line GL, and the first source electrode SE1 may be connected to the data line DL. The first drain electrode DE1 may be connected to a first common electrode CE1 via a fifth contact hole CH5. The switching thin film transistor TFT1 may transfer the data signal, which is applied to the data line DL, to the driving thin film transistor TFT2 according to the scanning signal applied to the gate line GL.

The driving thin film transistor TFT2 may include a second gate electrode GE2, a second source electrode SE2, and a second drain electrode DE2. The second gate electrode GE2 may be connected to the first common electrode CE1.

The second source electrode SE2 may be connected to the driving voltage line DVL. The second drain electrode DE2 may be connected to the first electrode EL1 via a third contact hole CH3.

The first electrode EL1 may be connected to the second drain electrode DE2 of the driving thin film transistor TFT2. A common voltage may be applied to the second electrode EL2, and the light emission layer EML may emit blue light according to an output signal of the driving thin film transistor TFT2, and thus, may display an image. The first and second electrodes EL1 and EL2 will be later described below with more specificity.

The capacitor Cst may be connected between the second gate electrode GE2 and the second source electrode SE2 of the driving thin film transistor TFT2 The capacitor Cst may charge and keep a data signal that is input to the second gate electrode GE2 of the driving thin film transistor TFT2. The capacitor Cst may include the first common electrode CE1, which is connected to the first drain electrode DE1 via a sixth contact hole CH6, and a second common electrode CE2, which is connected to the driving voltage line DVL.

Referring to FIGS. 5 and 6, the display device 10 according to an embodiment includes a base substrate BS on which the thin film transistor and the organic light emitting device are stacked. The base substrate BS may be selected considering mechanical strength, thermal stability, transparency, surface smoothness, ease of handling, and water resistance, and the like. For example, the base substrate may be made of a suitable insulating material such as glass, plastic, or crystal. Examples of an organic polymer used for the base substrate BS may include polyethylene terephthalate (PET), polyethylene naphthalate (PEN), polyimide, and polyethersulfone.

A substrate buffer layer (not shown) may be provided on the base substrate BS. The substrate buffer layer may help to prevent impurities from diffusing to the switching thin film transistor TFT1 and the driving thin film transistor TFT2. The substrate buffer layer may be made of, for example, silicon nitride ($SiN_x$), silicon oxide ($SiO_x$), or silicon oxinitride ($SiO_xN_y$). In some implementations, according to materials of the base substrate and process conditions, the substrate buffer layer may be omitted.

First and second semiconductor layers SM1 and SM2 may be provided on the base substrate BS. The first and second semiconductor layers SM1 and SM2 may be made of semiconductor materials, and may act as active layers of the switching thin film transistor TFT1 and the driving thin film transistor TFT2, respectively. The first and second semiconductor layers SM1 and SM2 may each include a source area SA, a drain area DA, and a channel area CA, which may be provided between the source area SA and the drain area DA. The first and second semiconductor layers SM1 and SM2 may each be made of a material selected from the group of inorganic semiconductors and organic semiconductors. The source area SA and the drain area DA may be doped with n-type impurities or p-type impurities.

A gate insulating layer GI may be provided on the first and second semiconductor layers SM1 and SM2. The gate insulating layer GI may cover the first and second semiconductor layers SM1 and SM2. The gate insulating layer GI may be made of an organic insulating material or an inorganic insulating material.

The first and second gate electrodes GE1 and GE2 may be provided on the gate insulating layer GI. The first and second gate electrodes GE1 and GE2 may be provided to cover areas corresponding to channel areas CAs of the first and second semiconductor layers SM1 and SM2, respectively.

An interlayer insulating layer IL may be provided on the first and second gate electrodes GE1 and GE2. The interlayer insulating layer IL may cover the first and second gate electrodes GE1 and GE2. The interlayer insulating layer IL may be made of an organic insulating material or an inorganic insulating material.

The first source electrode SE1 and the first drain electrode DE1, and the second source electrode SE2 and the second drain electrode DE2 may be provided on the interlayer insulating layer IL. The second drain electrode DE2 may contact the drain area DA of the second semiconductor layer SM2 via a first contact hole CH1, which may be formed in the gate insulating layer GI and the interlayer insulating layer IL. The second source electrode SE2 may contact the source area SA of the second semiconductor layer SM2 via a second contact hole CH2, which may be formed in the gate insulating layer GI and the interlayer insulating layer IL. The first source electrode SE1 may contact a source area of the first semiconductor layer SM1 via a fourth contact hole CH4, which may be formed in the gate insulating layer GI and the interlayer insulating layer IL. The first drain electrode DE1 may contact a drain area of the first semiconductor layer SM1 via the fifth contact hole CH5 which may be formed in the gate insulating layer GI and the interlayer insulating layer IL.

A passivation layer PL may be provided on the first source electrode SE1 and the first drain electrode DE1, and on the second source electrode SE2 and the second drain electrode DE2. The passivation layer PL may act as a protective film that protects the switching thin film transistor TFT1 and the driving thin film transistor TFT2. The passivation layer PL may also act as a planarization film planarize a surface thereof.

The first electrode EL1 may be provided on the passivation layer PL. The first electrode EL1 may be, for example, an anode. The first electrode EL1 may be connected to the second drain electrode DE2 of the driving thin film transistor TFT2 via the third contact hole CH3 which may be formed in the passivation layer PL.

On the passivation layer PL, the pixel defining layer PDL may be provided in which pixel areas (PAs in FIG. 3) are defined to correspond to each of the pixels PXs. The pixel defining layer PDL may expose a top surface of the first electrode EL1, and may protrude from the base substrate BS along the perimeter of each of the pixels PXs. The pixel defining layer PDL may include a metal-fluorine ionic compound. For example, the pixel defining layer PDL may be made of a metal-fluorine ionic compound selected from the group of LiF, $BaF_2$, and CsF. When the metal-fluorine ionic compound has a predetermined thickness, it may have an insulating property. The thickness of the pixel defining layer PDL may be, for example, about 10 nm to about 100 nm.

An organic light emitting device OEL is provided to each of the pixel areas (PA in FIG. 3) surrounded by the pixel defining layer PDL. The organic light emitting device OEL may include a first electrode EL1, a hole transport region HTR, a light emission layer EML, a buffer layer BF, an electron transport region ETR, and a second electrode EL2.

The first electrode EL1 may be conductive. The first electrode EL1 may be a pixel electrode or an anode. The first electrode EL1 may be a transmissive electrode, a transflective electrode, or a reflective electrode. When the first electrode EL1 is a transmissive electrode, the first electrode EL1 may be made of transparent metal oxide such as indium tin oxide (ITO), indium zinc oxide (IZO), zinc oxide (ZnO), or indium tin zinc oxide (ITZO). When the first electrode EL1 is a transflective electrode or a reflective electrode, the first electrode EL1 may include Ag, Mg, Al, Pt, Pd, Au, Ni, Nd, Ir, Cr, or a mixture thereof.

An organic layer may be disposed on the first electrode EL1. The organic layer may include the light emission layer EML. The organic layer may further include the hole transport region HTR and the electron transport region ETR.

The hole transport region HTR may be provided on the first electrode EL1. The hole transport region HTR may include at least one of a hole injection layer HIL, a hole transport layer HTL, a hole buffer layer, or an electron blocking layer.

The hole transport region HTR may have a single layer made of a single material, a single layer made of a plurality of different materials, or a multi-layered structure having a plurality layers made of a plurality of different materials.

For example, the hole transport region HTR may have a single-layered structure made of a plurality of different materials, or a multi-layered structure which is sequentially stacked from the first electrode EL1, such as hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer.

The hole transport region HTR may be formed by a suitable method such as a vacuum deposition method, a spin coating method, a cast method, a Langmuir-Blodgett (LB) method, an inkjet printing method, a laser printing method, or a laser induced thermal imaging (LITI) method.

When the hole transport region HTR includes the hole injection layer HIL, the hole transport region HTR may include a phthalocyanine compound such as copper phthalocyanine, N,N'-diphenyl-N,N'-bis-[4-(phenyl-m-tolylamino)-phenyl]-biphenyl-4,4'-diamine (DNTPD), 4,4',4"-tris(3-methylphenylphenylamino) triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/Camphor sulfonicacid (PANI/CSA), or (polyaniline)/poly(4-styrenesulfonate) (PANI/PSS), as examples.

When the hole transport region HTR includes the hole transport layer HTL, the hole transport region HTR may include a carbazole derivative such as N-phenylcarbazole or polyvinylcarbazole, a fluorene derivative, a triphenylamine derivative such as N,N'-bis(3-methylphenyl)-N,N'-diphenyl-[1,1-biphenyl]-4,4'-diamine (TPD) or 4,4',4"-tris(N-carbazolyl)triphenylamine (TCTA), N,N'-di(1-naphthyl)-N,N'-diphenylbenzidine (NPB), or 4,4'-cyclohexylidene bis[N,N-bis(4-methylphenyl)benzenamine] (TAPC), as examples.

The hole transport region HTR may have a thickness of about 100 Å to about 10,000 Å, or, for example, about 100 Å to about 1,000 Å. When the hole transport region HTR includes both the hole injection layer HIL and the hole transport layer HTL, the hole injection layer HIL may have a thickness of about 100 Å to about 10,000 Å, or, for example, about 100 Å to about 1,000 Å. The hole transport layer HTL may have a thickness of about 50 Å to about 2,000 Å, or, for example, about 100 Å to about 1,500 Å. When the thicknesses of the hole transport region HTR, the hole injection layer HIL, and the hole transport layer HTL fall within the above ranges, respectively, satisfactory hole transport characteristics may be obtained without a substantial increase in driving voltage.

The hole transport region HTR may further include a charge generation material for improving conductivity, in addition to the aforementioned materials. The charge generation material may be homogeneously or non-homogeneously dispersed in the hole transport region HTR. The charge generation material may be, for example, a p-dopant. The p-dopant may be, for example, one of a quinone derivative, a metal oxide, or a cyano group-containing compound. For example, the p-dopant may include a quinone derivative such as tetracyanoquinodimethane (TCNQ) or 2,3,5,6-tetrafluoro-tetracyanoquinodimethane (F4-TCNQ), or a metal oxide such as tungsten oxide or molybdenum oxide.

As mentioned above, the hole transport region HTR may include at least one of the hole buffer layer or the electron blocking layer, in addition to the hole injection layer HIL and the hole transport layer HTL. The hole buffer layer may compensate a resonance distance according to the wavelength of light emitted from the light emission layer EML, and thus, may serve to increase luminous efficiency. Materials included in the hole transport region HTR may be used as materials included in the hole buffer layer. The electron blocking layer may help to prevent electrons from being injected from the electron transport region ETR to the hole transport region HTR.

The light emission layer EML may be provided on the hole transport region HTR. The light emission layer EML may have a single layer made of a single material, a single layer made of a plurality of different materials, or a multi-layered structure having a plurality layers made of a plurality of different materials.

The light emission layer EML may be formed by a suitable method, such as a vacuum deposition method, a spin coating method, a cast method, a Langmuir-Blodgett (LB) method, an inkjet printing method, a laser printing method, or a laser induced thermal imaging (LITI) method.

The light emission layer EML may be made of suitable light emitting materials, such as materials emitting red light, green light, and blue light. The light emission layer EML may include a fluorescent material or a phosphor. In some implementation, the light emission layer EML may include a host and a dopant.

The host may a suitable host material such as tris(8-hydroxyquinolino)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN).

When the light emission layer EML emits red light, the light emission layer EML may include, for example, a fluorescent material containing (tris(dibenzoylmethanato) phenanthroline europium) (PBD:Eu(DBM)$_3$(Phen)) or perylene. When the light emission layer EML emits red light, the dopant included in the light emission layer EML may be selected, for example, from the group of a metal complex and an organometallic complex, such as bis(1-phenylisoquinoline)acetylacetonate iridium (PIQIr(acac)), bis(1-phenylquinoline) acetylacetonate iridium (PQIr (acac)), tris(1-phenylquinoline)iridium (PQIr), and octaethylporphyrin platinum (PtOEP).

When the light emission layer EML emits green light, the light emission layer EML may include, for example, a fluorescent material containing tris(8-hydroxyquinolino)aluminum (Alq3). When the light emission layer EML emits green light, the dopant included in the light emission layer EML may be selected, for example, from the group consisting of a metal complex and an organometallic complex such as fac-tris(2-phenylpyridine)iridium (Ir(ppy)$_3$).

When the light emission layer EML emits blue light, the light emission layer EML may include, for example, a fluorescent material containing one selected from the group of spiro-DPVBi, spiro-6P, distyryl-benzene (DSB), distyryl-arylene (DSA), a polyfluorene (PFO) based polymer, and a poly(p-phenylene vinylene) (PPV) based polymer. When the light emission layer EML emits blue light, the dopant included in the light emission layer EML may be selected, for example, from the group consisting of a metal complex and an organometallic complex such as (4,6-F$_2$ppy)$_2$Irpic.

The buffer layer BF may be provided on the light emission layer EML. The buffer layer BF may help to prevent holes from being injected from the light emission layer EML to the electron transport region ETR, and may promote the injection of electrons from the electron transport region ETR to the light emission layer EML. The buffer layer BF may reduce an energy difference between the light emission layer EML and the electron transport region ETR. The buffer layer BF may include at least one selected from the group of a carbazole derivative, a phenanthroline derivative, a triazole derivative, and a quinolinolato-based metal complex.

The buffer layer BF may include, for example, at least one selected from the group consisting of tris(8-hydroxyquinolino)aluminum (Alq3), 4,4'-bis(N-carbazolyl)-1,1'-biphenyl (CBP), N,N'-dicarbazolyl-3,5-benzene (mCP), poly(n-vinylcarbazole) (PVK), 4,4',4"-tris(carbazol-9-yl)-triphenylamine (TCTA), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 4,4'-bis(9-carbazolyl)-2,2'-dimethyl-biphenyl (CDBP), 4,4',4"-tris(N-carbazolyl)triphenylamine (TCTA), 2,9-dimethyl-4,7-diphenyl-1,10-phenanthroline (BCP), 4,7-diphenyl-1,10-phenanthroline (Bphen), and 3-phenyl-4-(1'-naphthyl)-5-phenylcarbazole.

The electron transport region ETR may be provided on the buffer layer BF. The electron transport region ETR may include, for example, at least one of a hole blocking layer, an electron transport layer ETL, and an electron injection layer EIL.

For example, the electron transport region ETR may have a multi-layered structure that is sequentially stacked from the light emission layer EML, such as electron transport layer ETL/electron injection layer EIL or hole blocking layer/electron transport layer ETL/electron injection layer EIL, or have a single-layered structure in which at least two of the above layers are mixed.

The electron transport region ETR may be formed by a suitable method such as a vacuum deposition method, a spin coating method, a cast method, a Langmuir-Blodgett (LB) method, an inkjet printing method, a laser printing method, or a laser induced thermal imaging (LITI) method.

The electron transport region ETR may include the electron transport layer ETL and the electron injection layer EIL. The electron injection layer EIL may be provided on the electron transport layer ETL.

The electron transport layer ETL may have a thickness of about 100 Å to about 1,000 Å, or, for example, about 150 Å to about 500 Å. When the thickness of the electron transport layer ETL falls within the above range, satisfactory electron transport characteristics may be obtained without a substantial increase in driving voltage.

The electron injection layer EIL may have a thickness of about 1 Å to about 100 Å, or, for example, about 3 Å to about 90 Å. When the thickness of the electron injection layer EIL falls within the above range, satisfactory electron injection characteristics may be obtained without a substantial increase in driving voltage.

As mentioned above, the electron transport region ETR may include the hole blocking layer. For example, the hole blocking layer may include at least one of 2,9-dimethyl-4,7-diphenyl-1,10-phenanthroline (BCP) or 4,7-diphenyl-1,10-phenanthroline (Bphen). The hole blocking layer may have a thickness of about 20 Å to about 1,000 Å, or, for example, about 30 Å to about 300 Å. When the thickness of the hole blocking layer falls within the above range, satisfactory hole blocking characteristics may be obtained without a substantial increase in driving voltage.

The electron transport region ETR may include a compound represented by Chemical Formula 1 below. More specifically, the electron transport layer ETL may include the compound represented by Chemical Formula 1 below.

[Chemical Formula 1]

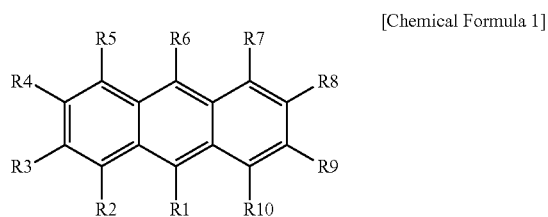

In Chemical Formula 1, R1 is a naphthyl group or a biphenyl group; at least one of R2 to R10 is represented by Chemical Formula 2 below; and remaining ones of R2 to R10 are hydrogen, deuterium, a halogen group, a nitrile group, a nitro group, a hydroxyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, or a substituted or unsubstituted heterocyclic group having at least one of N, O, or S atom,

[Chemical Formula 2]

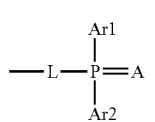

In Chemical Formula 2, L a is a direct bond, a substituted or unsubstituted arylene group, or a substituted or unsubstituted heteroarylene group having at least one of N, O, or S atom; Ar1 and Ar2 are independently a substituted or unsubstituted aryl group, or a substituted or unsubstituted heterocyclic group including at least one of N, O, or S; and A is O, S, or Se.

The electron transport region ETR may include at least one of the compounds represented below.

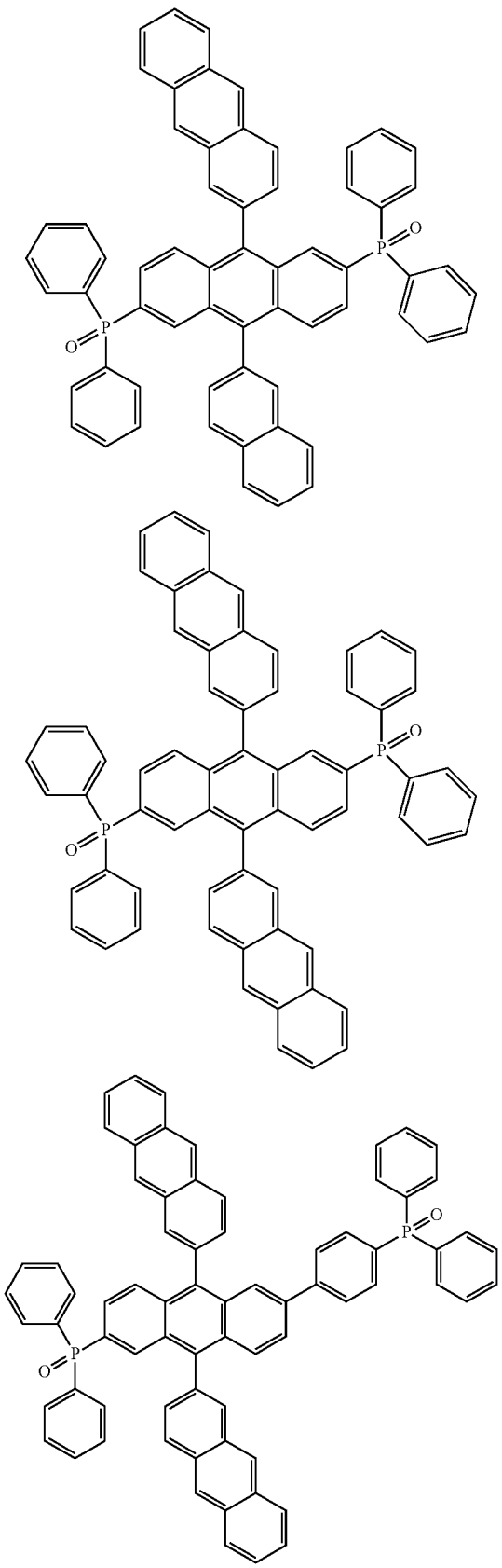

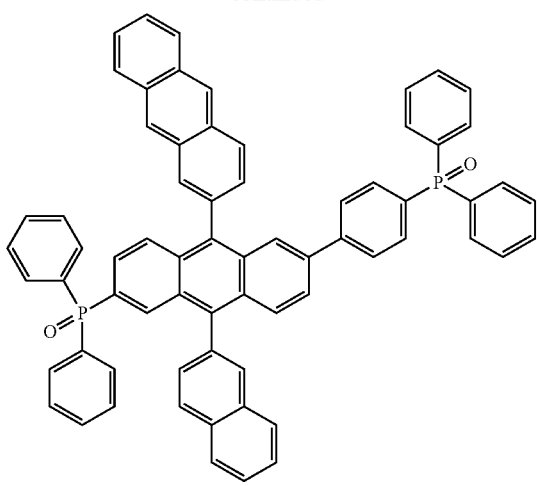
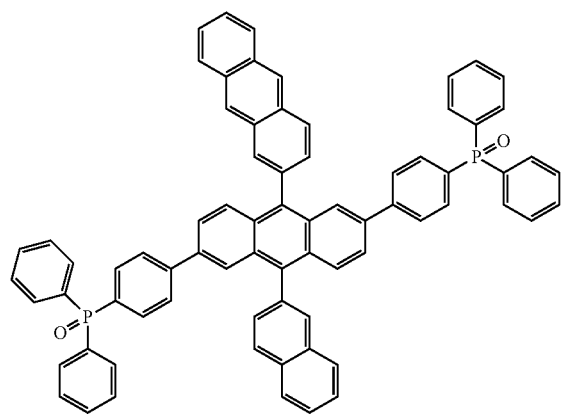
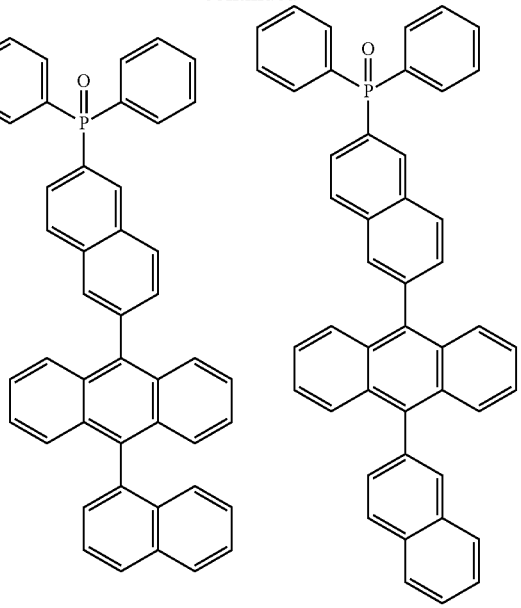
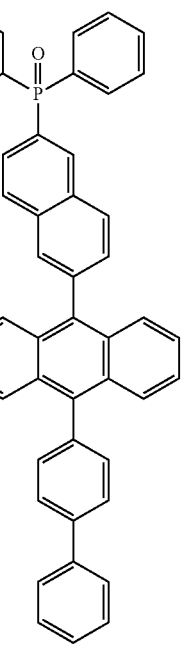

The electron transport region ETR may include at least one of compounds represented below.
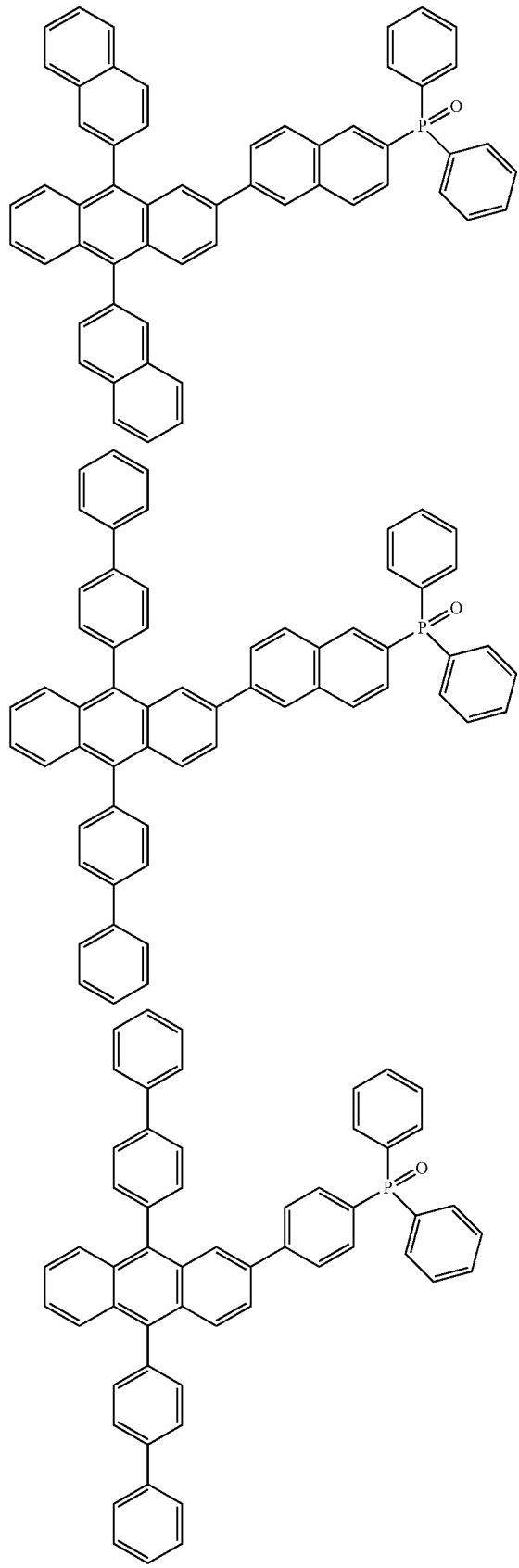
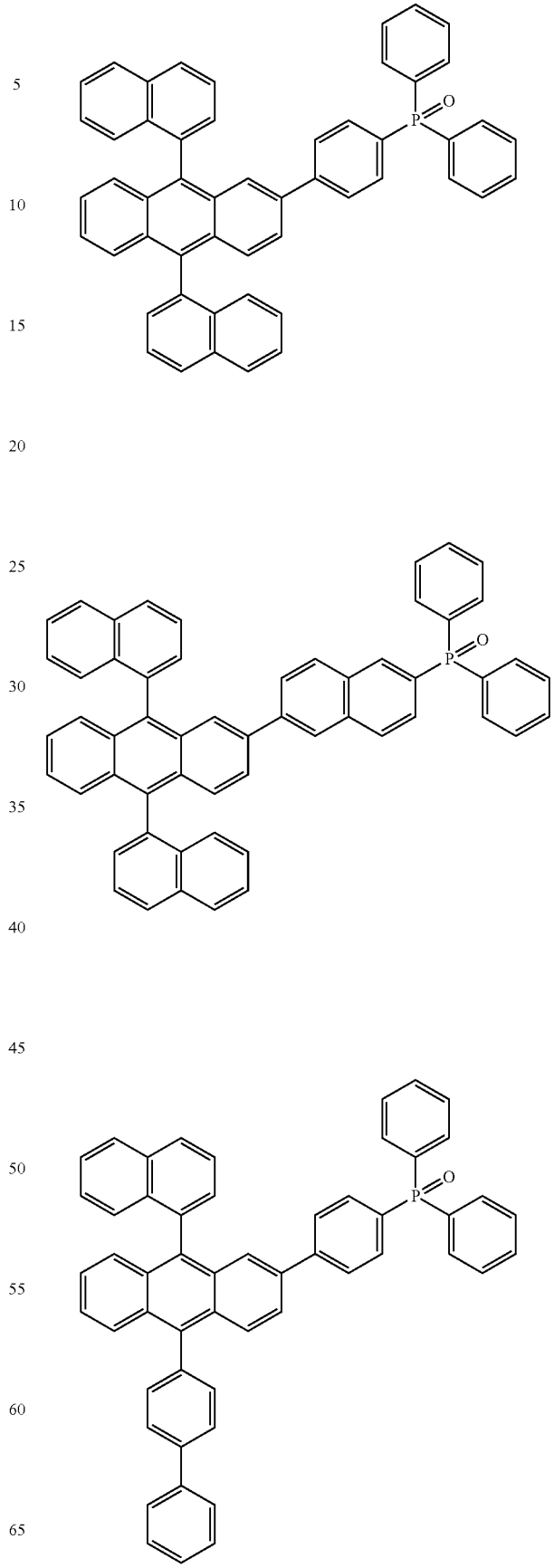

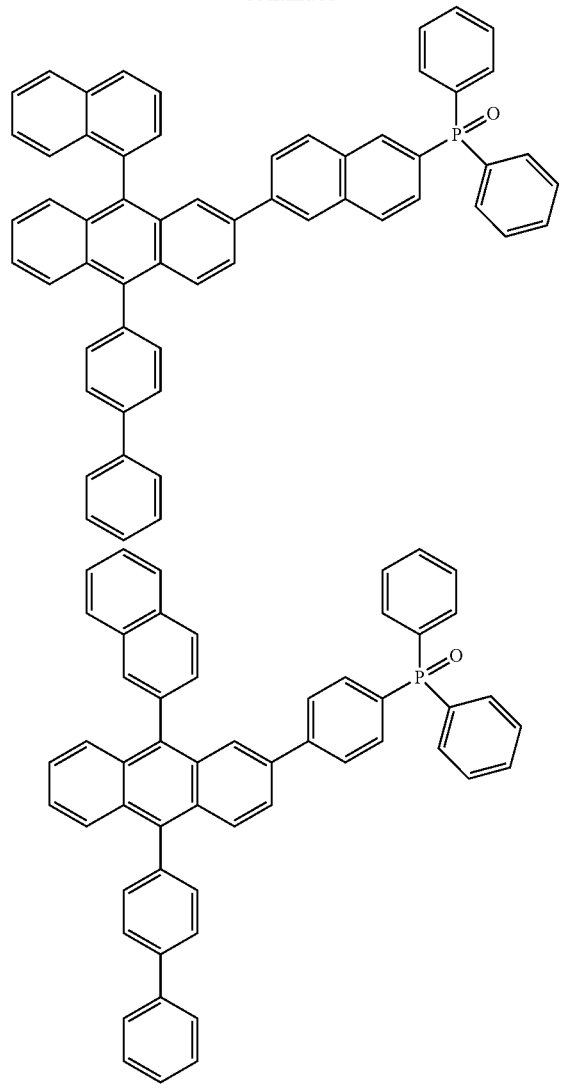
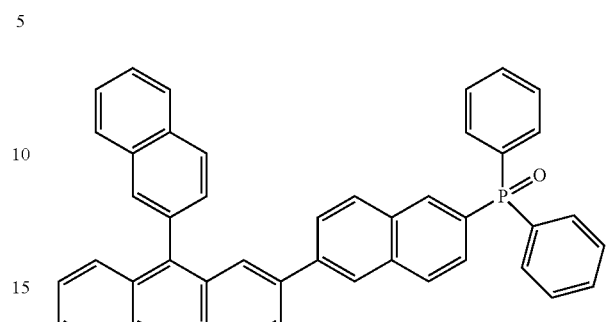
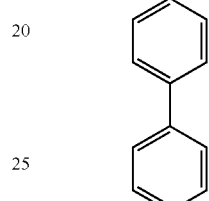
The electron transport region ETR may include at least one of compounds represented below.
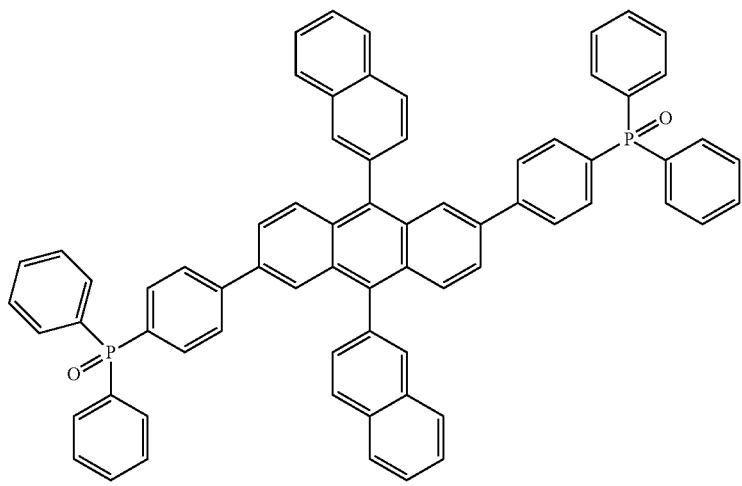

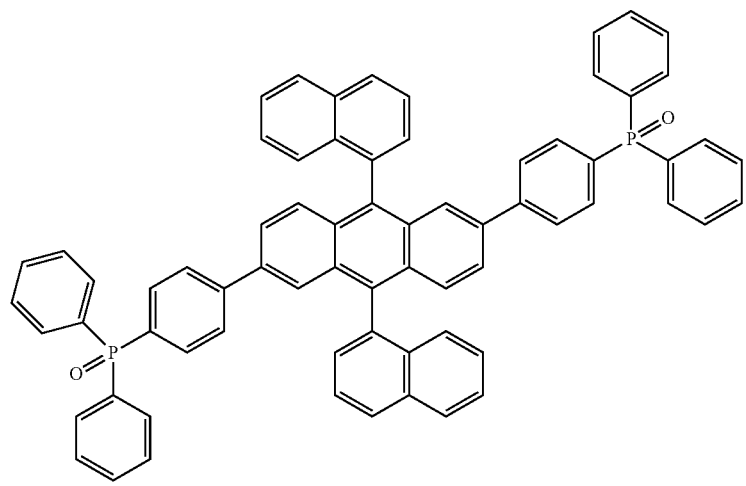
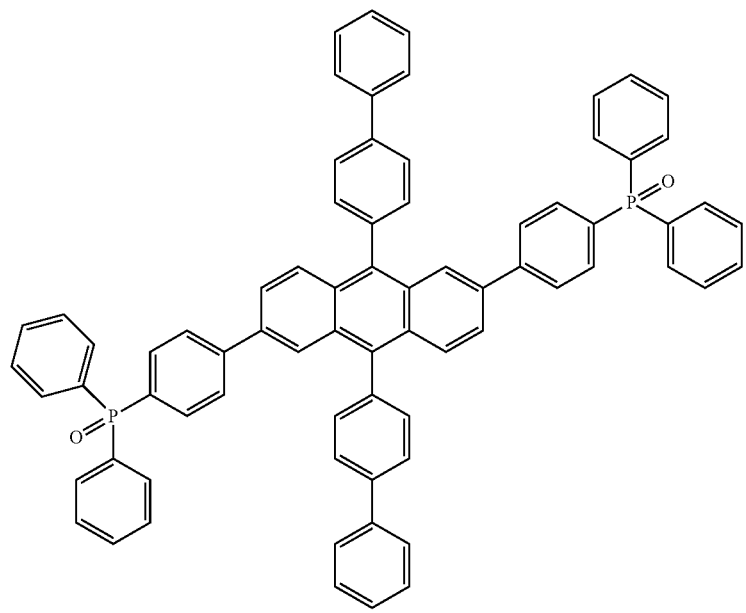
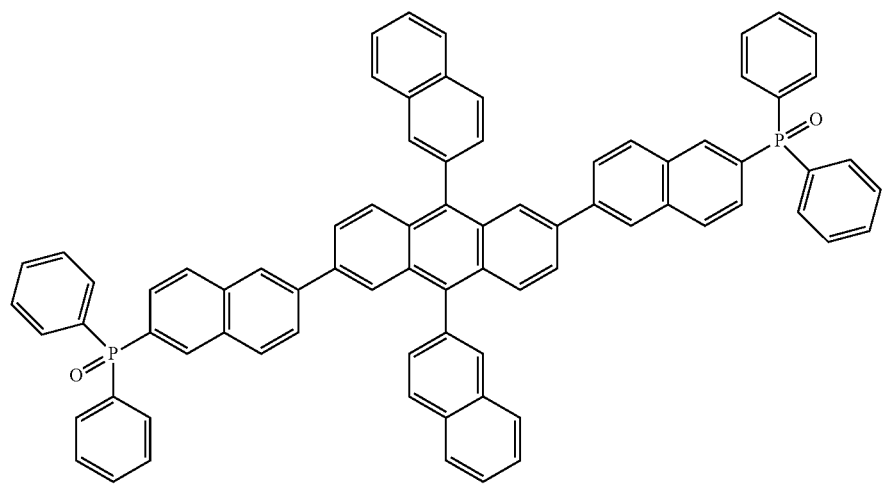

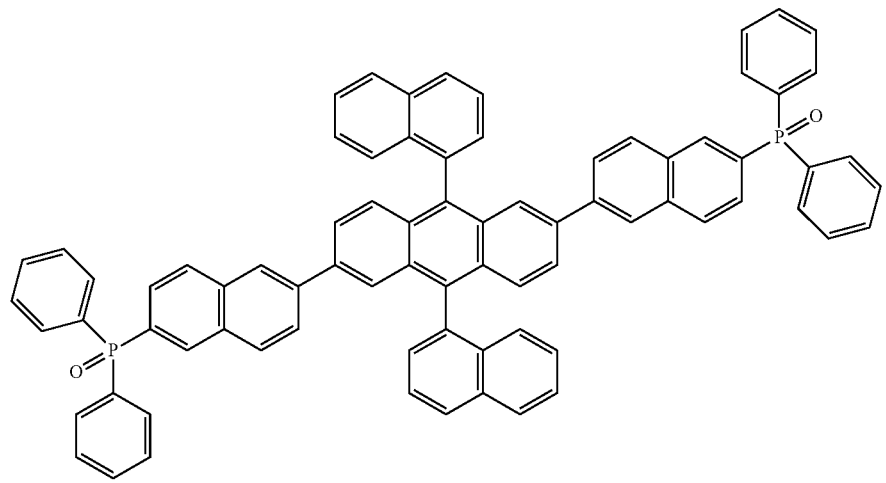
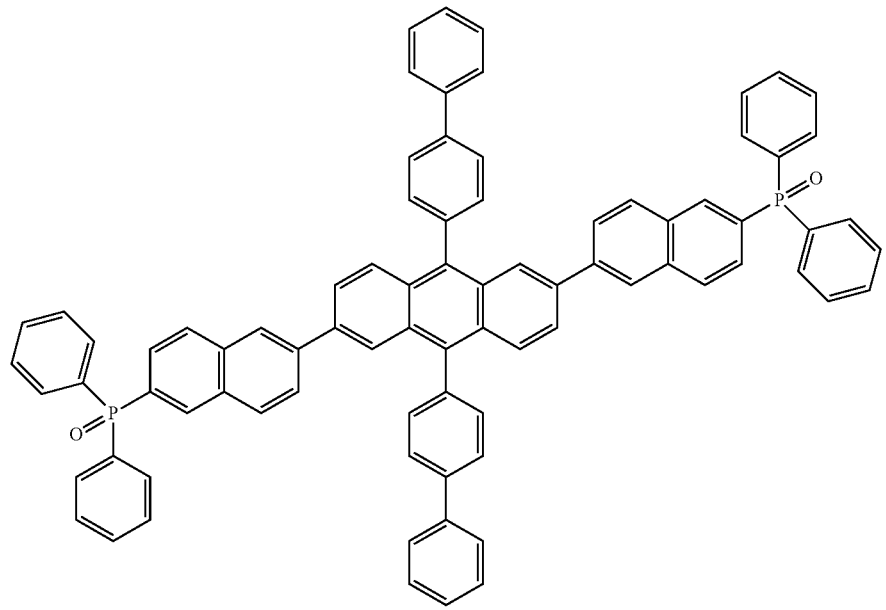
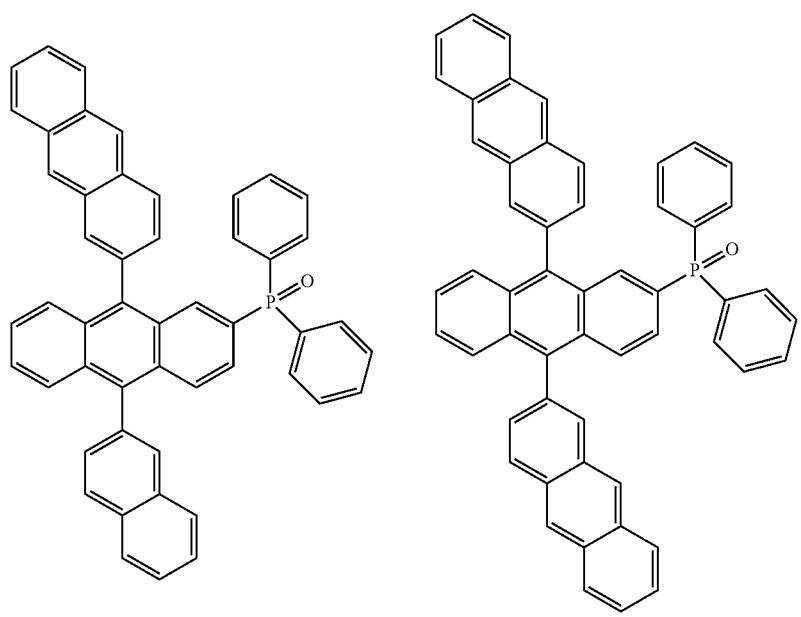

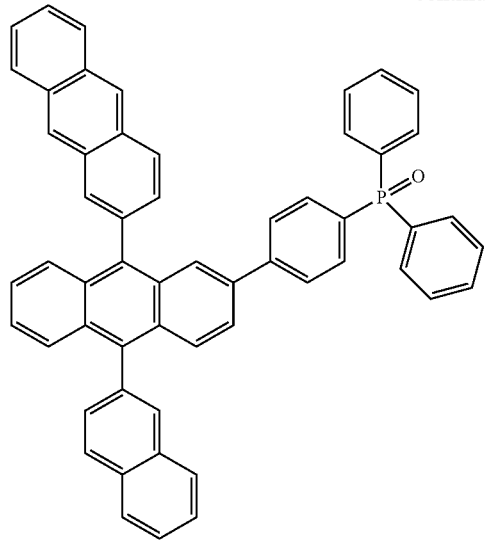
The electron transport region ETR may include at least one of compounds represented below.
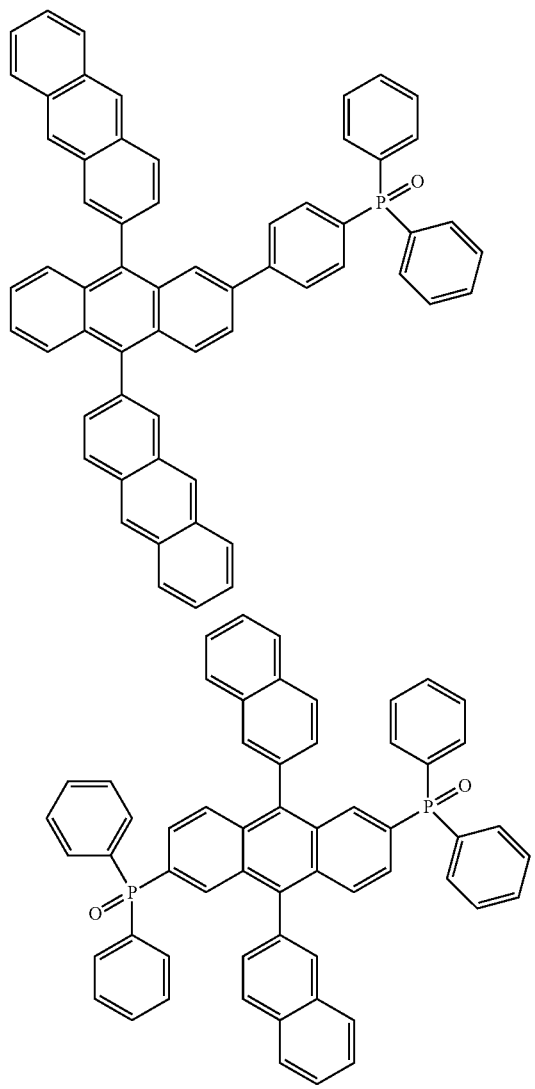
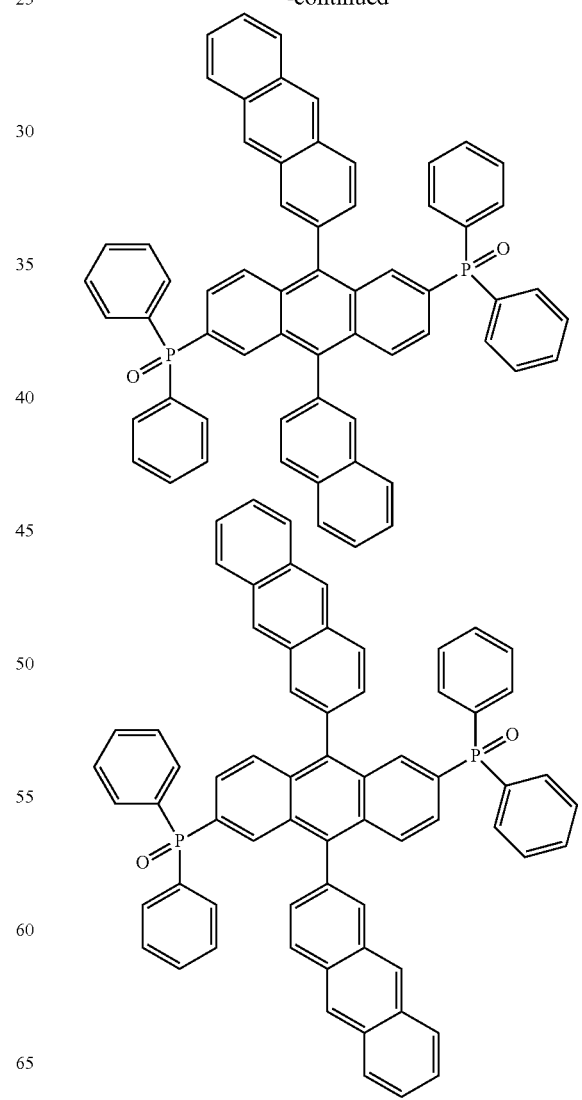

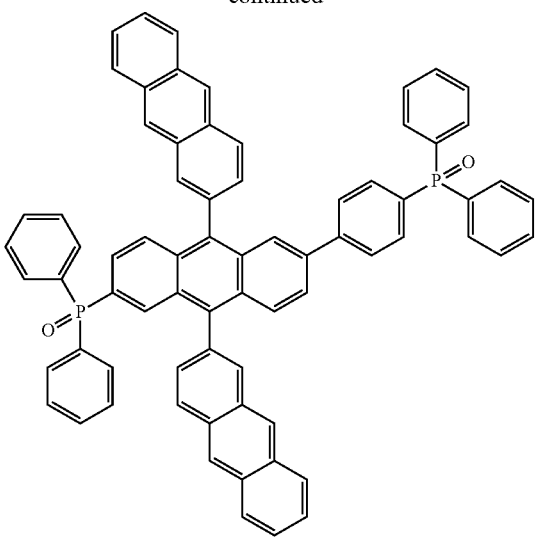
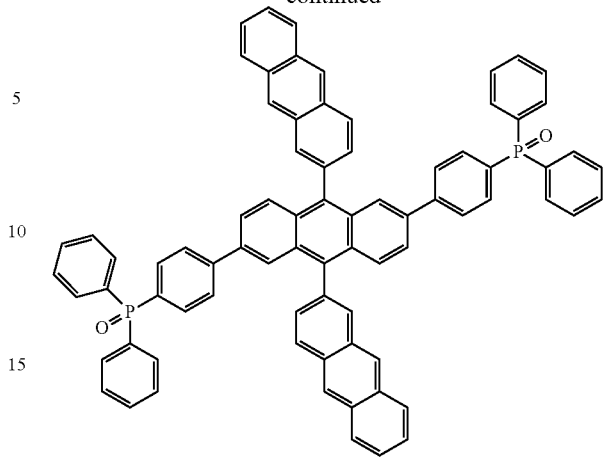
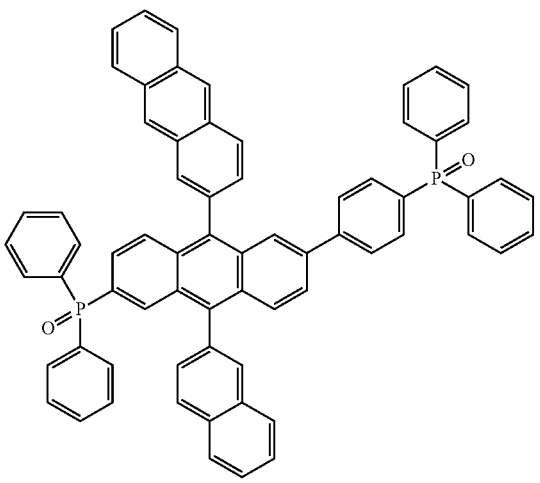
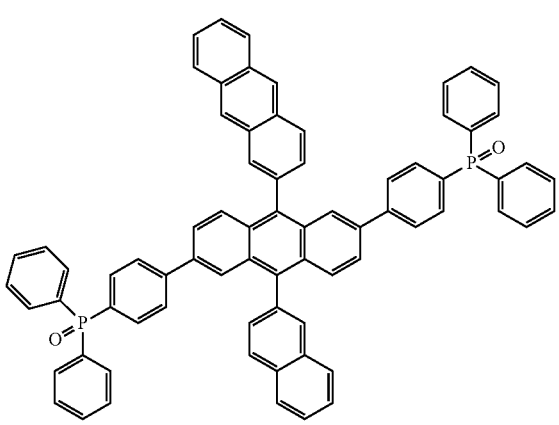

When the electron transport region ETR includes the electron injection layer EIL, the electron transport region ETR may use LiF, LiQ, Li$_2$O, BaO, NaCl, CsF, lanthanide such as Yb, or a metal halide such as RbCl or RbI. The electron injection layer EIL may be also made of a mixture of an electron-transporting material and an insulating organo metal salt. The organo metal salt may have an energy band gap of about 4 eV or more. Specifically, the organo metal salt may include, for example, a metal acetate, a metal benzoate, a metal acetoacetate, a metal acetylacetonate, or a metal stearate. The electron injection layer EIL may have a thickness of about 1 Å to about 100 Å, or, for example, about 3 Å to about 90 Å. When the thickness of the electron injection layer EIL falls within the above range, satisfactory electron injection characteristics may be obtained without a substantial increase in driving voltage.

The second electrode EL2 may be provided on the electron transport region ETR. The second electrode EL2 may be a common electrode or a cathode. The second electrode EL2 may be a transmissive electrode, a transflective electrode, or a reflective electrode.

When the second electrode EL2 is a transmissive electrode, the second electrode EL2 may include Li, Ca, LiF/Ca, LiF/Al, Al, Mg, BaF, Ba, Ag, or compounds or mixtures thereof (e.g., a mixture of Ag and Mg).

The second electrode EL2 may include an auxiliary electrode. The auxiliary electrode may include a film, and a transparent metal oxide on the film. The film may be formed in such a way that the above-described material is deposited to face the light emission layer EML. The transparent metal oxide may be, for example, ITO, IZO, ZnO, ITZO, or an oxide of Mo, or Ti.

When the second electrode EL2 is a transflective electrode or a reflective electrode, the second electrode EL2 may include Ag, Mg, Al, Pt, Pd, Au, Ni, Nd, Ir, Cr, Li, Ca, LiF/Ca, LiF/Al, Mo, Ti, or compounds or mixtures thereof (e.g., a mixture of Ag and Mg). In some implementations, the second electrode EL2 may have a multi-layered structure including a reflective or transflective film made of the above materials and a transparent conductive film made of ITO, IZO, ZnO, or ITZO, or the like.

When the organic light emitting device OEL is a top-emission type, the first electrode EL1 may be a reflective electrode, and the second electrode EL2 may be a transmissive or transflective electrode. When the organic light emitting device OEL is a bottom-emission type, the first electrode EL1 may be a transmissive or transflective electrode, and the second electrode EL2 may be a reflective electrode.

On the second electrode EL2, a sealing layer SL is provided to cover the second electrode EL2. The sealing layer SL may include at least one of an organic layer or an inorganic layer. The sealing layer SL may protect the organic light emitting device OEL.

In organic light emitting devices, migration rates of electrons may be less than migration rates of holes. Band gaps may be generated between the energy band of a hole transport region and the energy band of a light emission layer and between the energy band of the light emission layer and the energy band of an electron transport region. The proportion of recombination of electrons and holes in the light emission layer may be reduced. Accordingly, the injection of holes and electrons into the light emission layer, and luminous efficiency may be degraded.

A display device according to an embodiment includes a buffer layer and an electron transport region including the compound expressed by Chemical Formula 1 above. Accordingly, the band gap between the energy band of the hole transport region and the energy band of the light emission layer may be reduced, and hole injection into the light emission layer may be facilitated. The band gap between the energy band of the light emission layer and the energy band of the electron transport region may be reduced, and electron injection to the light emission layer may be facilitated. Therefore, the display device according to an embodiment may have high efficiency and long lifetime.

The following Example is provided in order to highlight characteristics of one or more embodiments, but it will be understood that the Example is not to be construed as limiting the scope of the embodiments. Further, it will be understood that the embodiments are not limited to the particular details described in the Example.

EXAMPLE

Example 1

An anode was formed using indium tin oxide (ITO) on a glass substrate. Ultrasonic cleaning and pretreatments (UV—O3 treatment, heat treatment) were performed, and then 4,4',4"-tris{N,-(2-naphthyl)-N-phenylamino}-triphenylamine (2TNATA) was vacuum-deposited on the anode to provide a hole injection layer. N,N'-di(1-naphthyl)-N,N'-diphenylbenzidine (NPB) was vacuum-deposited on the hole injection layer to provide a hole transport layer. C1, a compound represented below as a host material and C2, a compound represented below as a dopant, were simultaneously deposited at a weight ratio of 95:5 to provide a light emission layer. 4,4-N,N'-dicarbazole-biphenyl (CBP) was deposited on the light emission layer to provide a buffer layer having a thickness of 50 Å. A compound represented by Chemical Formula 8 below was deposited on the buffer layer to provide an electron transport layer having a thickness of 360 Å. LiF was deposited on the electron transport layer to provide an electron injection layer having a thickness of 10 Å. Lithium fluoride was deposited to a thickness of 0.5 nm on the electron injection layer, and aluminum was deposited on the lithium fluoride to provide a cathode.

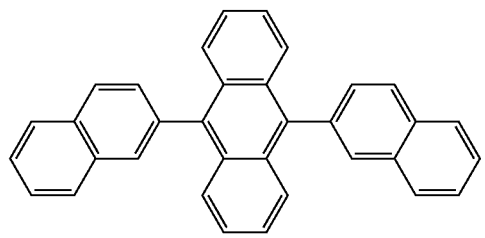

C1

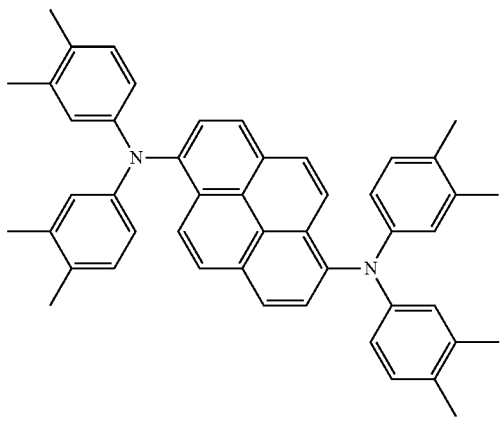

C2

[Chemical Formula 8]

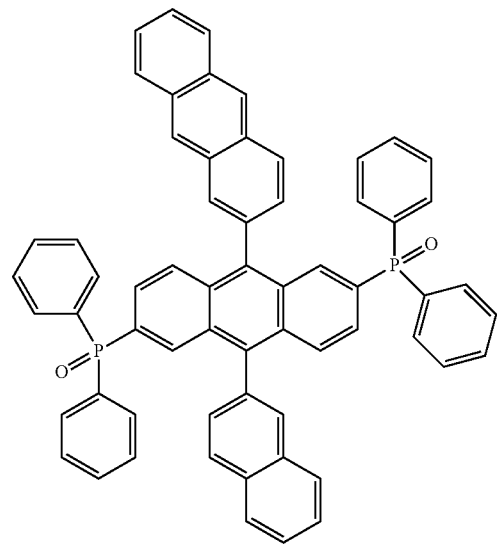

Experimental Results

Driving voltage, current efficiency, and lifetime of the organic light emitting device in Example 1 were measured and shown in Table 1 below. To evaluate the current efficiency and the lifetime, current efficiency of the organic light emitting device was measured during operation at a current density of 10 mA/cm$^2$, and time until luminance was lowered to 80% of initial luminance at a current density of 10 mA/cm$^2$ was measured.

TABLE 1

| | Efficiency (cd/A) | Lifetime (hr) |
|---|---|---|
| Example 1 | 4.1 | 130 |

Referring to Table 1 above, it can be seen that the organic light emitting device in Example 1 had high efficiency and long lifetime.

By way of summation and review, an organic light emitting device according to an embodiment may have an enhanced efficiency and prolonged lifetime. A display device according to an embodiment may have enhanced efficiency and prolonged lifetime.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An organic light emitting device, comprising:
   a first electrode;
   a hole transport region on the first electrode;
   a light emission layer on the hole transport region;
   a buffer layer on the light emission layer;
   an electron transport region on the buffer layer; and
   a second electrode on the electron transport region,
   wherein:
   the buffer layer includes at least one selected from the group of a carbazole derivative, a phenanthroline derivative, a triazole derivative, and a quinolinolato-based metal complex, and
   the electron transport region includes a compound represented by Chemical Formula 1 below:

[Chemical Formula 1]

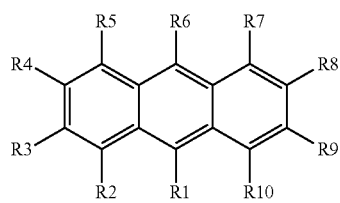

where, R1 is an anthracenyl group, a naphthyl group or a biphenyl group; at least one of R2 to R10 is a group represented by Chemical Formula 2 below; and a remainder of R2 to R10 are hydrogen, deuterium, a halogen group, a nitrile group, a nitro group, a hydroxyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, or a substituted or unsubstituted heterocyclic group having at least one of N, O, or S atom,

[Chemical Formula 2]

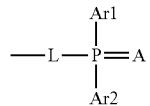

where, in Chemical Formula 2, L is a direct bond, a substituted or unsubstituted arylene group, or a substituted or unsubstituted heteroarylene group having at least one of N, O, or S atom; Ar1 and Ar2 are independently a substituted or unsubstituted aryl group or a substituted or unsubstituted heterocyclic group having at least one of N, O, or S atom; and A is O, S, or Se.

2. The organic light emitting device as claimed in claim 1, wherein the buffer layer includes at least one selected from the group of tris(8-hydroxyquinolino)aluminum (Alq3), 4,4'-bis(N-carbazolyl)-1,1'-biphenyl (CBP), N,N'-dicarbazolyl-3,5-benzene (mCP), poly(n-vinylcarbazole) (PVK), 4,4',4"-tris(carbazol-9-yl)-triphenylamine (TCTA), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 4,4'-bis(9-carbazolyl)-2,2'-dimethyl-biphenyl (CDBP), 4,4',4"-tris(N-carbazolyl)triphenylamine (TCTA), 2,9-dimethyl-4,7-diphenyl-1,10-phenanthroline (BCP), 4,7-diphenyl-1,10-phenanthroline (Bphen), and 3-phenyl-4-(1'-naphthyl)-5-phenylcarbazole.

3. The organic light emitting device as claimed in claim 1, wherein the electron transport region includes at least one of the following compounds:

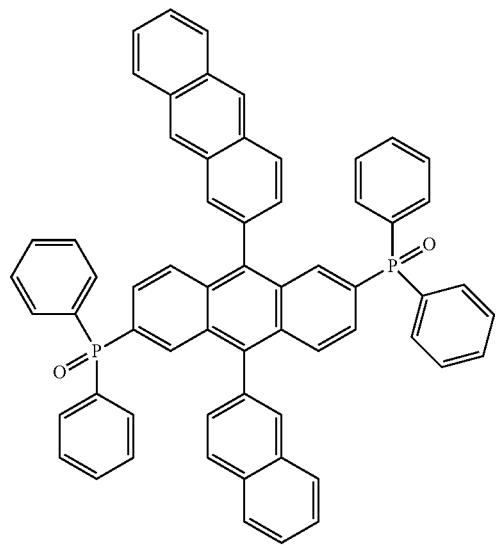

81
-continued
82
-continued
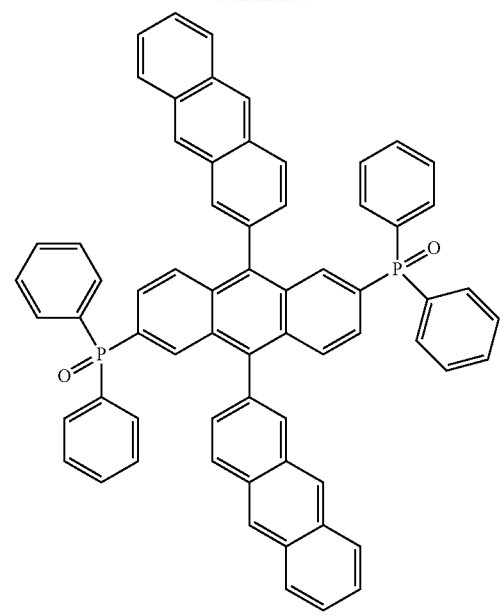
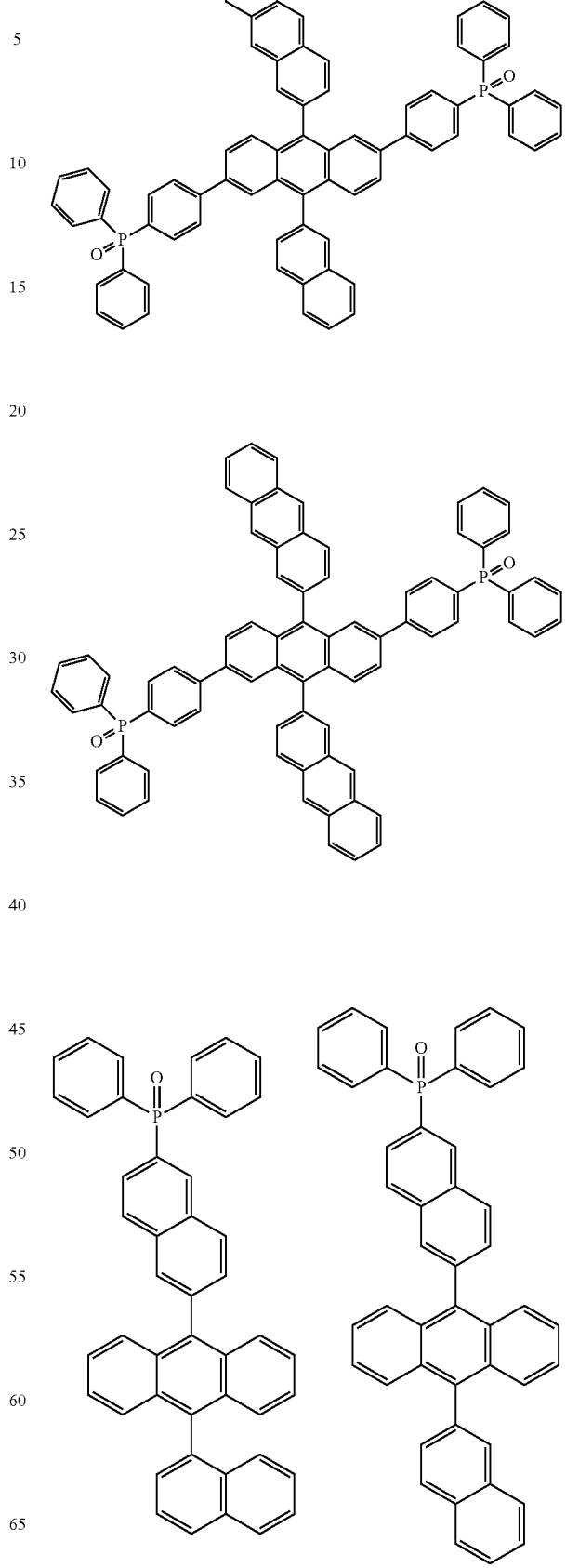

-continued
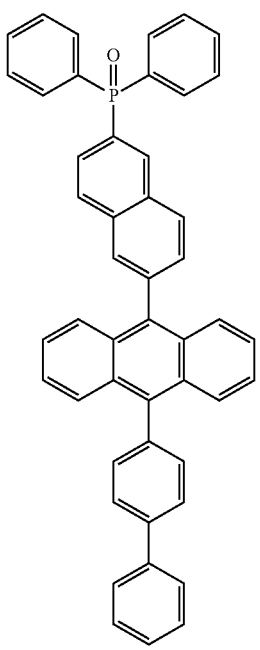
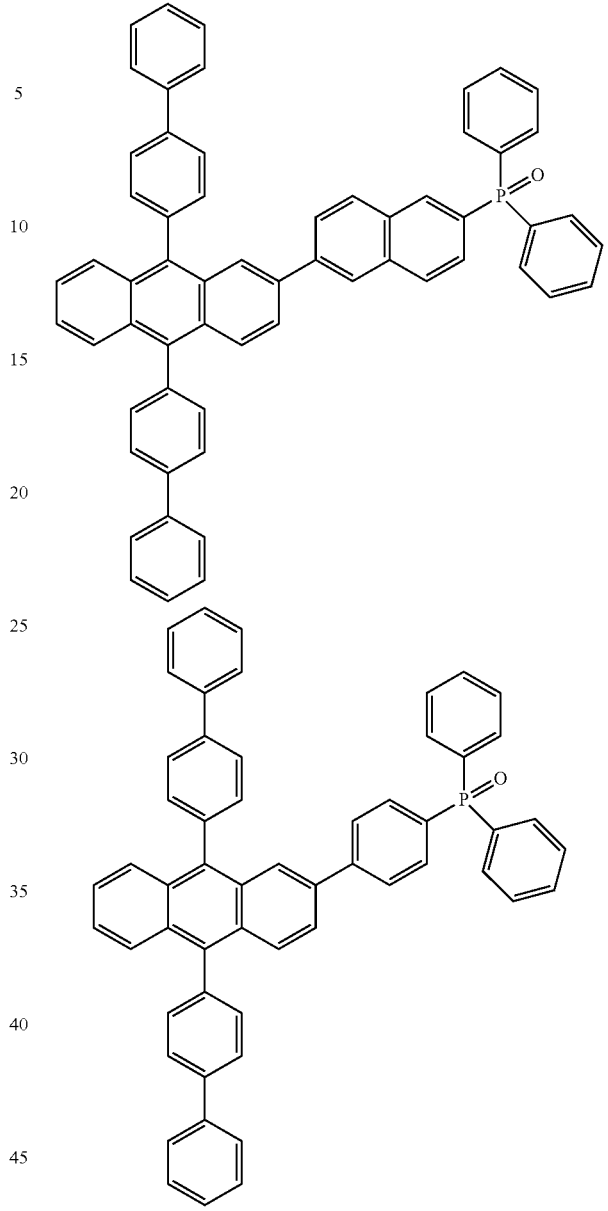
4. The organic light emitting device as claimed in claim 1, wherein the electron transport region includes at least one of the following compounds:
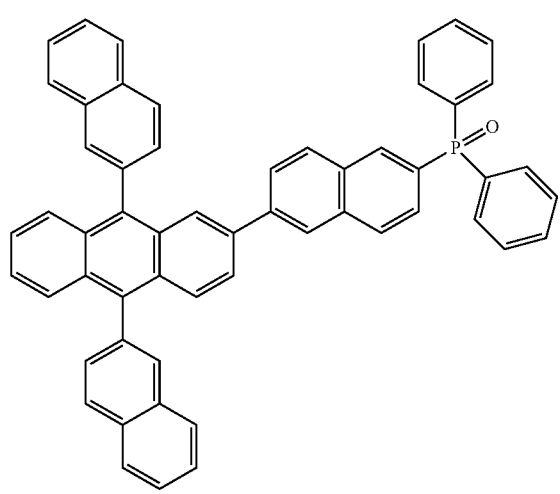
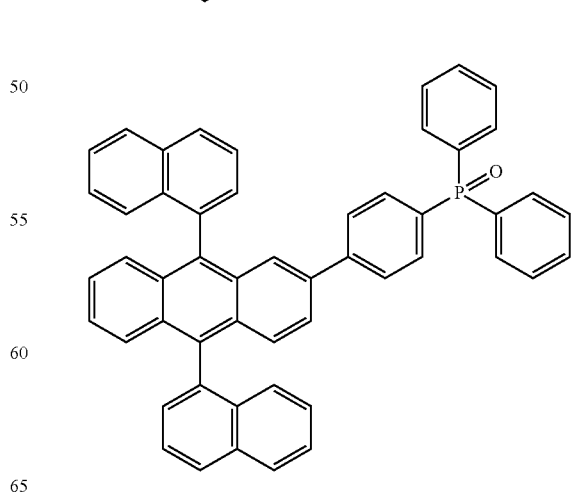

85
-continued
86
-continued
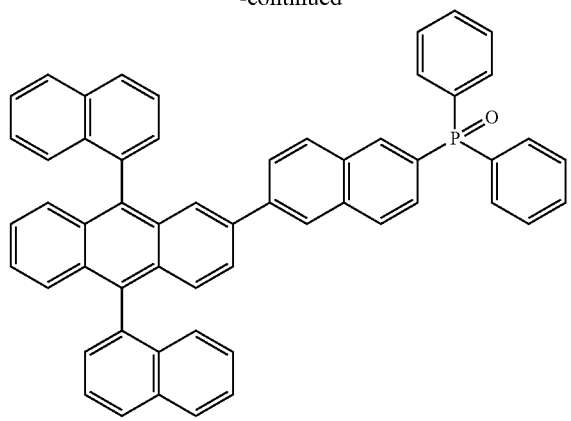
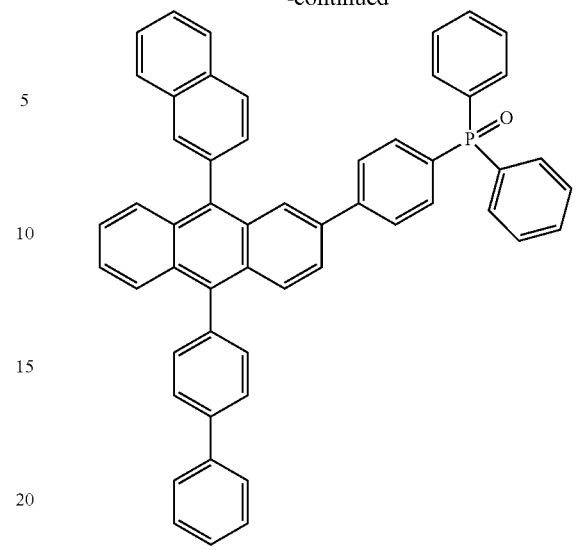
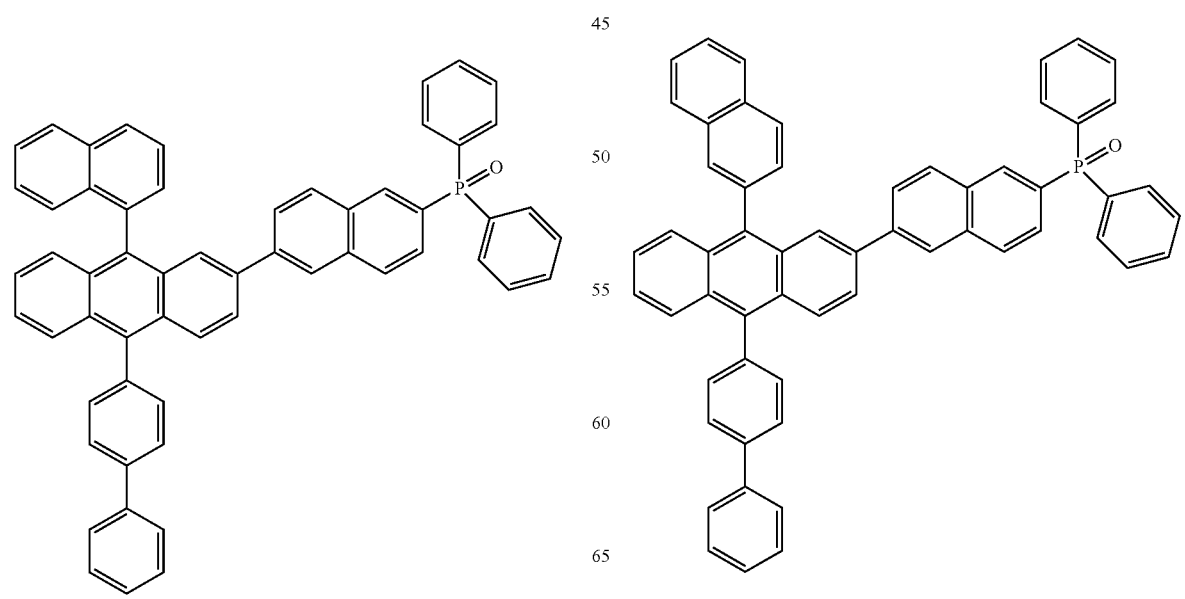

5. The organic light emitting device as claimed in claim 1, wherein the electron transport region includes at least one of the following compounds:
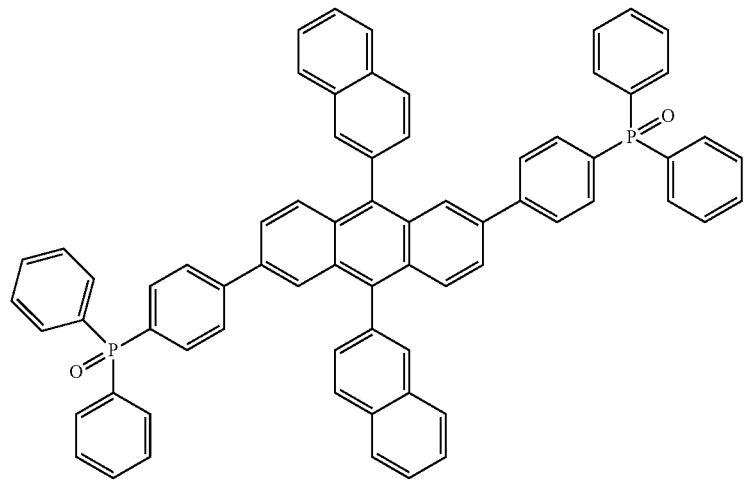
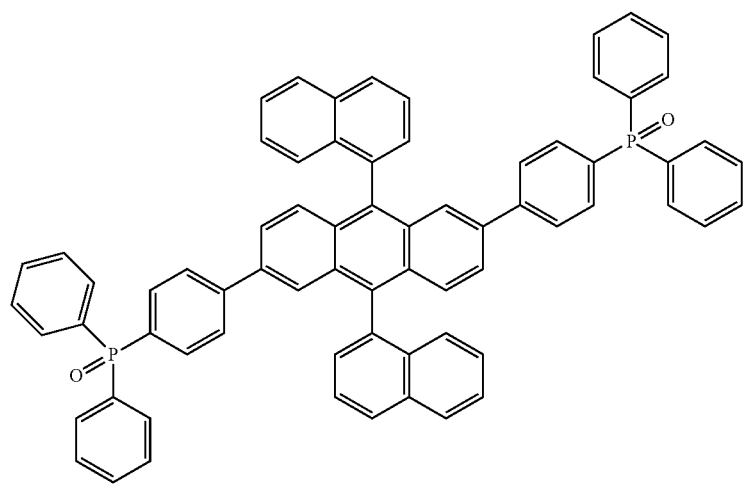
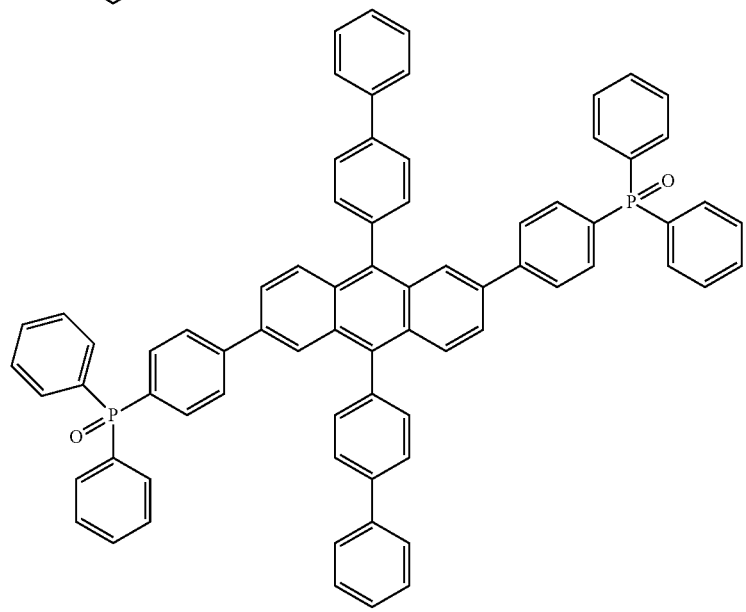

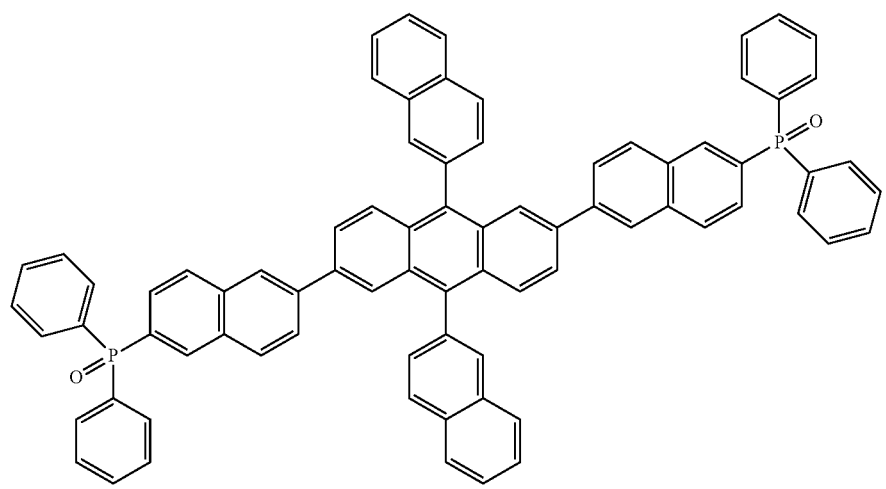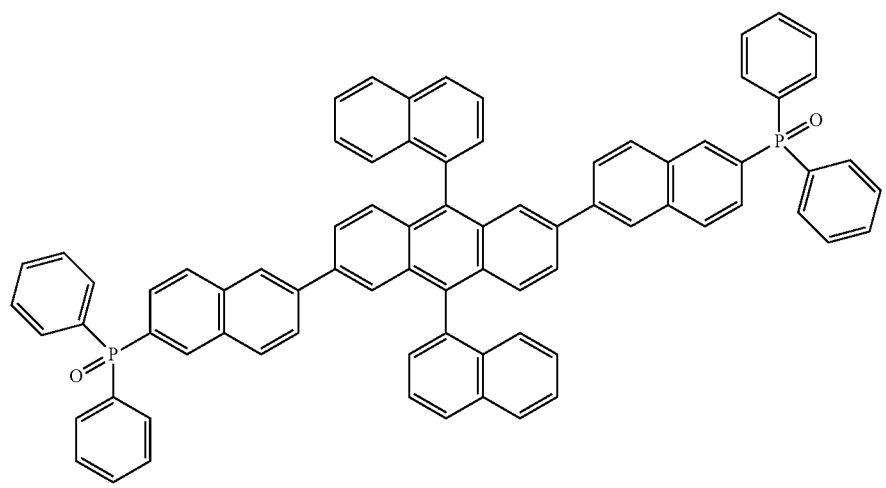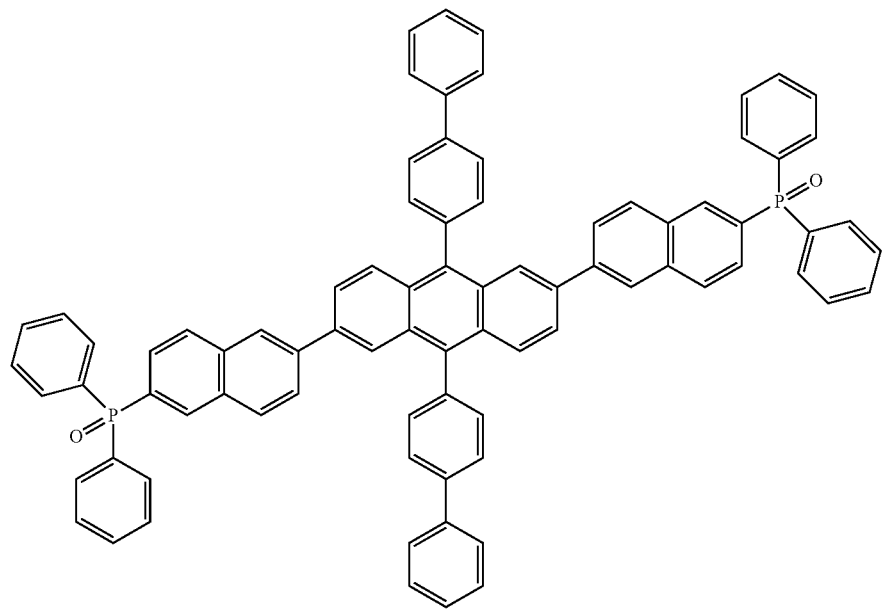

-continued
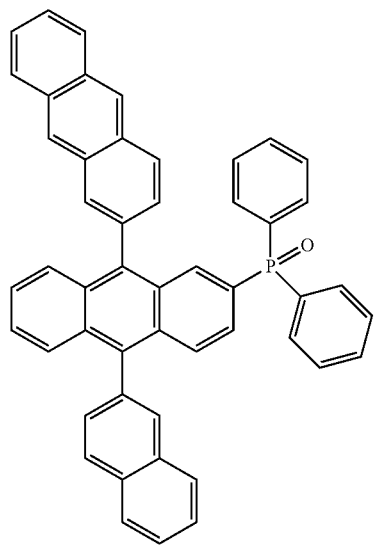 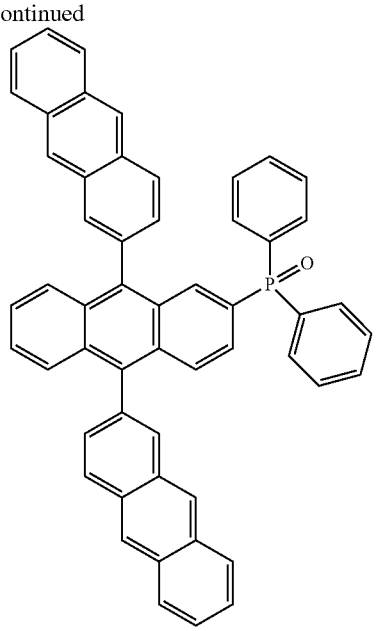
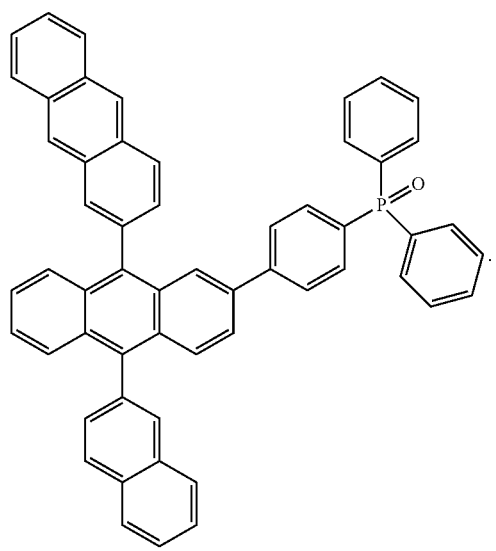

6. The organic light emitting device as claimed in claim 1, wherein the electron transport region includes at least one of following compounds:
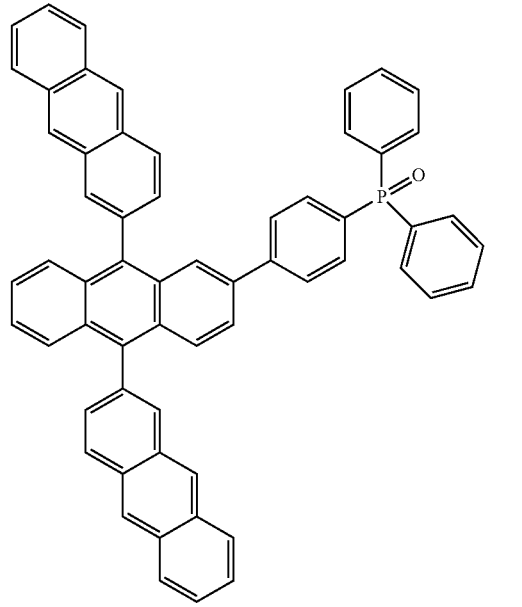
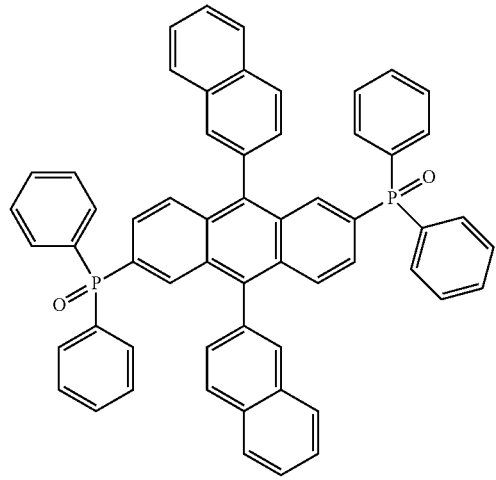
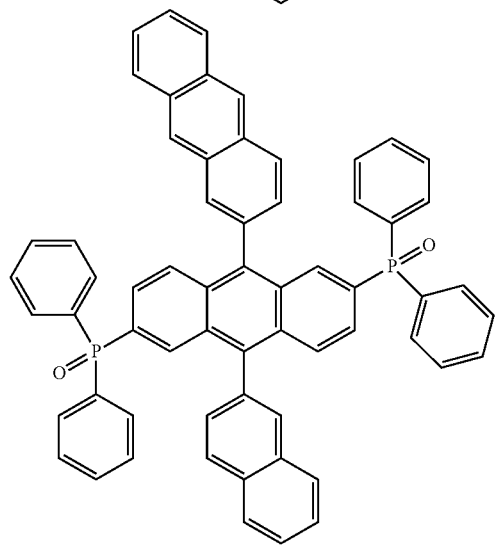
-continued
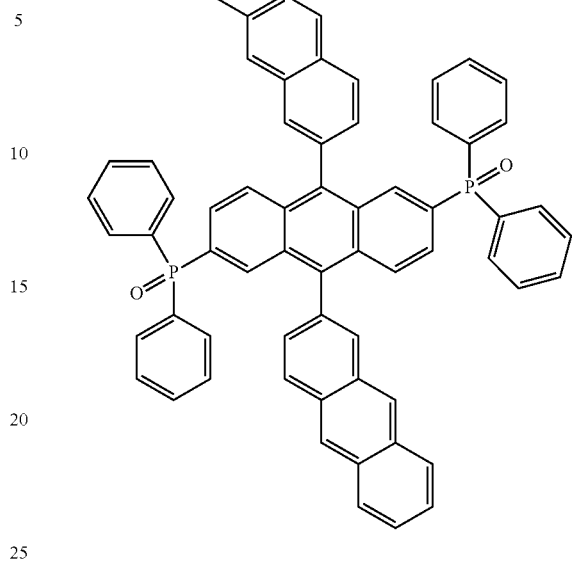
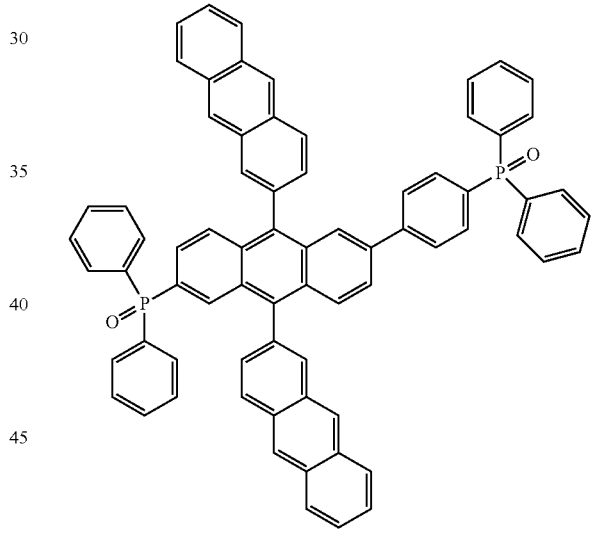
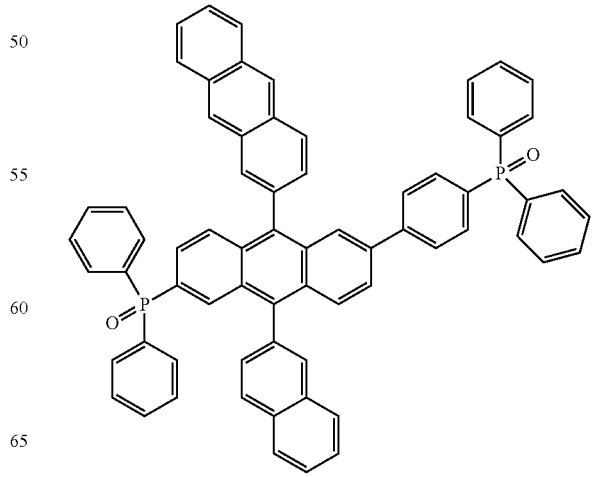

-continued

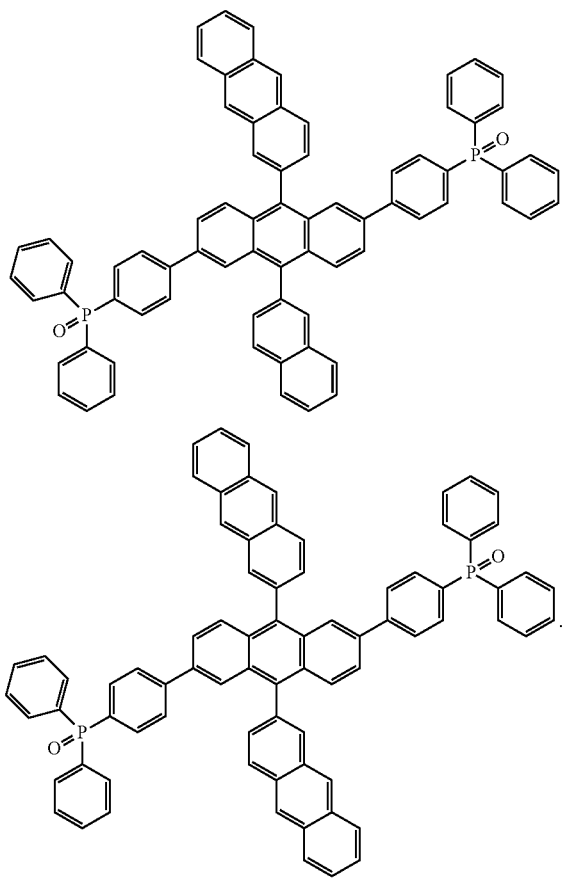 [SMILES: O=P(c1ccccc1)(c1ccccc1)c1ccc(-c2ccc3c(-c4ccc5cc6ccccc6cc5c4)c4cc(-c5ccc(P(=O)(c6ccccc6)c6ccccc6)cc5)ccc4c(-c4ccc5ccccc5c4)c3c2)cc1 ; O=P(c1ccccc1)(c1ccccc1)c1ccc(-c2ccc3c(-c4ccc5cc6ccccc6cc5c4)c4cc(-c5ccc(P(=O)(c6ccccc6)c6ccccc6)cc5)ccc4c(-c4ccc5cc6ccccc6cc5c4)c3c2)cc1]

7. The organic light emitting device as claimed in claim 1, wherein the electron transport region includes:
   an electron transport layer on the buffer layer; and
   an electron injection layer on the electron transport layer,
   wherein the electron transport layer includes a compound represented by Chemical Formula 1.

8. The organic light emitting device as claimed in claim 1, wherein the hole transport region includes:
   a hole injection layer on the first electrode; and
   a hole transport layer on the hole injection layer.

9. A display device, comprising a plurality of pixels, wherein:
   at least one of the pixels includes:
   a first electrode;
   a hole transport region on the first electrode;
   a light emission layer on the hole transport region;
   a buffer layer on the light emission layer;
   an electron transport region on the buffer layer; and
   a second electrode on the electron transport region,
   the buffer layer includes at least one selected from the group of a carbazole derivative, a phenanthroline derivative, triazole derivative, and a quinolinolato-based metal complex and
   the electron transport region includes a compound represented by Chemical Formula 1 below:

[Chemical Formula 1]

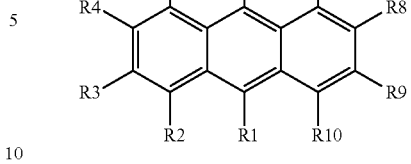

where, R1 is an anthracenyl group, a naphthyl group or a biphenyl group; at least one of R2 to R10 is a group represented by Chemical Formula 2 below; and a remainder of R2 to R10 are hydrogen, deuterium, a halogen group, a nitrile group, a nitro group, a hydroxyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, or a substituted or unsubstituted heterocyclic group having at least one of N, O, or S atom,

[Chemical Formula 2]

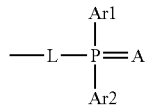

where, in Chemical Formula 2, L is a direct bond, a substituted or unsubstituted arylene group, or a substituted or unsubstituted heteroarylene group having at least one of N, O, or S atom; Ar1 and Ar2 are independently a substituted or unsubstituted aryl group or a substituted or unsubstituted heterocyclic group having at least one of N, O, or S atom; and A is O, S, or Se.

10. The display device as claimed in claim 9, wherein the buffer layer includes at least one selected from the group of tris(8-hydroxyquinolino)aluminum (Alq3), 4,4'-bis(N-carbazolyl)-1,1'-biphenyl (CBP), N,N'-dicarbazolyl-3,5-benzene (mCP), poly(n-vinylcarbazole) (PVK), 4,4',4"-tris(carbazol-9-yl)-triphenylamine (TCTA), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 4,4'-bis(9-carbazolyl)-2,2'-dimethyl-biphenyl (CDBP), 4,4',4"-tris(N-carbazolyl)triphenylamine (TCTA), 2,9-dimethyl-4,7-diphenyl-1,10-phenanthroline (BCP), 4,7-diphenyl-1,10-phenanthroline (Bphen), and 3-phenyl-4-(1'-naphthyl)-5-phenylcarbazole.

11. The display device as claimed in claim 9, wherein the electron transport region includes at least one of the following compounds:

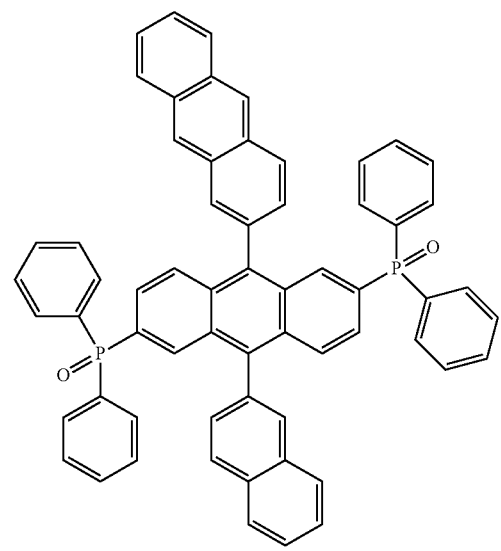
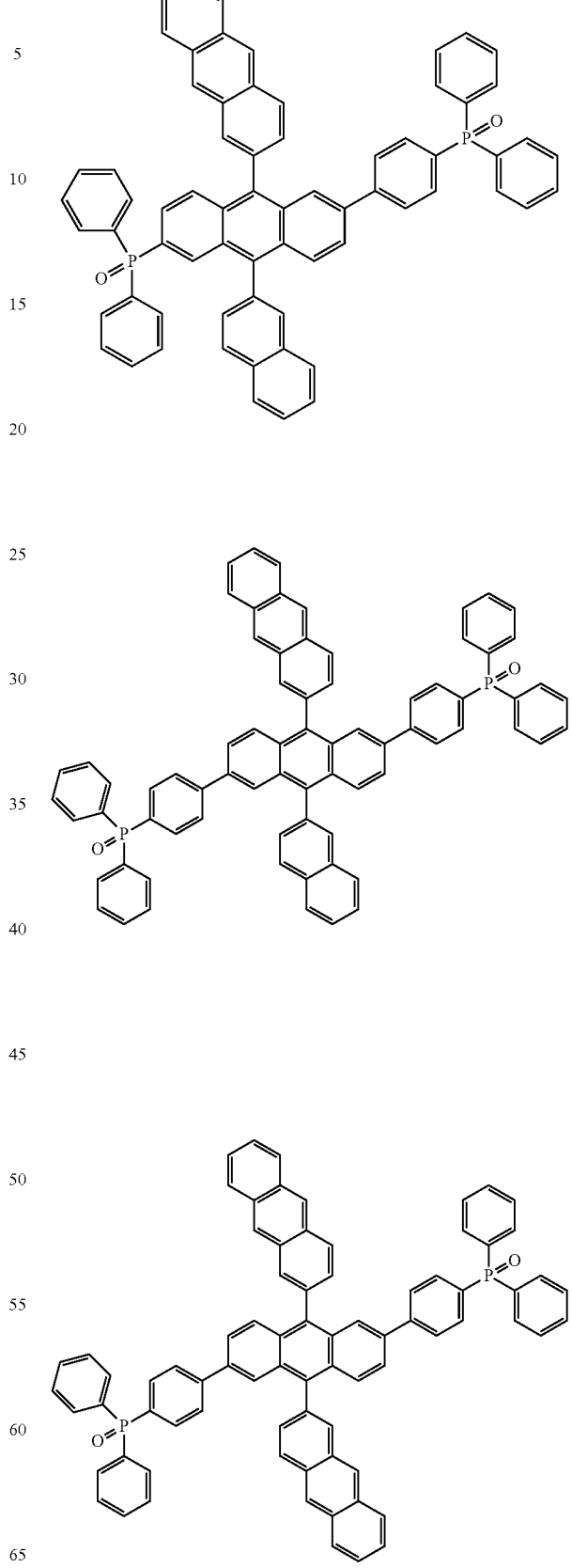

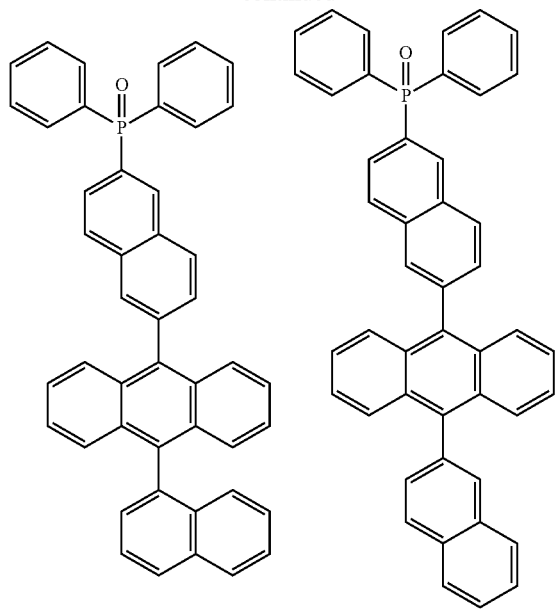
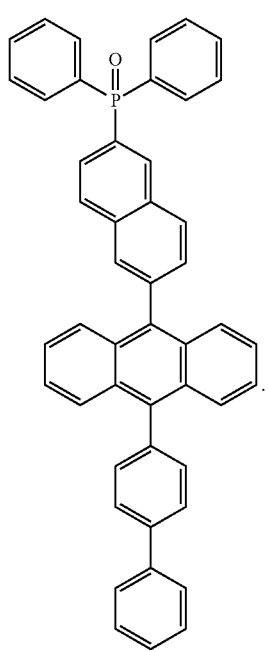
12. The display device as claimed in claim 9, wherein the electron transport region includes at least one of the following compounds:
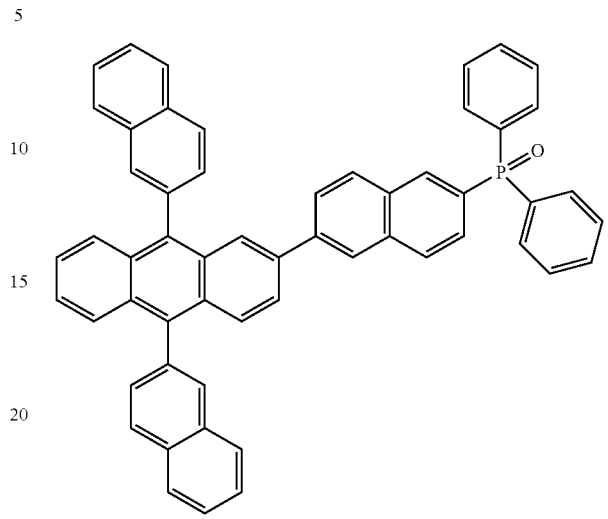
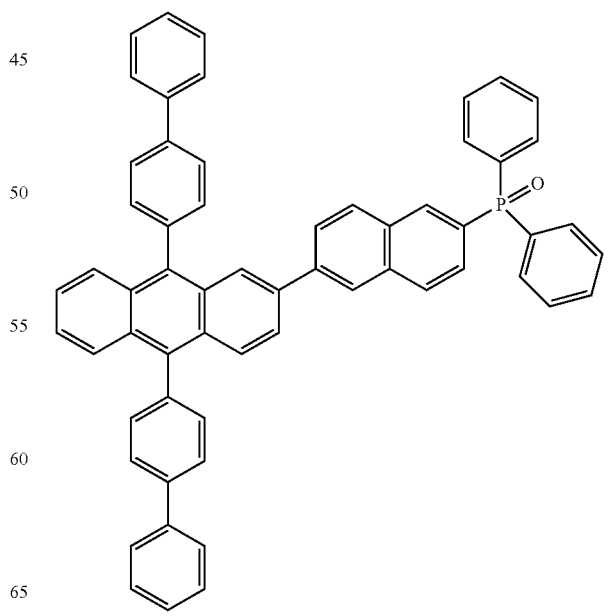

101
-continued
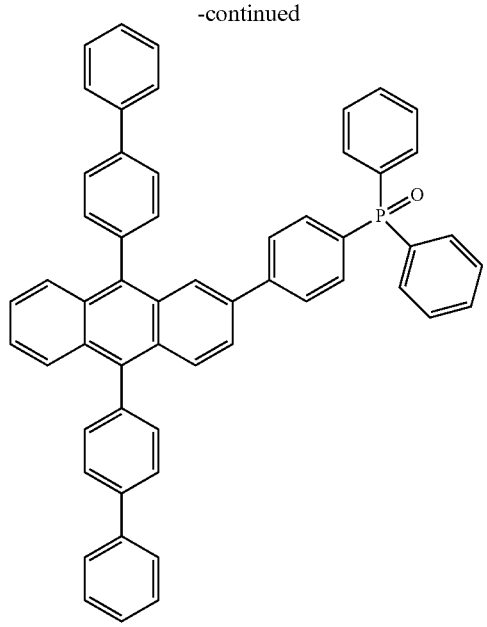
102
-continued
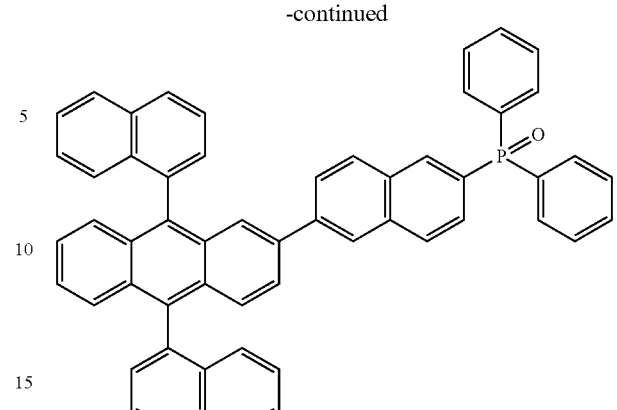
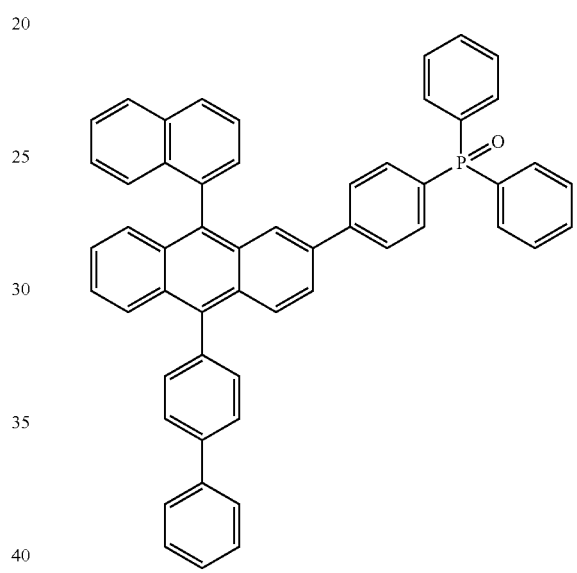
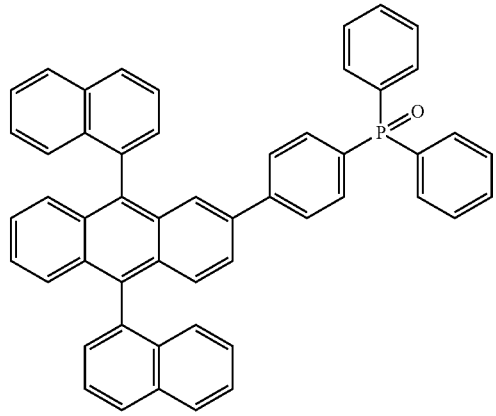
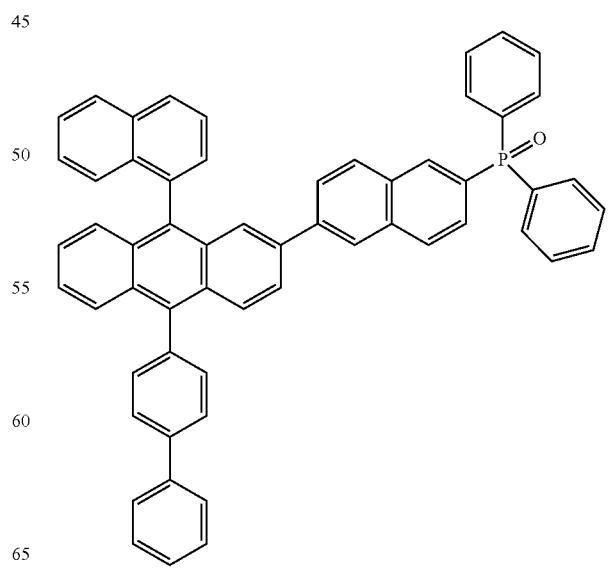

103
-continued
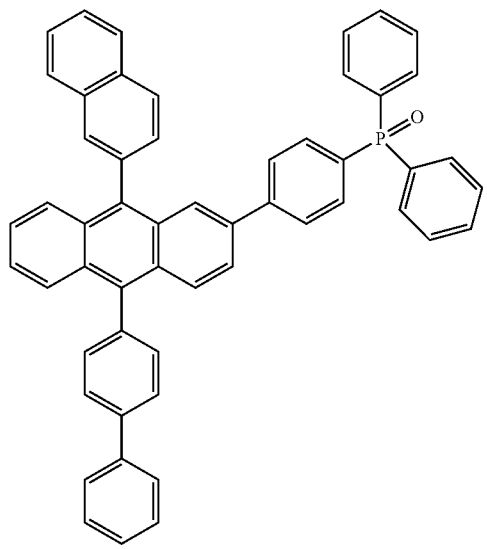
104
-continued
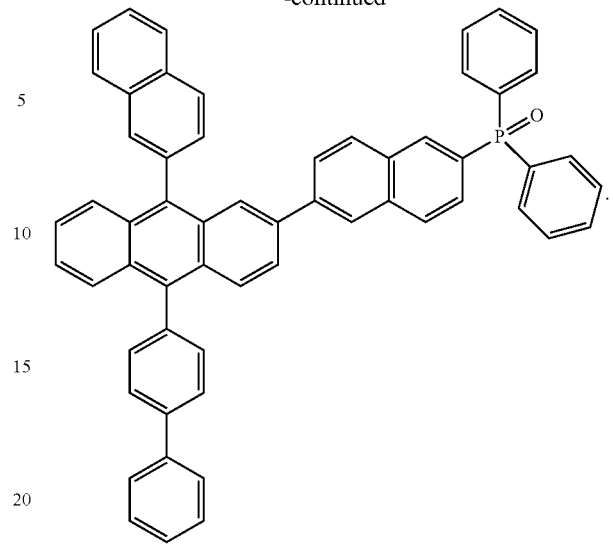
13. The display device as claimed in claim 9, wherein the electron transport region includes at least one of the following compounds:
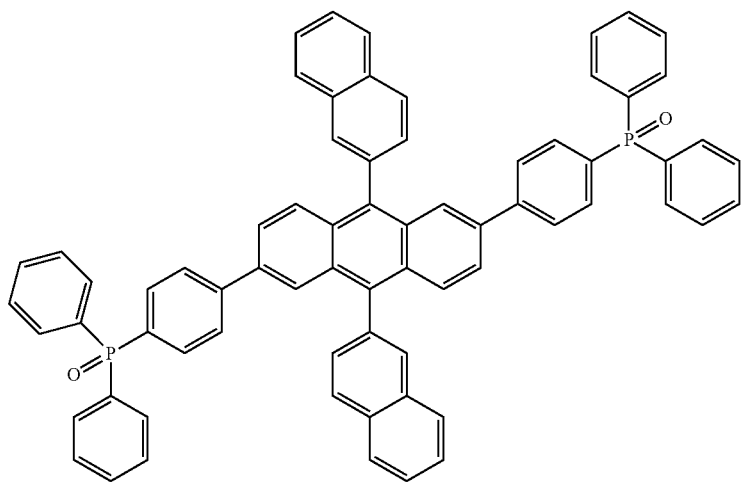
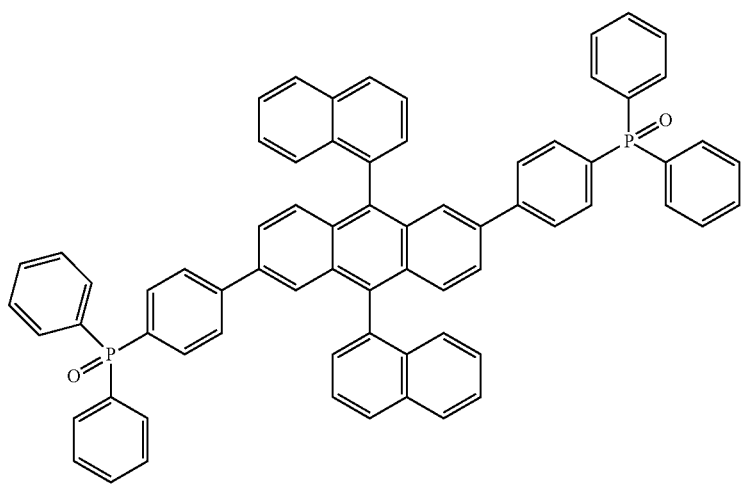

-continued
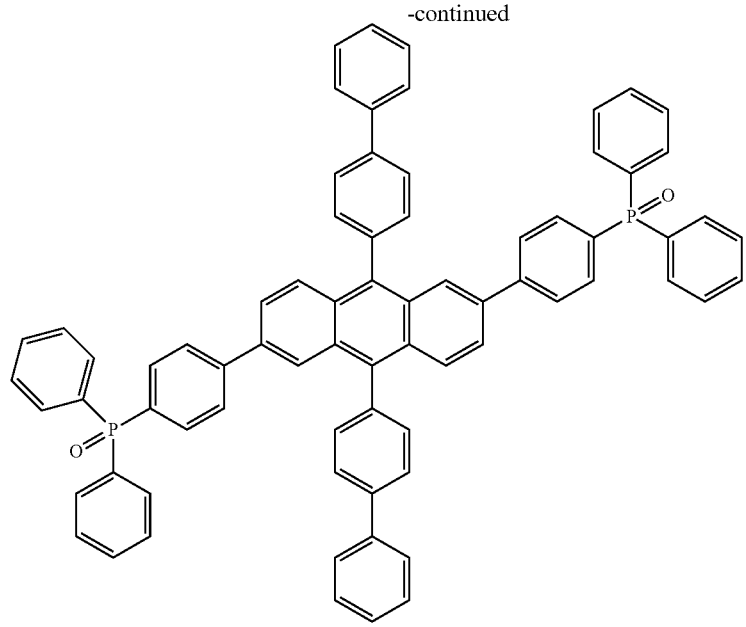
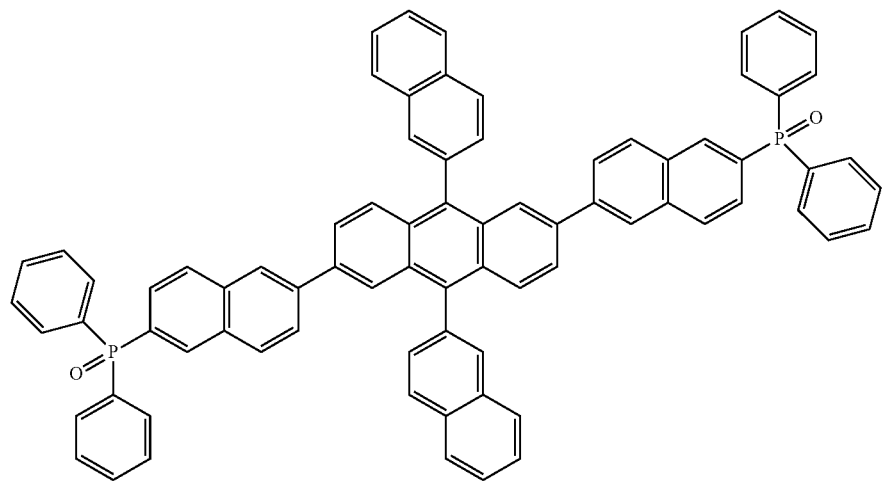
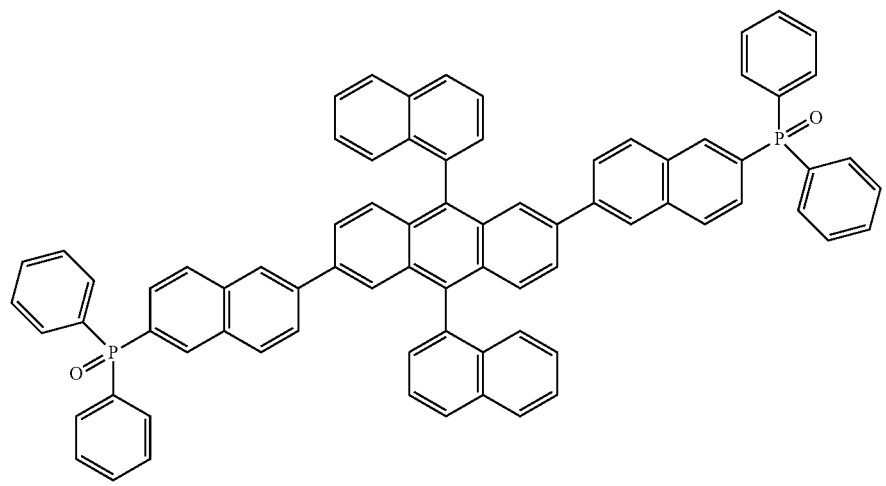

-continued
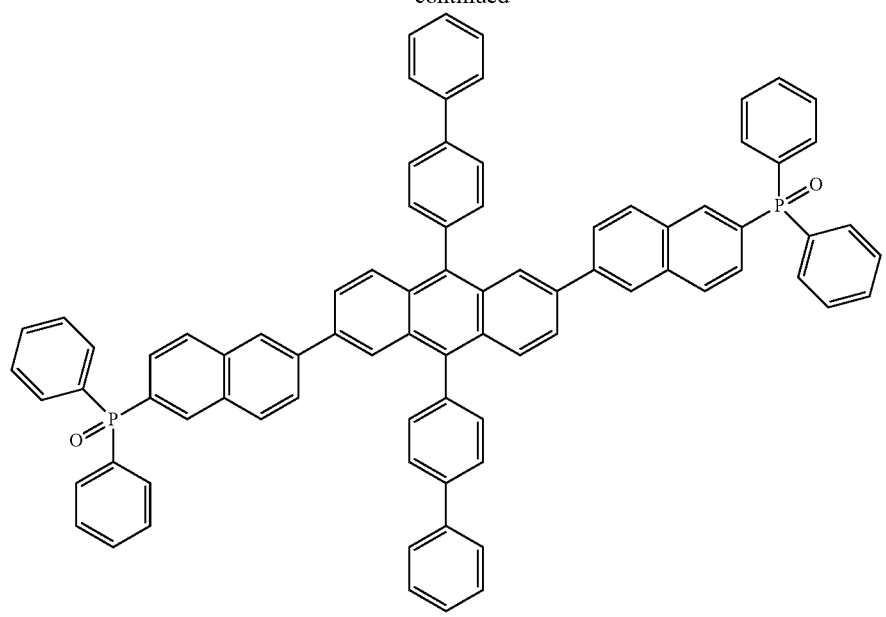
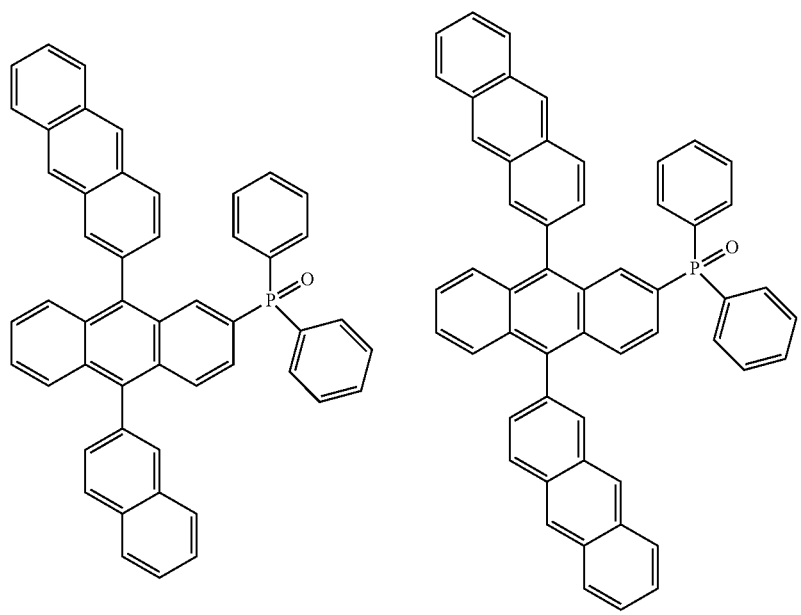

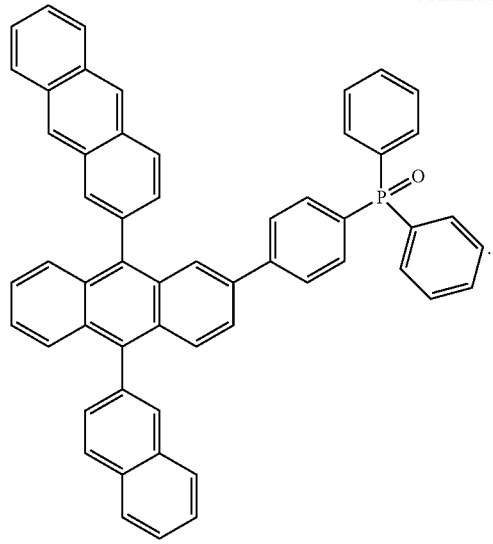
14. The display device as claimed in claim 9, wherein the electron transport region includes at least one of the following compounds:
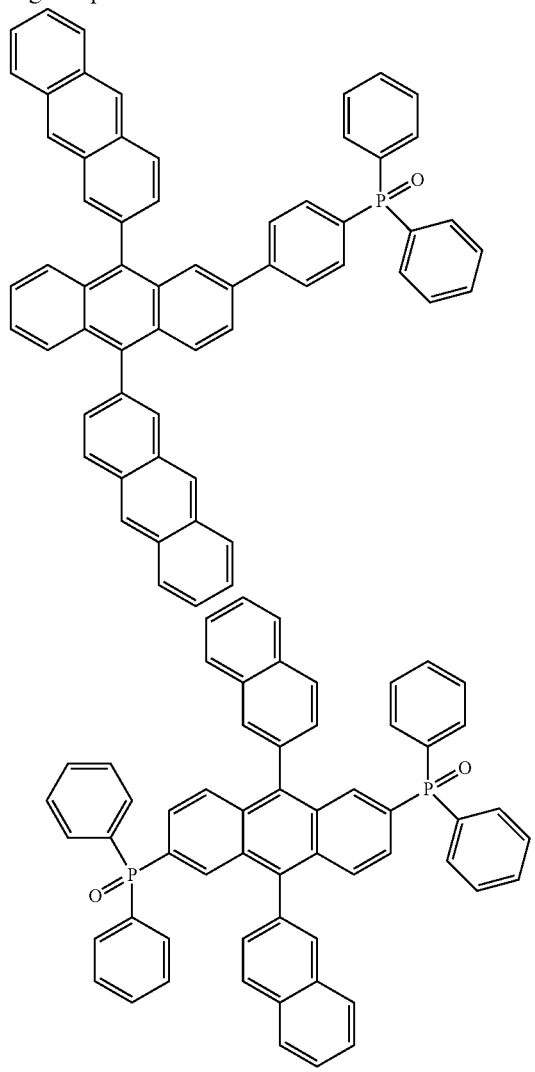
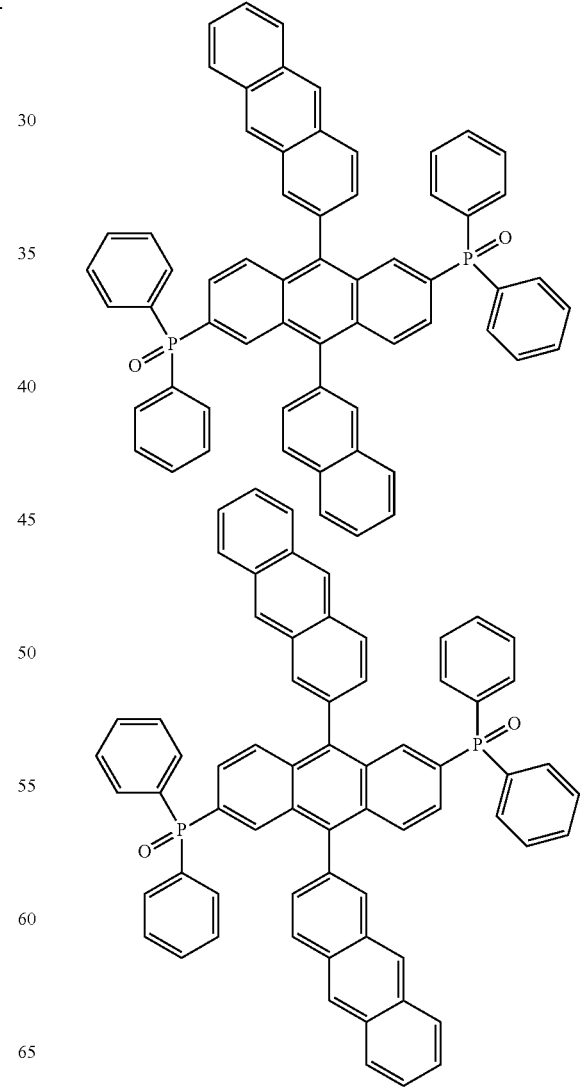

111
-continued

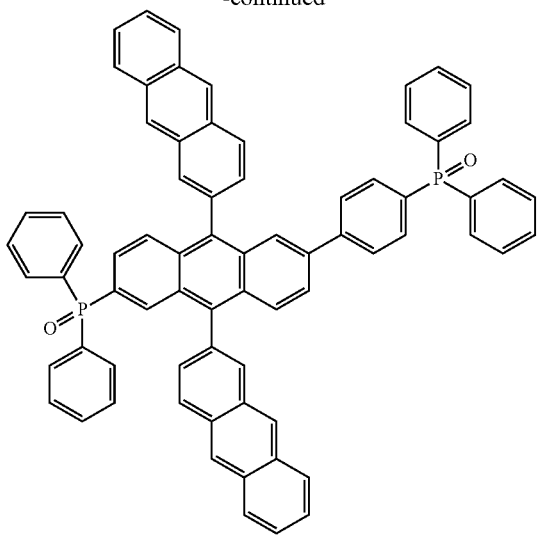

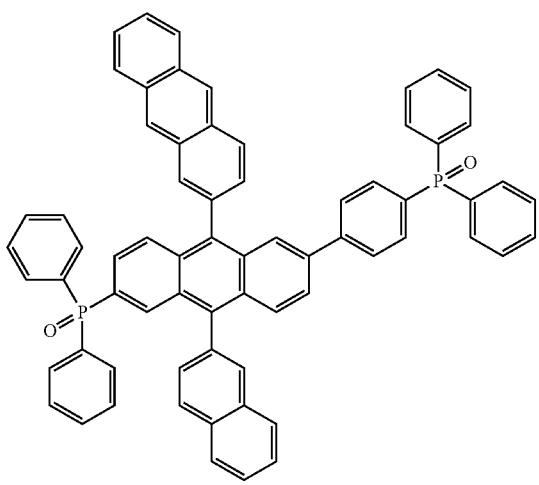

112
-continued

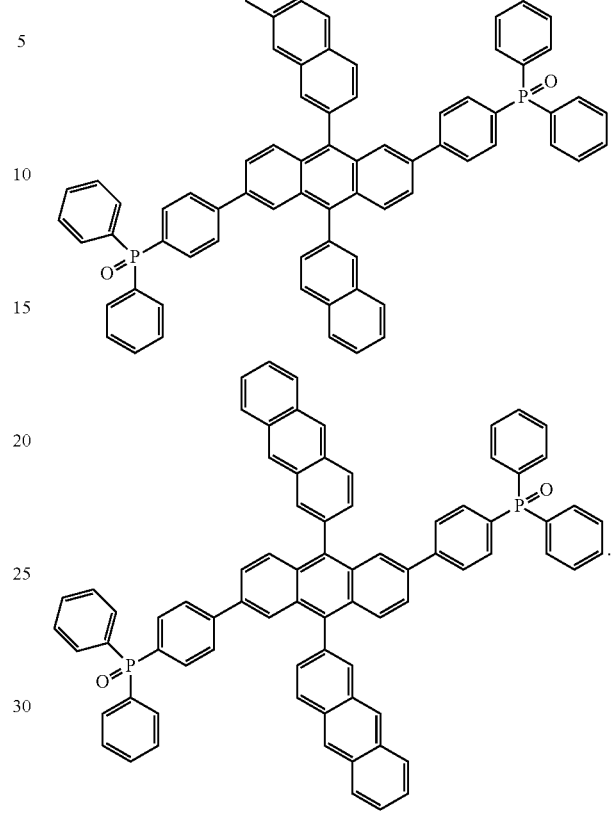

15. The display device as claimed in claim 9, wherein:
the electron transport region includes:
    an electron transport layer on the buffer layer; and
    an electron injection layer on the electron transport layer, and
the electron transport layer includes a compound represented by Chemical Formula 1.

16. The display device as claimed in claim 9, wherein the hole transport region includes:
    a hole injection layer on the first electrode; and
    a hole transport layer on the hole injection layer.

* * * * *